United States Patent
Crayford et al.

(10) Patent No.: US 11,424,953 B2
(45) Date of Patent: Aug. 23, 2022

(54) MODULAR PHYSICAL LAYER AND INTEGRATED CONNECTOR MODULE FOR LOCAL AREA NETWORKS

(71) Applicant: KinnexA, Inc., Taipei (TW)

(72) Inventors: Ian Crayford, Saratoga, CA (US);
Kuan-Hsiung Wei, Taipei (TW);
Shin-Hao Chien, New Taipei (TW)

(73) Assignee: KinnexA, Inc.

( * ) Notice: Subject to any disclaimer, the term of this patent is extended or adjusted under 35 U.S.C. 154(b) by 229 days.

(21) Appl. No.: 16/696,850

(22) Filed: Nov. 26, 2019

(65) Prior Publication Data
US 2020/0204399 A1 Jun. 25, 2020

Related U.S. Application Data
(60) Provisional application No. 62/772,599, filed on Nov. 28, 2018.

(51) Int. Cl.
*G06F 1/26* (2006.01)
*H04L 12/40* (2006.01)
(Continued)

(52) U.S. Cl.
CPC .......... *H04L 12/40045* (2013.01); *G05F 1/08* (2013.01); *H01L 23/467* (2013.01);
(Continued)

(58) Field of Classification Search
CPC . H04L 12/40045; H04L 49/351; H04L 12/10; G05F 1/08; H01R 24/64;
(Continued)

(56) References Cited

U.S. PATENT DOCUMENTS 5,321,372 A * 6/1994 Smith ...................... H03H 7/38
174/34
5,541,878 A * 7/1996 LeMoncheck .......... G05F 1/468
365/177
(Continued)

FOREIGN PATENT DOCUMENTS

TW M399520 3/2011

OTHER PUBLICATIONS

IEEE Std 802.3bz-2016.
(Continued)

*Primary Examiner* — Volvick Derose
(74) *Attorney, Agent, or Firm* — Radlo & Su; Peter Su

(57) ABSTRACT

An Ethernet network is composed of one or more network infrastructure devices, such as a hubs, repeaters, switches or routers, which provides data interconnection and may provide operational power, or some part thereof, to remote network data terminal equipment such as a wireless access point, IP telephone, IP camera or network end station. Most Ethernet networks operate over a combination of the pairs in an unshielded twisted pair (UTP) or shielded twisted pair (STP) cable, or in some cases may operate over fiber optic cables. The individual links of Ethernet network, between the network infrastructure device and the Data Terminal Equipment (DTE) may be able to operate at one or more data rates such as 10 Mb/s, 100 Mb/s, 1 Gb/s, 2.5 Gb/s, 5 Gb/s and 10 Gb/s, or any combination thereof. The invention discloses an Ethernet Physical Layer (PHY) circuit, in combination with an Integrated Connector Module (ICM), which may reside inside the network equipment at either end of the Ethernet link. The combined PHY-ICM physical layer network device provides the appropriate encoding/decoding and signaling to operate over the specific network cable medium at the required data rate(s). The electrical and mechanical design of the combined PHY-ICM enables a (Continued)

modular approach such that during final assembly, the PHY-ICM can be optimized for operation over the appropriate data rate(s), whether it supports the provision of operational power between the network equipment, and if so at what power level, as well as other functionality. Furthermore, the PHY-ICM is designed to maintain a common electrical and mechanical footprint regardless of which of the features are included or excluded, to optimize the system cost for a specific maximum data rate, as well as minimize any re-engineering necessary on the part of the network equipment designer.

20 Claims, 40 Drawing Sheets

(51) Int. Cl.
*H04L 49/351* (2022.01)
*G05F 1/08* (2006.01)
*H01R 24/64* (2011.01)
*H02J 7/00* (2006.01)
*H02M 3/335* (2006.01)
*H01L 23/467* (2006.01)
*H03K 19/173* (2006.01)
*G06F 1/3203* (2019.01)

(52) U.S. Cl.
CPC ............ *H01R 24/64* (2013.01); *H02J 7/0016* (2013.01); *H02M 3/33523* (2013.01); *H03K 19/1733* (2013.01); *H04L 49/351* (2013.01); *G06F 1/3203* (2013.01)

(58) Field of Classification Search
CPC . H02J 7/0016; H02M 3/33523; H01L 23/467; H03K 19/1733
USPC .......................................................... 713/300
See application file for complete search history.

(56) References Cited

U.S. PATENT DOCUMENTS

| | | | |
|---|---|---|---|
| 5,881,096 A * | 3/1999 | Majkrzak | H04B 1/713 375/133 |
| 6,541,878 B1 | 4/2003 | Diab | |
| 6,881,096 B2 | 4/2005 | Brown et al. | |
| 7,026,730 B1 | 4/2006 | Marshall et al. | |
| 2003/0084112 A1* | 5/2003 | Curray | H04L 67/34 709/208 |
| 2003/0194908 A1* | 10/2003 | Brown | H01R 31/06 439/620.22 |
| 2006/0175905 A1* | 8/2006 | Marshall | H01R 12/7088 307/147 |
| 2007/0170909 A1* | 7/2007 | Vorenkamp | G06F 1/266 324/76.11 |
| 2007/0208961 A1* | 9/2007 | Ghoshal | G06F 1/189 713/300 |
| 2010/0072982 A1* | 3/2010 | Tsai | H04L 43/10 324/140 R |
| 2011/0095767 A1* | 4/2011 | Motter | H04L 12/462 324/539 |
| 2011/0217873 A1* | 9/2011 | Diab | H01R 13/66 439/620.01 |
| 2013/0091579 A1* | 4/2013 | White | H01R 13/6633 726/25 |
| 2015/0172221 A1* | 6/2015 | Edwards | H04L 1/002 370/463 |
| 2017/0134149 A1* | 5/2017 | Chini | H04L 12/4035 |

OTHER PUBLICATIONS

NBASE-T Physical Layer Specification version 2.3, 2016 NBASE-T Alliance, Inc.
KinnexA Data Sheet XRJH-01C-H-A04-C71-DLL(D).
U.S. Appl. No. 12/913,793, filed Oct. 28, 2010.
U.S. Appl. No. 12/913,793, Office Action, dated Sep. 27, 2011.
International Search Report, dated Oct. 12, 2020.
Written Opinion of the International Searching Authority, dated Oct. 12, 2020.

* cited by examiner

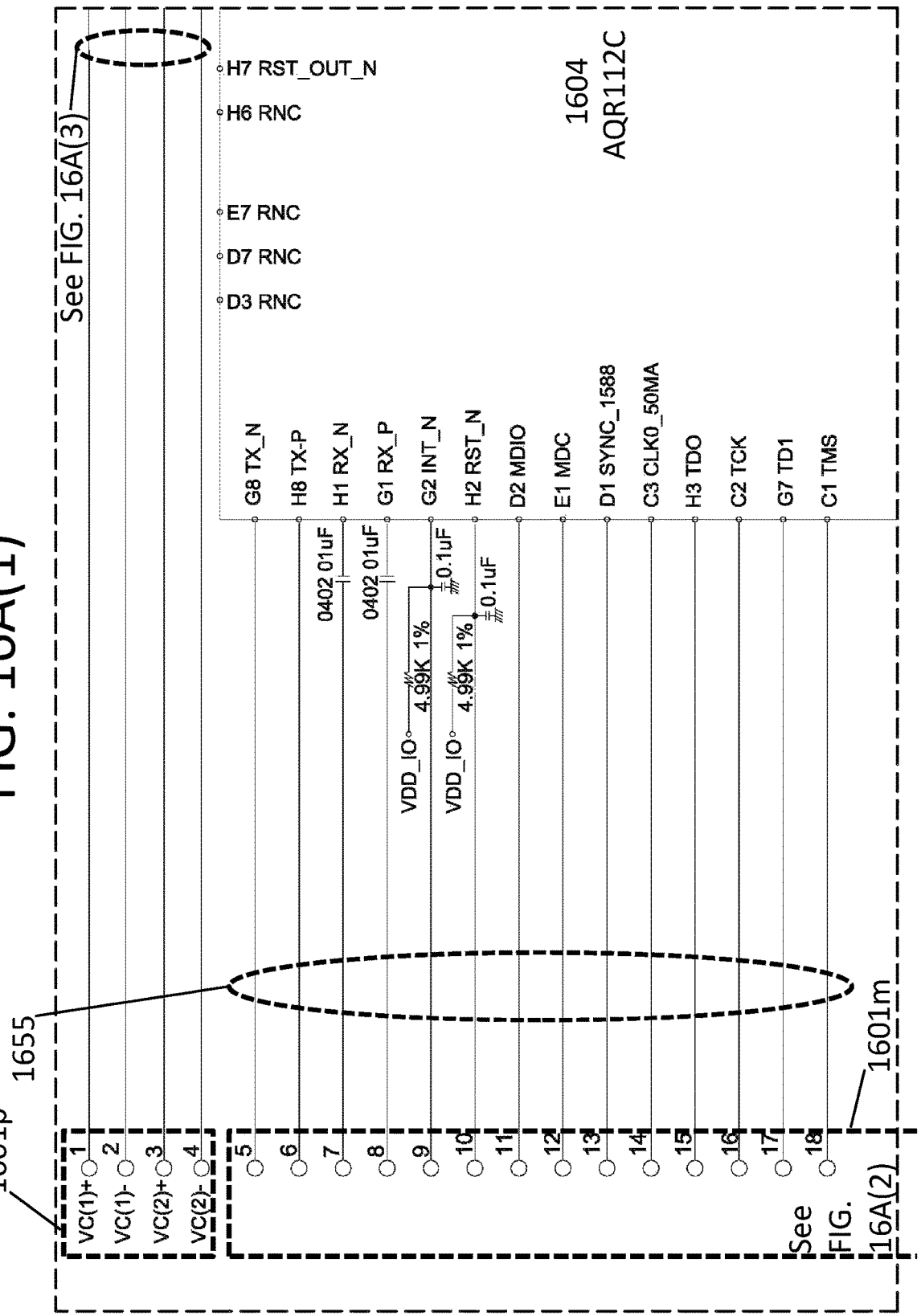
FIG. 16A(1)

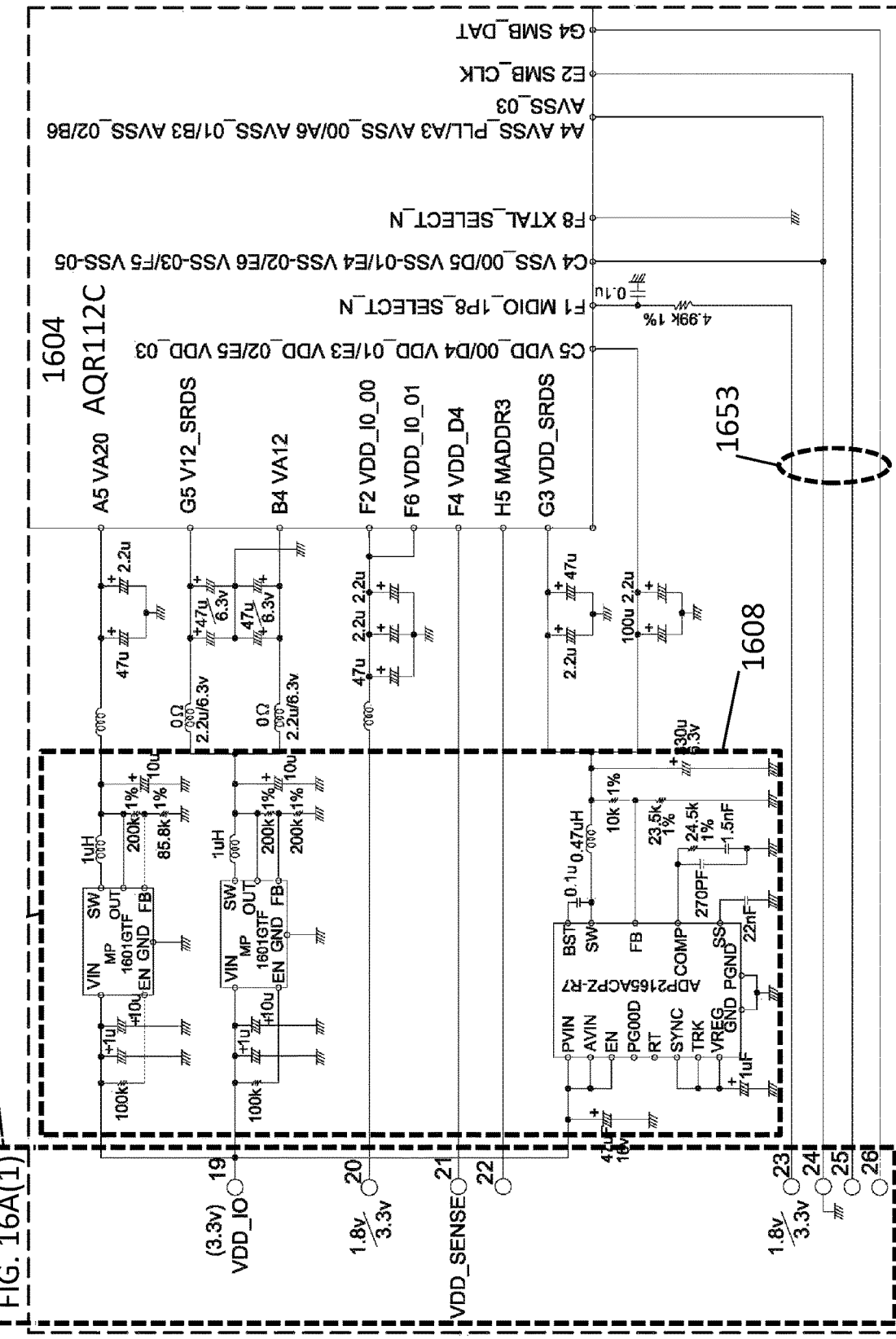
FIG. 16A(2)

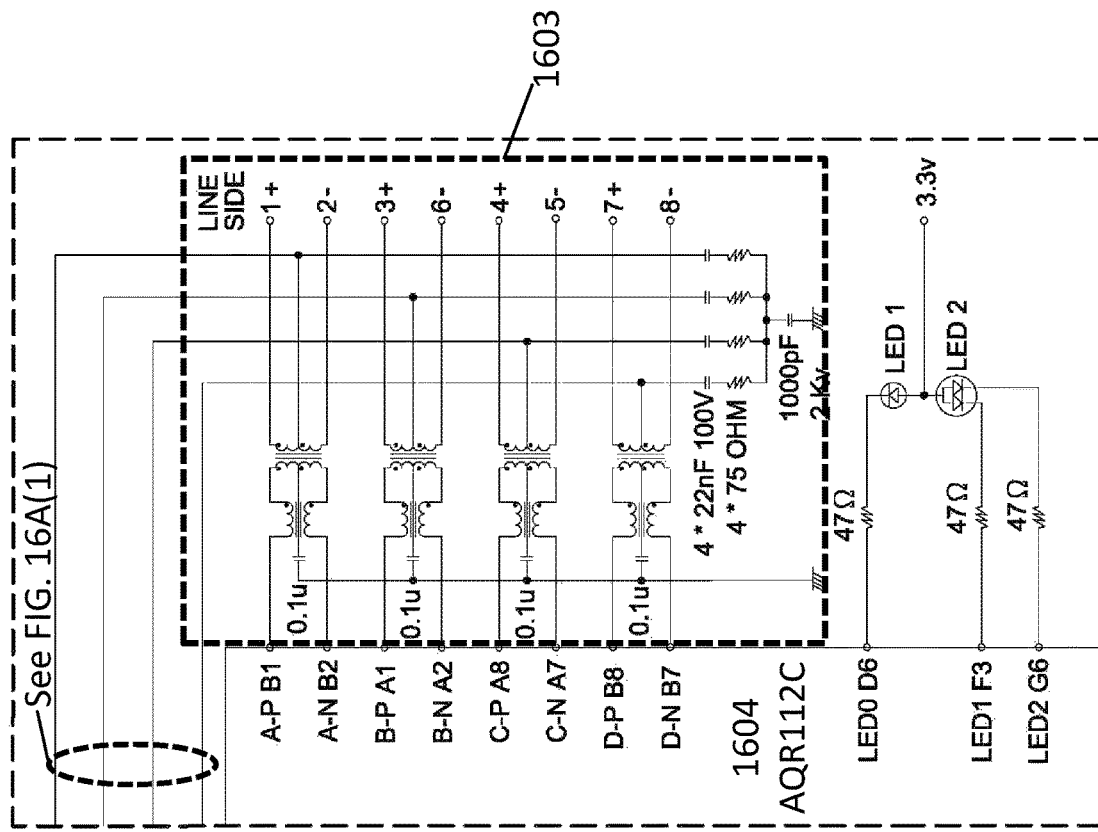
FIG. 16A(3)

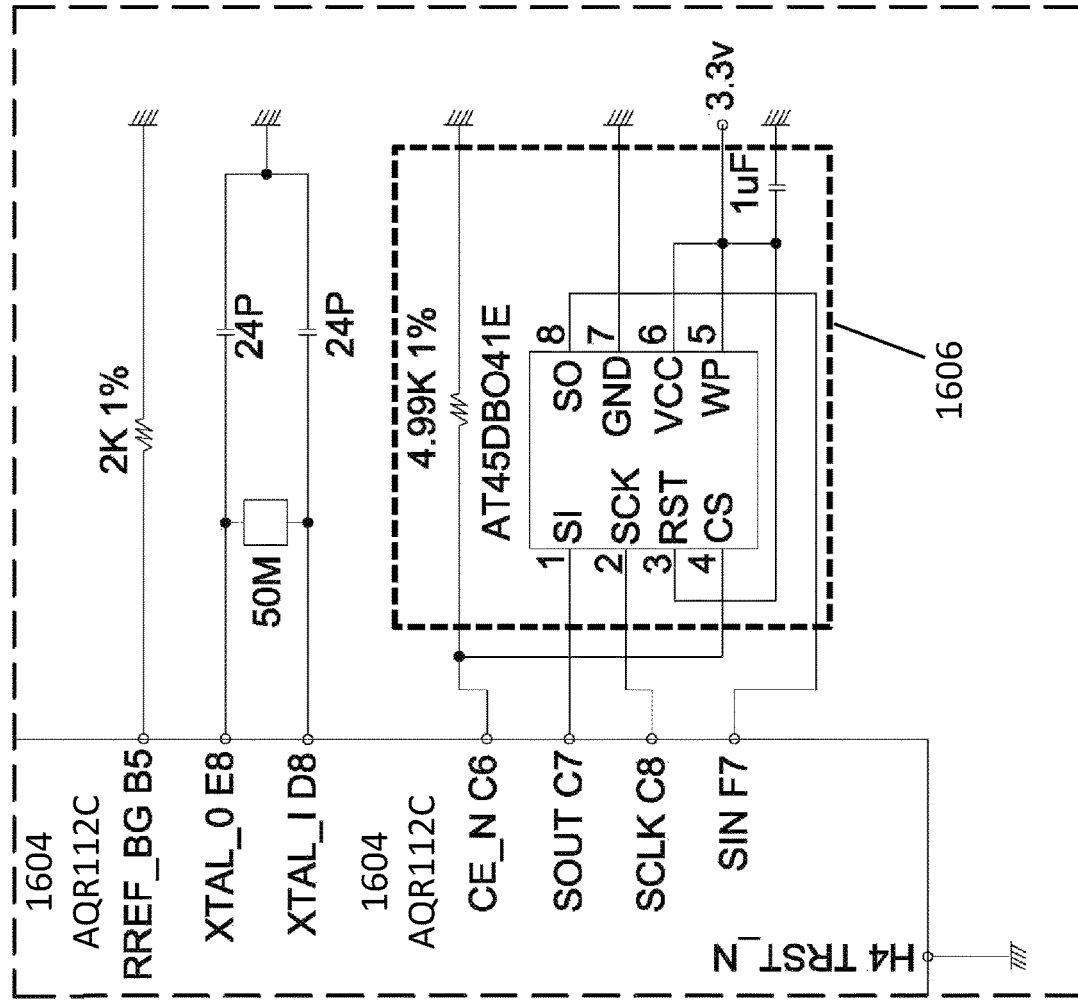
FIG. 16A(4)

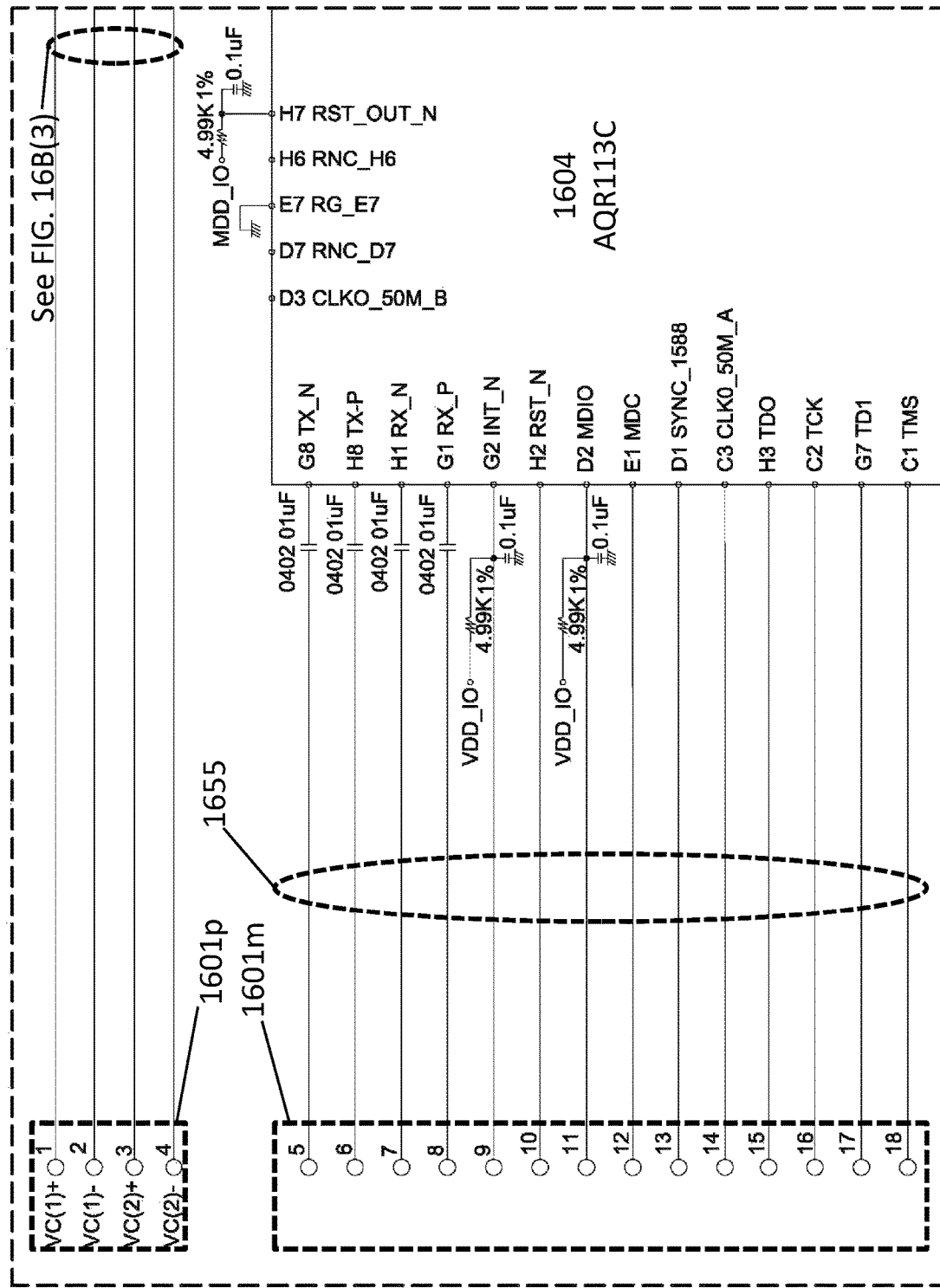
FIG. 16B(1)

FIG. 16B(2)
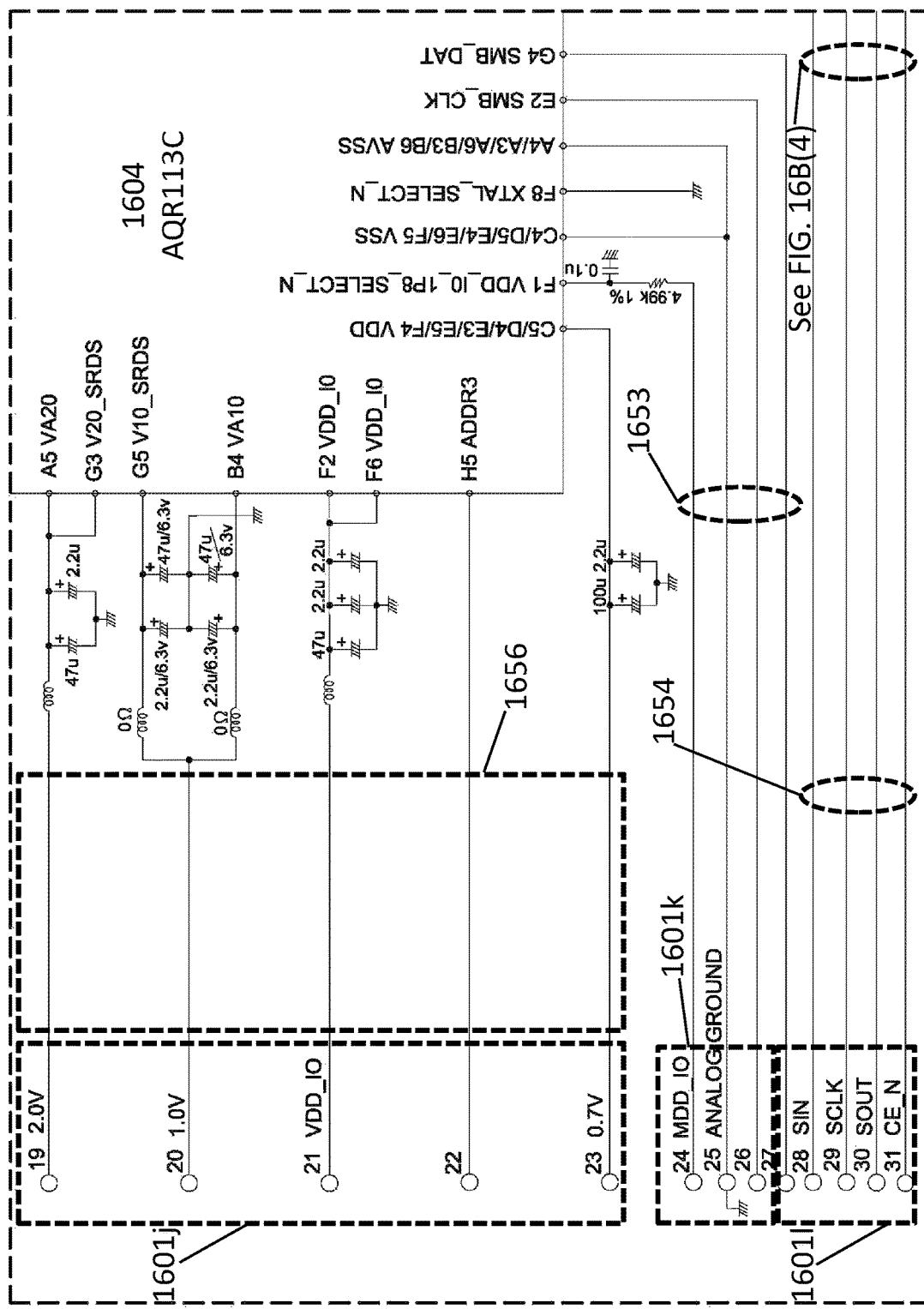

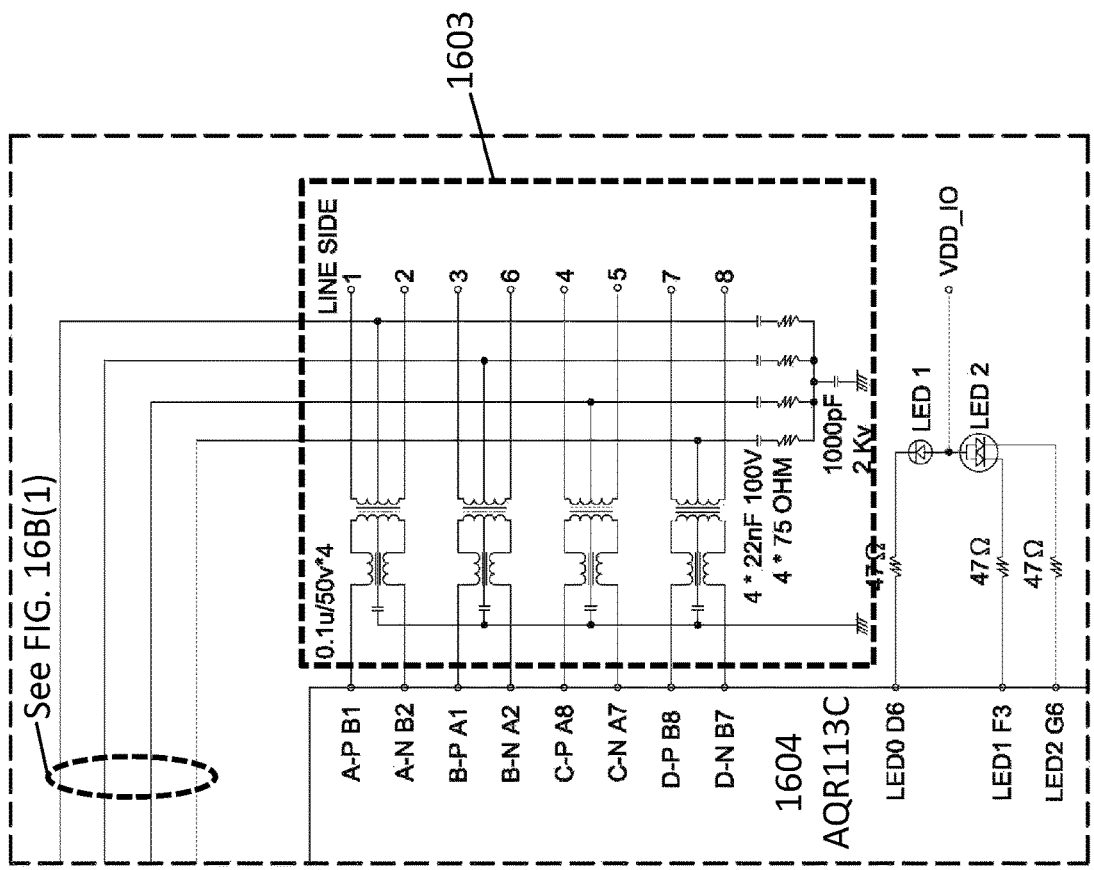
FIG. 16B(3)

FIG. 16B(4)
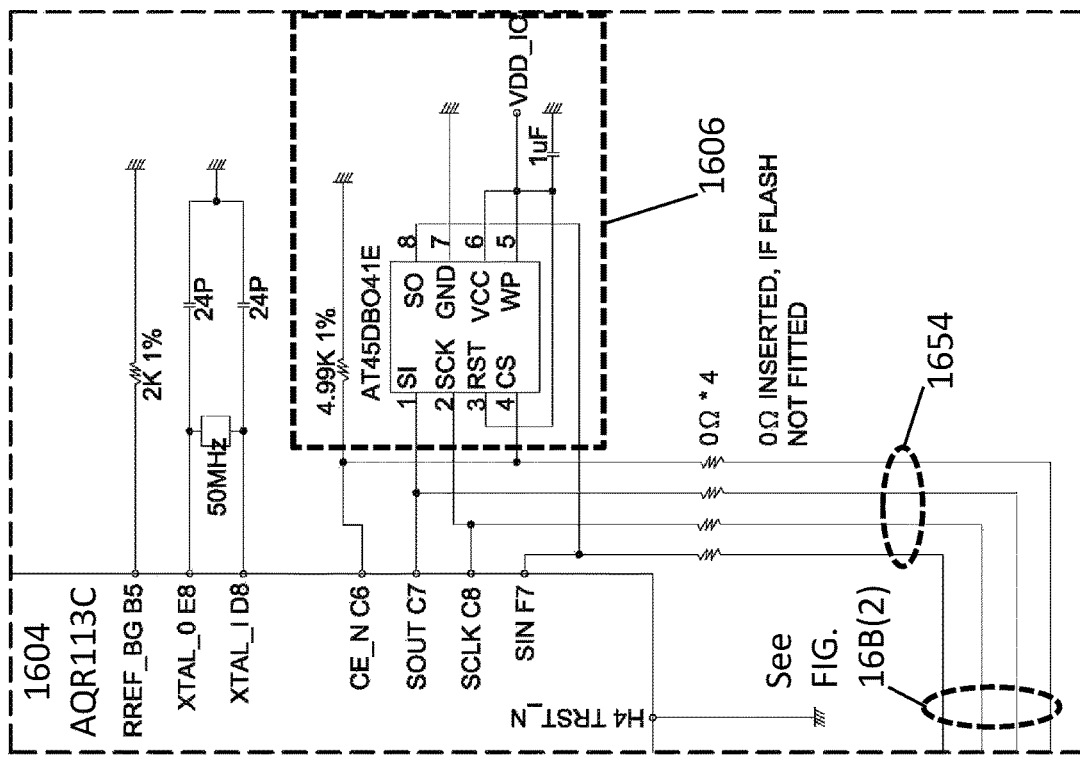

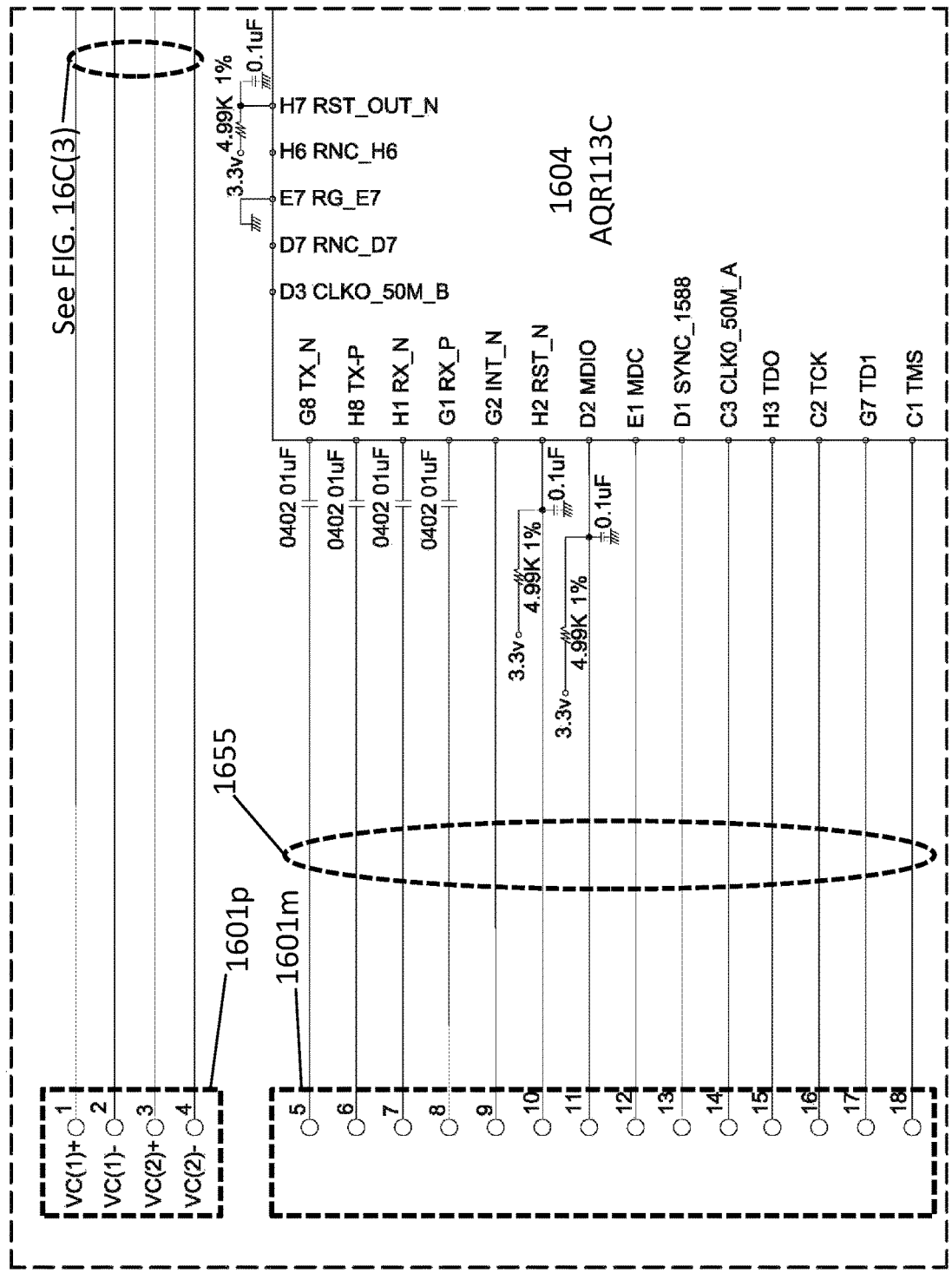

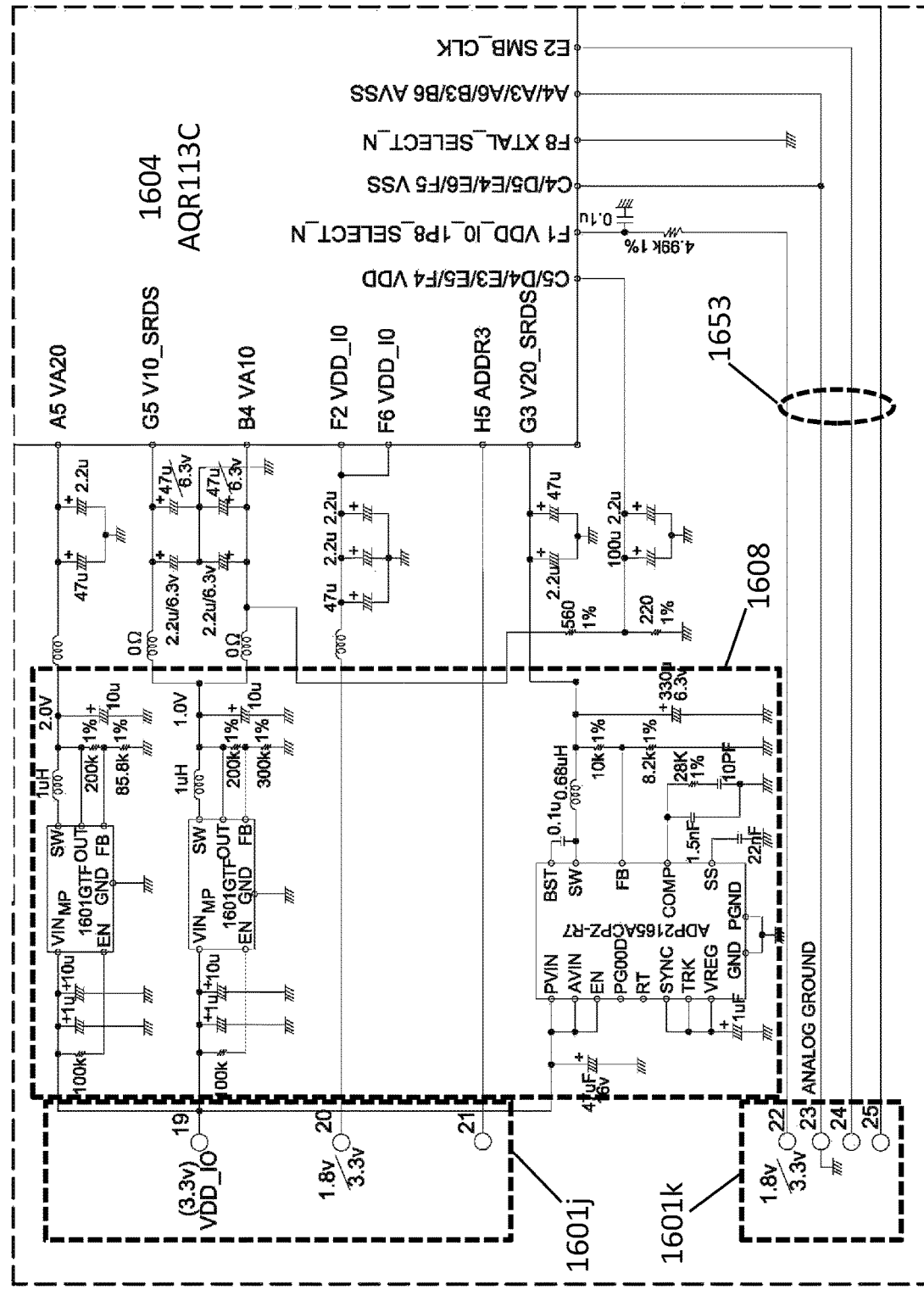
FIG. 16C(2)

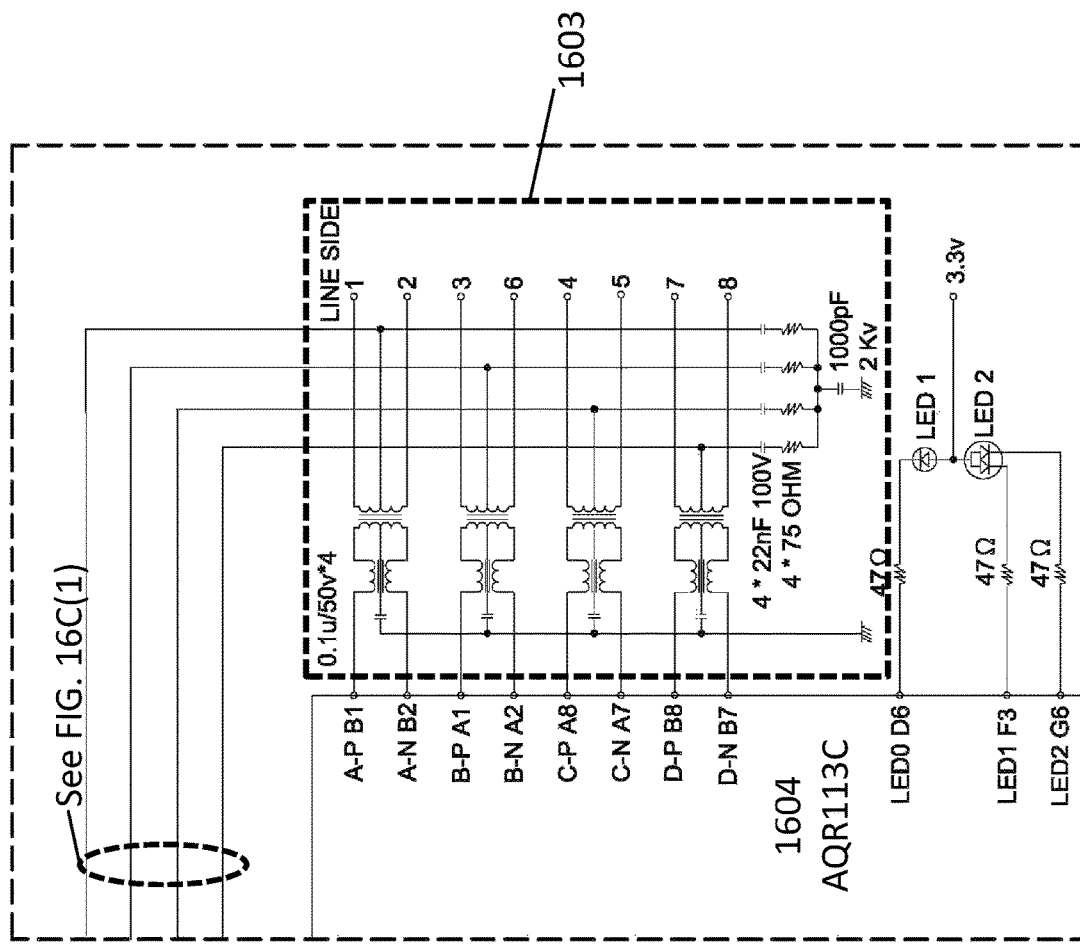
FIG. 16C(3)

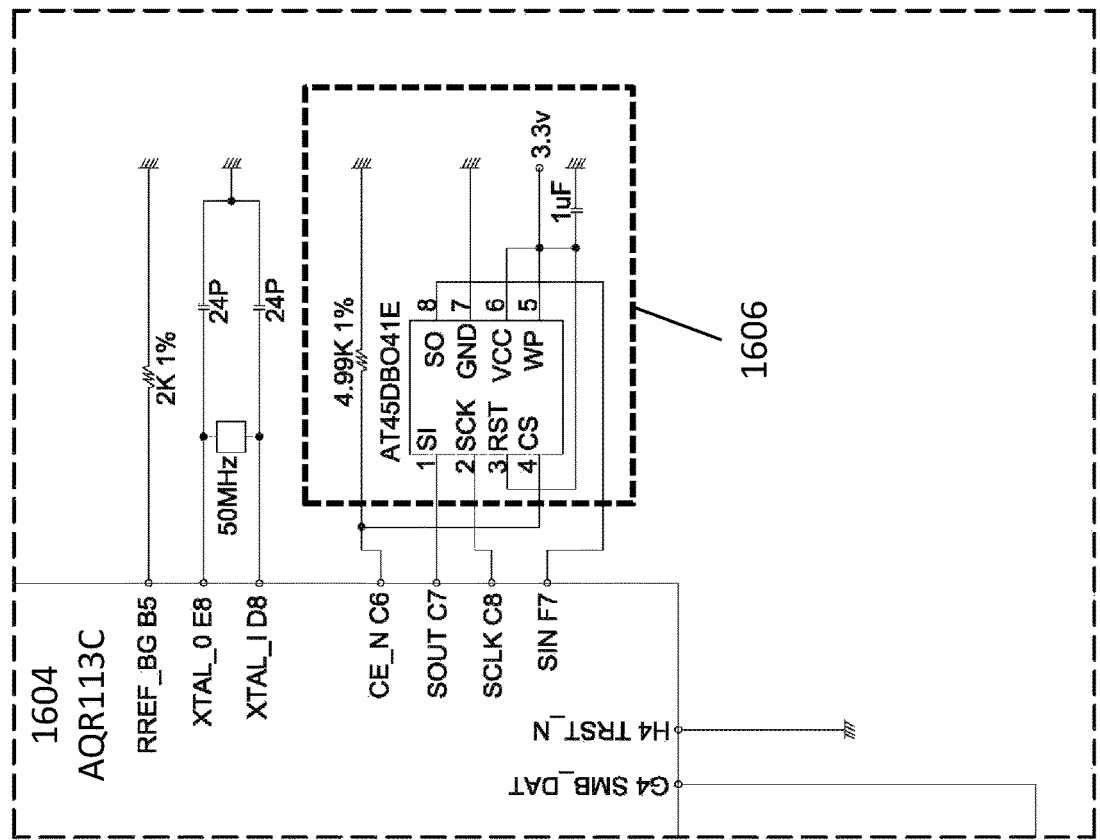
FIG. 16C(4)

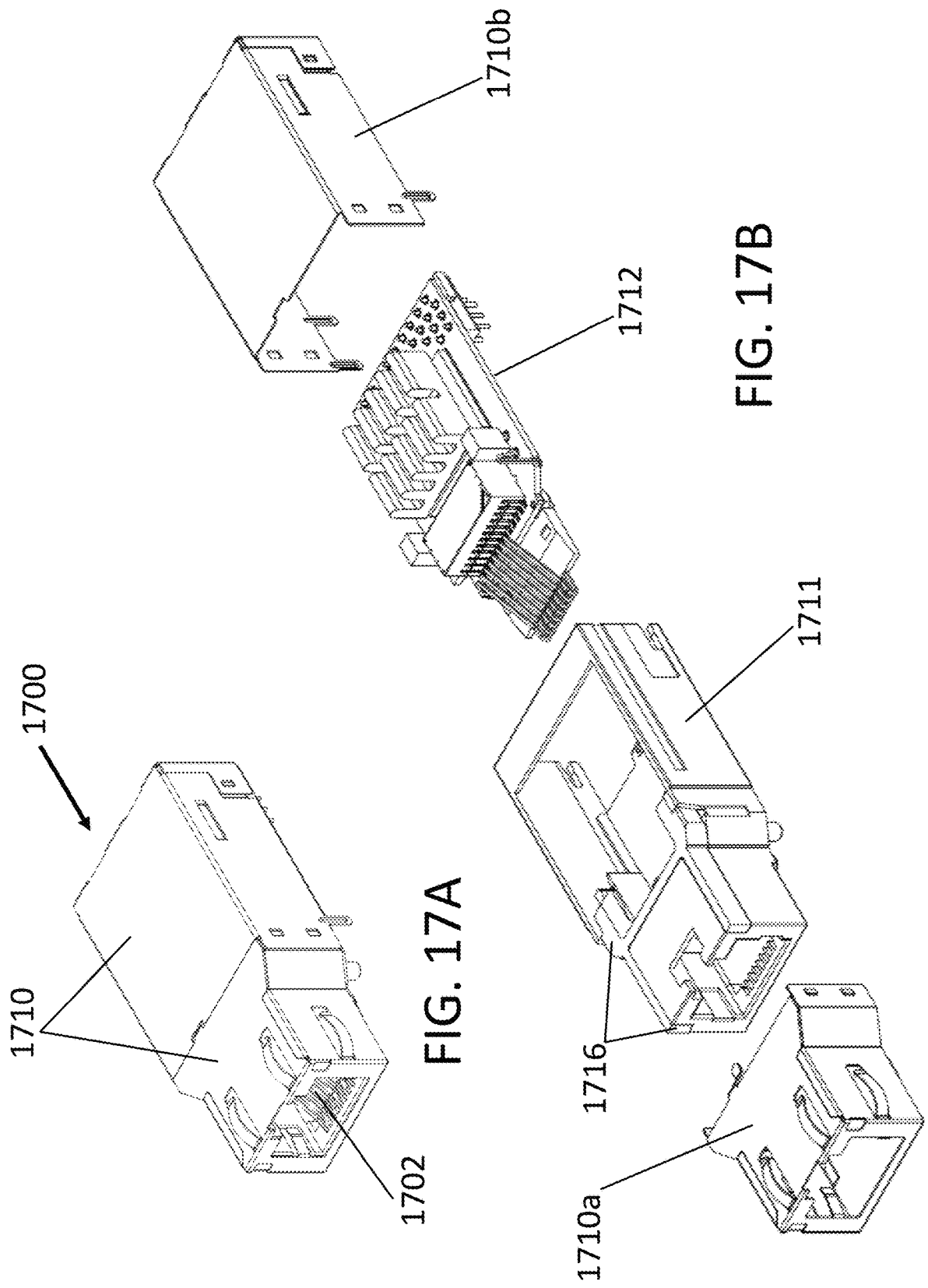

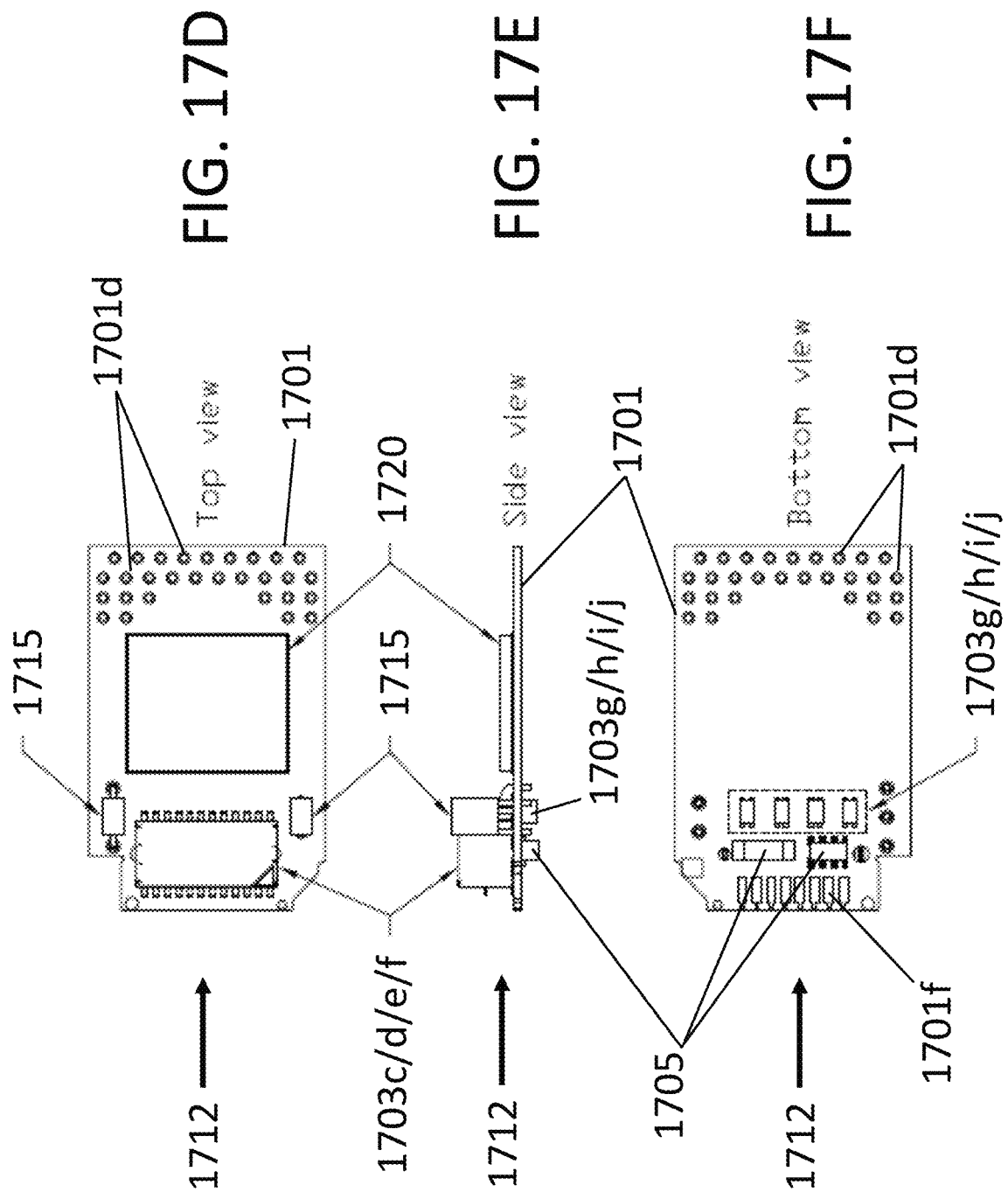

MODULAR PHYSICAL LAYER AND INTEGRATED CONNECTOR MODULE FOR LOCAL AREA NETWORKS

CROSS REFERENCE TO RELATED APPLICATIONS

This application claims priority to U.S. Provisional Application Ser. No. 62/772,599 entitled "Modular Physical Later and Integrated Connecter Module for Local Networks," filed on 28 Nov. 2018, the disclosure of which is incorporated herein by reference in its entirety for all purposes.

TECHNICAL FIELD

This disclosure relates to communications over a Local Area Network (LAN) in general, and specifically to LANs based on the IEEE 802.3 Standards, also commonly referred to as Ethernet. More particularly, the present disclosure describes technology to integrate different types of Physical Layer (PHY) integrated circuit, with additional optional functions, coupled with an Integrated Connector Module (ICM). The resulting integrated device typically consists of a network connector, referred to as a modular jack or RJ-45 connector, isolation magnetics components (to meet regulatory performance and safety criteria), an 802.3 Physical Layer (PHY) semiconductor device (chip) with associated electronics components (to perform specific encoding and decoding suitable for the data rate and physical media choice), as well as optional sub-assemblies to include or exclude additional functionality. A modular design and construction approach is utilized, such that the integrated device can be readily configured during the final manufacturing process, to suit a variety of high speed Ethernet interfaces that are designed to operate at different data rates over unshielded twisted-pair (UTP) cabling, such as 1000BASE-T, 2.5GBASE-T, 5GBASE-T and 10GBASE-T. In addition, Power over Ethernet (PoE) technology can also be incorporated, which allows power to be provided to the communications equipment over the same UTP cables as the data is transferred over. This allows a family of high speed Ethernet PHY-ICM devices, each with specific data rate and/or PoE power capabilities, to be constructed with a minimal number of sub-assemblies, all sharing a common system PCB footprint, which eases the task of the systems engineer in designing the PHY-ICM into a wide range of different communications equipment.

BACKGROUND

Multiple speed variants of 802/3/Ethernet® networks, including 10BASE-T, 100BASE-T, 10000BASE-T and even 10GBASE-T, are primarily deployed using structured horizontal in-building cabling, employing various grades of unshielded twisted pair (UTP) and shielded twisted pair (STP) cables, and are well known in the prior art.

Power over Ethernet (PoE) is also well understood, where a hub, switch, router or the like (generally referred to as a network infrastructure device) supplies power to a client end station or Data Terminal Equipment (DTE), using a "phantom power" circuit arrangement, utilizing the same twisted pair cabling as the communications data. Power over Ethernet is specified by IEEE 802.3 to support different power levels which can be delivered by the networking infrastructure device, referred to as the Power Sourcing Equipment (PSE), to the DTE, referred to as the Powered Device (PD). These are defined in the IEEE 802.3af Standard, which can generally provide up to 12.5 W at the PD (often referred to as simply "PoE"); the IEEE 802.3at Standard, which can generally provide up to 25 W at the PD (often referred to as "PoE+"); and the IEEE 802.3bt Standard, which is intended to provide as much as 100 W at the PD (and often referred to as "PoE++").

Each of the different speed physical interfaces to the UTP media utilizes a different coding scheme appropriate to operate at the required data rate to operate over a specified communications channel (cable type and length). As the data rate increases, in general the complexity of the encoding, decoding and processing power increases, such that providing a single solution across all speed options becomes significantly challenging. As the signal frequencies increase, issues such as power consumption, high speed signal integrity, board layout and EMI/RFI (electro-magnetic interference/radio frequency interference) emissions become more challenging.

What would be desirable is a modular approach to integrate an 802.3 Physical Layer (PHY) networking chip together with an Integrated Connector Module (ICM), which could scale across multiple data rates, power requirements, and system interface footprints. This solution should provide a simple manufacturing approach to minimize the customization required to produce each solution, provide a common footprint for the system designer to incorporate into a wide range of communications products, and allow the optimal design choice(s) for each system.

These and other limitations are solved by the present disclosure in the manner described below.

SUMMARY OF THE DISCLOSURE

In one embodiment, a PHY-ICM is constructed with a baseboard, which is populated with the primary Ethernet Physical Layer (PHY) transceiver integrated circuit and supporting components, while all of the internal voltages and currents for the PHY-ICM to operate at a specific maximum data rate are provided through a host interface shared by the PHY-ICM and the system application board.

In another embodiment, a PHY-ICM is constructed with a baseboard, which is populated with the primary Ethernet PHY transceiver integrated circuit and supporting components, and in addition is populated with a SIP Power Module, which provides some or all of the internal voltages and currents for the PHY-ICM to operate at a specific maximum data rate, from one or more external voltages provided through a host interface shared by the PHY-ICM and the system application board.

In another embodiment, an PHY-ICM is constructed with a baseboard, which is populated with the primary Ethernet PHY transceiver integrated circuit and supporting components, and in addition is populated with a SIP Power Module, the SIP Power Module being designed to exactly provide all of the internal voltages and currents for the PHY-ICM to operate at a specific maximum data rate, from a single external voltage provided through a host interface shared by the PHY-ICM and the system application board.

In another embodiment, a PHY-ICM is constructed with a baseboard, which is populated with the primary Ethernet PHY transceiver integrated circuit and supporting components, the PHY circuit accesses stored data from an external programmable memory, the memory device being external to the PHY-ICM and accessed through a host interface shared by the PHY-ICM and the system application board.

In another embodiment, a PHY-ICM is constructed with a baseboard, which is populated with the primary Ethernet PHY transceiver integrated circuit and supporting components, and in addition is populated with a SIP Personality Module, the PHY circuit accesses stored data from an external programmable memory, the memory device being located on the SIP Personality Module and accessed without use of the host interface shared by the PHY-ICM and the system application board.

In another embodiment, a PHY-ICM is constructed with a baseboard, which is populated with the primary Ethernet PHY transceiver integrated circuit and supporting components, and in addition is populated with a SIP Personality Module, the SIP Personality Module being primarily constructed with a Flash memory device, which provides some or all of the programmable functions loaded into the PHY chip, the SIP Personality Module providing a common interface to the PHY chip regardless of the various differences between manufactures pin outs of suitable Flash memory chips.

In another embodiment, a PHY-ICM is constructed with a baseboard, which is populated with the primary Ethernet PHY transceiver integrated circuit and supporting components, the PHY circuit monitors some of its external pins to determine how it should operate, and/or provides status on some of its external pins to indicate its condition, these pins being attached to the host interface shared by the PHY-ICM and the system application board.

In another embodiment, a PHY-ICM is constructed with a baseboard, which is populated with the primary Ethernet PHY transceiver integrated circuit and supporting components, and in addition is populated with a SIP Personality Module, the PHY circuit monitors some of its external pins to determine how it should operate, and/or provides status on some of its external pins to indicate its condition, certain of these pins being attached to the SIP Personality Module and monitored and/or driven both with and without use of the host interface shared by the PHY-ICM and the system application board.

In another embodiment, a PHY-ICM is constructed with a baseboard, which is populated with the primary Ethernet PHY transceiver integrated circuit and supporting components, and in addition is populated with a SIP Personality Module, the PHY circuit monitors some of its external pins to determine how it should operate, these pins being attached to logic on the SIP Personality Module, the logic using signal inputs from internal and/or external to the PHY-ICM, via the host interface shared by the PHY-ICM and the system application board.

In another embodiment, a PHY-ICM is constructed with a baseboard, which is populated with the primary Ethernet PHY transceiver integrated circuit and supporting components, and in addition is populated with a SIP Magnetics Module, which provides the required isolation and EMI/RFI noise immunity for operation at the specified range of data rates the PHY-ICM is capable of operating.

In another embodiment, a PHY-ICM is constructed with a baseboard, which is populated with the primary Ethernet PHY transceiver integrated circuit and supporting components, and in addition is populated with a SIP Magnetics Module and a Bob Smith Termination (BST) circuit, which provides for Power over Ethernet (PoE) operation compatible with one or more of the applicable IEEE 802.3 Standards, as well as the required isolation and EMI/RFI noise immunity for operation at the specified range of data rates the PHY-ICM is capable of operating.

In another embodiment, a PHY-ICM is constructed with a baseboard, which is populated with the primary Ethernet PHY transceiver integrated circuit and supporting components, and optionally populated with any one or more of a variety of SIP modules, such as a SIP Power Module, a SIP Personality Module, a SIP Bypass Module, and/or a SIP Magnetics Module, which provide the required functionality for operation at a specified maximum data rate.

In another embodiment, a PHY-ICM is constructed with a baseboard, which is populated with the primary Ethernet PHY transceiver integrated circuit and supporting components, optionally populated with any one or more of a variety of SIP modules, such as a SIP Power Module, a SIP Personality Module, a SIP Bypass Module, and/or a SIP Magnetics Module, which provide the required functionality for operation at a specified maximum data rate, and in addition is provided with a Thermal Management Subsystem which is sized and implemented in accordance with the maximum heat dissipation mode of the PHY-ICM.

In another embodiment, a PHY-ICM is constructed with a baseboard, which is populated with one manufacturer of an Ethernet PHY transceiver integrated circuit and supporting components, or it can be constructed with a baseboard, which is populated with an alternative second manufacturer of an Ethernet PHY transceiver integrated circuit and supporting components, while the PHY-ICM allows a compatible footprint on the host interface.

In another embodiment, a PHY-ICM is constructed using a SIP Transceiver Module, which integrates the primary Ethernet PHY transceiver integrated circuit and supporting components, and is optionally populated or depopulated according to the required functionality, with any one or more of a variety of functions that would otherwise be provided by SIP modules, such as a SIP Power Module, a SIP Personality Module, and/or a SIP Bypass Module, which provide the required functionality for operation at a specified maximum data rate.

In yet another embodiment, a PHY-ICM is constructed which allows multiple options for functionality and/or performance to be selected and inserted at manufacturing time, to minimize the number of different designs but maximize the flexibility to support a specific maximum data rate, range of data rates, power consumption, Flash memory and or PoE power requirements.

In yet another embodiment, a PHY-ICM is constructed which allows multiple options for functionality and/or performance to be selected and inserted at manufacturing time, to minimize the number of different designs but yet maintains a consistent system interface footprint across multiple data rates, power consumption and PoE power requirements, to minimize the variation in system design requirements.

In another embodiment, the modular design and construction approach disclosed for a single port PHY-ICM implementation, is applied to a multiport application, where the PHY chip may be either multiple discrete devices, or a multiport PHY chip, and the multiport PHY-ICM provides multiple RJ-45 connectors in the same mechanical housing.

In another embodiment, the modular design and construction approach disclosed for the PHY-ICM implementation, is applied to an optical transceiver module, where the PHY function may be composed of a number of electronic and/or optical modules, and those modules may be modified, populated or depopulated, depending on characteristics such as the type of fiber used and/or the intended distance of communication.

While the disclosed embodiments and description primarily relates to Ethernet copper solutions for 2.5GBASE-T, 5GBASE-T and 10GBASE-T, with support for PoE implementations, one of ordinary skill will realize that aspects of the disclosure can be applied to any phantom powered communications system, or any communications system, which utilizes point-to-point communications between a central device and a terminal device. Such communications systems typically require the use of multiple components at the physical media interface, have differing power requirements according to operational conditions, or require independence from device manufacturer's specifications such as PHY chip, supply voltage/power, Flash memory, magnetics components, and/or other network interface components.

BRIEF DESCRIPTION OF DRAWINGS

FIG. 16A is represented collectively by FIGS. 16A(1), 16A(2), 16A(3) and 16A(4). FIG. 16B is represented collectively by FIGS. 16B(1), 16B(2), 16B(3) and 16B(4). FIG. 16C is represented collectively by FIGS. 16C(1), 16C(2), 16C(3) and 16C(4).

FIG. 17A through FIG. 17F show illustrative examples of the construction of a modular PHY-ICM implemented using a highly integrated SIP Transceiver Module.

DETAILED DESCRIPTION

Figures 1A, 1B:
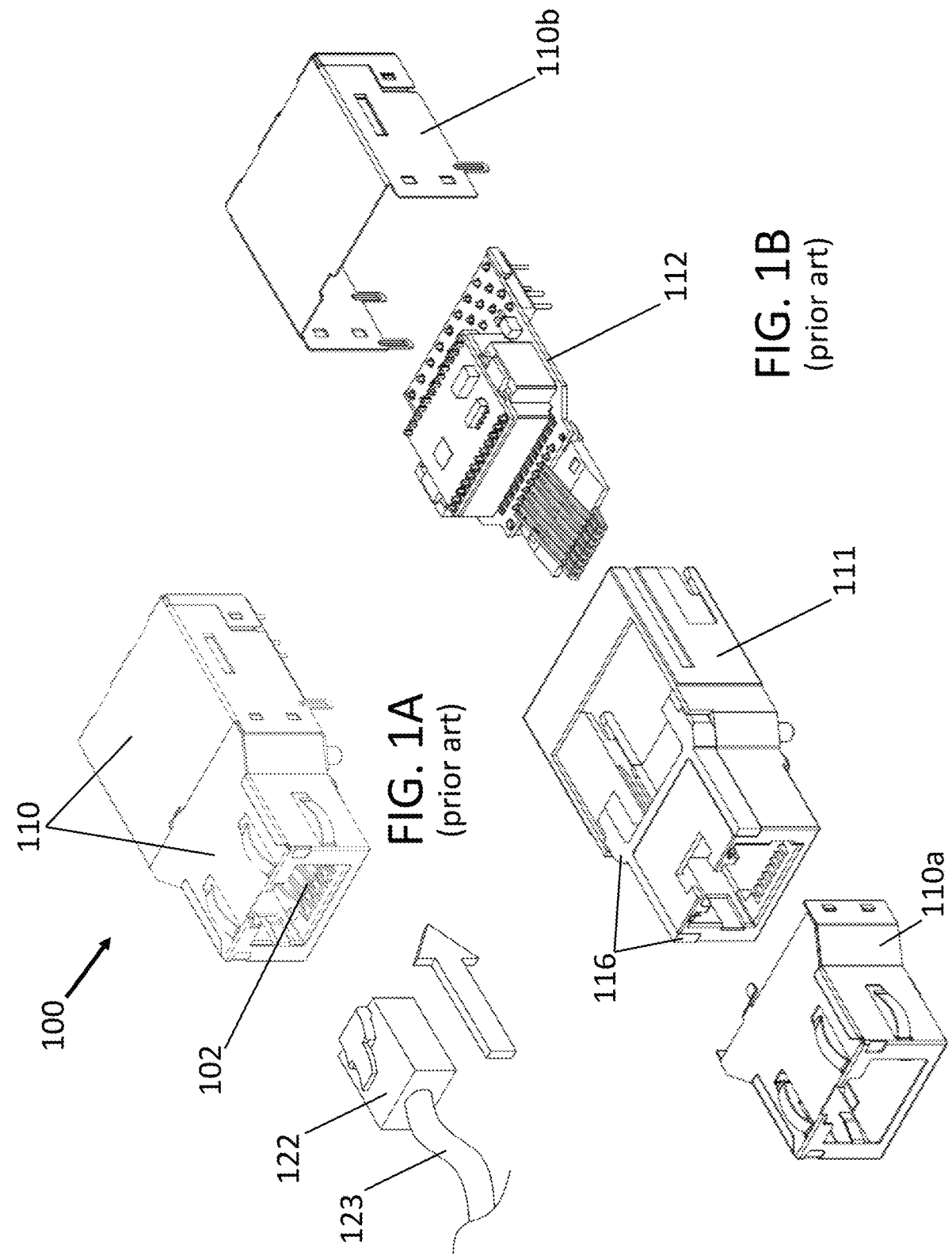
FIG. 1A through FIG. 1F show illustrative examples of the construction of a prior art PHY-ICM.

To provide an overall understanding of the innovative aspects of the subject matter, certain illustrative embodiments are described; however, one of ordinary skill in the art would understand that the embodiments described herein may be adapted and modified as appropriate for the specific application being addressed, and that alternative implementations may be employed to better serve other specific applications, and that such additions and modifications will not depart from the overall scope hereof.

For instance, the preferred embodiments are focused on various IEEE 802.3 (or Ethernet) speed derivatives such as 10BASE-T, 100BASE-T, 1000BASE-T, 2.5GBASE-T, 5GBASE-T and 10GBASE-T, since these are all networking topologies that utilize structured horizontal wiring cable plant in the form of unshielded twisted pair (UTP) and/or shielded twisted pair (STP). However, this technology is equally applicable to other Ethernet fiber optic interconnect topologies such as for example, 1000BASE-SX, 1000BASE-LX, 10GBASE-SR, 10GBASE-LR or 10GBASE-LRM, and may be applicable to any type of data communication system or technology that employs similar wiring or network topologies.

In the following detailed description, terminology has been adopted to describe aspects of the disclosure. Other descriptive terms and phrases are used to convey a generally agreed upon meaning to those of ordinary skill in the art, unless a different definition is given in this specification. The following paragraphs identify a lexicon of specific terms for clarity.

The terms "Integrated Connector Module" or "ICM" generally refer to a media specific interface that operates as an 802.3 Medium Dependent Interface (MDI). The ICM is essentially an integration of the MDI connector (typically the RJ-45 specified for UTP cabling), and the isolation and magnetics required for safety and noise suppression. Typically the ICM also includes LEDs, mounted in the exposed face of the RJ-45 connector, and visible from the exterior of the communications device (typically the front or rear panel) to display Link Status, network activity, or other relevant status. The ICM typically interfaces to unshielded twisted-pair (UTP) or shielded twisted-pair (STP) copper cable, connected via a corresponding RJ-45 plug. Typically, the ICM is enclosed in a metal housing to further assist the communications equipment designer with lowering electromagnetic interference (EMI) and radio frequency interference (RFI) issues.

The terms "PHY Integrated Connector Module" or "PHY-ICM" generally refer to the functionality of an ICM, plus the integration of the 802.3 Physical Layer (PHY) component of the media specific interface. This is differentiated from the simpler ICM, which does not integrate the PHY component. The PHY-ICM can be optimized to operate over a unshielded twisted-pair (UTP) or shielded twisted-pair (STP) copper cable. Alternatively, an "optical PHY-ICM" version may be implemented for fiber optic cables (defined below). The PHY-ICM is intended to offer the designer of a network product a modular, fully integrated sub-assembly solution for the Ethernet physical layer. The PHY-ICM integrates the functions of the physical layer interface appropriate to the media of choice, which generally includes the RJ-45 connector, a PHY chip and associated components, and electrical isolation. The PHY-ICM may include one or more additional functions such as power regulation, memory, logic, or other functions. Typically, the PHY-ICM is offered in a metal housing to further assist the communications equipment designer with lowering electro-magnetic interference (EMI) and radio frequency interference (RFI) issues.

The terms "baseboard," "printed circuit board assembly," or "PCBA" generally refer to a printed circuit board (PCB) which acts at the primary electrical interconnect between the component pieces of the PHY-ICMas well as the mechanical substrate on which they are located.

The terms "PHY I.C.," or "PHY chip" generally refer to a semiconductor integrated circuit which implements substantially all of and is compliant with the Physical Layer (PHY) requirements defined by IEEE 802.3 for 2.5BASE-T, 5GBASE-T and/or 10GBASE-T, and may support additional speeds such as 10BASE-T, 100BASE-T and/or 1000BASE-T. Such PHY chips are designed, manufactured and sold by a variety of semiconductor vendors.

The terms "system application" or "host system" generally refer to the host network device that incorporates one or more of the PHY-ICM devices. For example, the host network device may be a Network Interface Card (NIC) used to interface a Personal Computer (PC) to the network, it may be a PC motherboard where the NIC function is absorbed onto the main processor board, or it may be a switch, router, Wireless Access Point (WAP) or other similar network infrastructure device.

The term "host interface" refers to the general mechanical and electrical interface shared between the PHY-ICM and the system application or host system board. At the simplest level, the host interface is the means by which transmit and receive communications data, as well as configuration and management information, are passed between the host system and the PHY-ICM.

The terms "System in Package" or "SIP" generally refer to an electronic module that incorporates the components which provide an electronic system or sub-system. In the context of a PHY-ICM, a SIP module physically and electrically connects to the baseboard. While specific different SIP module examples are disclosed, these are non-limiting and other SIP module functions are both contemplated and fully anticipated. It should also be noted that the physical shape of the SIP is largely irrelevant, other than it is designed to fit within the physical constraints of the PHY-ICM. The physical and electrical connectivity of the SIP within the PHY-ICM can be implemented using any appropriate technology, and is both contemplated and fully anticipated, such as through-hole pins, surface mount technology (SMT), a permanent or pluggable electrical connector, discrete cables, ribbon cables, flex connector, or any other electrical attachment or connector style. The packaging arrangement and/or format of the SIP may also be of any appropriate technology, independent of the SIP function, such as, but not limited to, single in-line (SIL), dual in-line (DIL), chip-on-board (COB), flatpack, ball grid array (BGA), etc. Components on the SIP may be electrically interconnected by any circuit board, substrate or carrier means, such as, but not limited to, direct die attach, wire bonding, through-hole, SMT, BGA, flip chip, hybrid thick or thin film circuits, etc.

The term "SIP Power Module" is one preferred embodiment of a SIP which includes some or all of the power supply voltage regulator components for the PHY-ICM, which in general converts from one or more system input voltage levels supplied by the system board and external to the PHY-ICM, to one or more voltage levels for use internal to the PHY-ICM.

The term "SIP Personality Module" is another alternate preferred embodiment of a SIP, which provides for the programming and/or configuring of the overall functionality of the PHY-ICM, primary (but not exclusively) interfacing with the PHY I.C., through the baseboard. The SIP Personality Module would typically (but not exclusively) contain functionality such as Flash memory, input pin strapping options to configure the PHY chip, output pin monitoring from the PHY chip, operate logic that includes inputs from either the host interface and/or the PHY chip, generating outputs to either the system interface and/or the PHY chip, etc.

The term "SIP Bypass Module" is an alternate preferred embodiment of a SIP, which bypasses the functions of the SIP module it replaces. The purpose of the SIP Bypass Module is to provide alternate functionality or connectivity, to allow the same or similar functionality that the SIP module it replaces would have provided, to be relocated and provided by alternate functionality in another part of the system application board, or elsewhere in the overall system implementation.

The term "SIP Transceiver Module" is yet another alternate preferred embodiment of a SIP, where the PHY chip, and optionally some or all of the other SIP Module's functionality, as well as some of the external components and connectivity typically provided by the baseboard, are subsumed and integrated into a single SIP device. Typically, the SIP Transceiver Module would be assembled on its own baseboard, substrate or carrier, which may be a different technology and/or material to that of the PHY-ICM baseboard.

The term "optical PHY-ICM" is used to refer to a special class of module that is optimized for interface to fiber optic cables. Such modules are defined by industry consortiums referred to as Multi-Source Agreements (MSAs), consisting of member companies with specific expertise in the design, manufacture and deployment of fiber optic network components. There are multiple MSA specifications that have developed over the years to support the ever increasing network data rate. These include, along with their typical maximum data rate, "SFP" (Small Form-Factor Pluggable) for 1 Gb/s, "SFP+" for 10 Gb/s, "QSFP" (Quad SFP) for 4×1 Gb/s, QSFP+ for 4×10 Gb/s, QFSP28 for 4×25 Gb/s or 100 Gb/s, and "QFSP-DD" (QFSP Double Density) for 8×25 Gb/s or 200 Gb/s, and 8×50 Gb/s or 400 Gb/s. These modules obtain their input power from external pins defined on the MSA connector, they may also need to generate additional supply voltages internal to the module to power the circuits within the optical PHY-ICM. In this case, they may also incorporate a SIP Power Module, or a SIP module incorporating other functionality. For instance, a SIP module may contain the appropriate photonic laser and/or LED transmit/receive electronics appropriate to interface to match the appropriate type of fiber being driven, such as different versions of Single Mode Fiber (SMF) or Multi Mode Fiber (MMF), or the intended distance of communication (long-haul versus short haul).

The terms "Power over Ethernet" or "PoE" refer in general to one or more published IEEE 802.3 Specifications, which specify the requirements for powering a remote piece of equipment (using a DC power source), without disturbing the data communication (using AC signaling), over the same UTP cable. The terms "Power Sourcing Equipment" or "PSE" refer to the device which supplies the DC power at one end of the UTP communications link, and is typically a network switch, router or other similar network infrastructure equipment. The terms "Powered Device" or "PD" refer to the device which receives remote power at the other end of the UTP communications link, and is typically a network device such as a computer, wireless access point (WAP), IP telephone, IP camera, or other similar network end station.

The terms "Bob Smith Termination" or "BST" refer to a well-known and widely adopted technique for terminating UTP and/or STP cables to minimize EMI/RFI emissions, as well as susceptibility to induced noise from external sources. In 1994, Robert ("Bob") Smith received U.S. Pat. No. 5,321,372 for his eponymous terminations, hereby incorporated by reference. The BST technique has undergone a number of changes as Ethernet functionality has evolved, including modifications for use in PoE applications.

The term "Thermal Management Subsystem" is used to refer to the set of modular-based, incremental heatsink and/or other cooling measures taken to ensure the operation of a particular PHY-ICM at its highest date rate and/or heat dissipation mode.

Prior art PHY-ICM examples exist for data rates of 10/100/1000BASE-T, which generally only integrate the PHY chip, its associated external passive components, and the ICM. However, as network data rates continue to increase, for 2.5GBASE-T, 5GBASE-T and 10GBASE-T, the system design complexity also increases, and adds challenges for the system designer across a number of fronts. These include signal integrity, provision of multiple tightly controlled supply voltages, power consumption, heat dissipation, programmability support, PoE support and power level, EMI/RFI emissions, minimization of board real estate, and supply-chain guarantees.

The requirement to support data rates in the range 2.5-10 Gb/s (and speeds beyond 10 Gb/s), combined with the need to minimize pin count on networking chip interfaces, has led to the adoption of high speed serializer/deserializer (SerDes) technology. This involves balanced differential pair transmission and reception, where both clock and data are encoded on a single pair. Clock synchronization is embedded in the data stream, and no other external clock synchronization is present. Multiple SerDes pairs, or "lanes" may be used to achieve the overall aggregate date rate. For instance, simplistically, for 10 Gb/s operation, four lanes of 2.5 Gb/s could be employed. However, to further reduce pin count, as semiconductor technology has improved, a single lane of SerDes of 10 Gb/can be accomplished. For the system design, this imposes significant high speed signaling design challenges, where the need to minimize/match PCB trace lengths, minimize extraneous parasitic effects, and impedance match signal paths, are all paramount. A tightly controlled PHY-ICM design can closely manage these requirements and offset some of the burden from the system designer, especially if the host interface is designed to closely match that of the system application, which is typically a switch or MAC chip on the system application board. Further, any signal or power supply noise decoupling that is necessary, is generally best performed as close to the PHY chip as possible. Again, the PHY-ICM design can assist the system designer by controlling such things as integrating power supply regulators and/or decoupling capacitors to provide a repeatable design.

High data rate PHY chips are manufactured in advanced process technologies, and typically require multiple power supply voltages, each with varying current/power requirements dependent on the maximum data rate. In additional, these supply voltages must meet stringent stability requirements in terms of power supply ripple and/or noise, to avoid disrupting the complex transmit encoding and receive decoding schemes employed, and leading to excessive communication bit error rate (BER) performance on the network. The system designer is faced with the challenge of providing multiple supply voltages/currents to comply with the stringent specifications required by the PHY chip. A range of PHY-ICM devices that at final assembly, can allow the choice of either operational voltage supply from the host interface, or precise integrated supply voltage generation, is clearly preferable.

In many cases, while the PHY chip is capable of supporting multiple data rates, the network equipment designer is typically targeting one maximum data rate, which may be lower than the maximum data rate capability of the PHY chip. The power consumption of the PHY-ICM is dominated by the PHY chip, and the maximum operational data rate generally dictates the overall power consumption of the PHY-ICM. For example, a PHY chip operating in the 10GBASE-T mode will consume more power than the same PHY chip operating in the 5GBASE-T mode, and a PHY chip operating in the 5GBASE-T mode will consume more power than the same PHY chip operating in the 2.5GBASE-T mode. The overall power dissipation, for a fixed form factor device such as the PHY-ICM, requires appropriate thermal management to match the maximum date rate and thermal operating environment, which will dictate the worst case thermal management requirements. The ability to provide a range of PHY-ICM devices that at final assembly, can be configured to accommodate the required maximum data rate and thermal environment, and therefore the choice of heatsink, on a modular basis, is clearly preferable In addition, the PHY chip may often integrate a programmable element such as a microcontroller, which requires external Flash memory support. While multiple Flash memory devices may be available, they do not generally share the same electrical footprint. In order to ensure Flash vendor independence, the system designer must provide a flexible interface to accommodate multiple Flash memory devices. Further, in some system applications, the preferable location of the Flash memory may be located within the PHY-ICM, or alternatively elsewhere in the host system. A range of PHY-ICM devices that at final assembly, can allow the choice of either on-board or off-board Flash memory location, and in addition provides Flash memory vendor independence, is clearly preferable.

The presence or absence of PoE support is also an important factor. Not all network equipment requires PoE support, and there is a small cost premium associated with its inclusion. A PHY-ICM can that be simply configured at final assembly, to optionally exclude or include the PoE provision, and if included, select the power level to be supported, is clearly advantageous.

Directly related to the high speed signaling, the system designer must also be aware of the need to meet regulatory approval for EMI/RFI emissions and susceptibility appropriate to the geographic region in which the equipment will be sold. This too can be aided by the PHY-ICM, using careful design and by integrating a metal shielded enclosure as part of the solution.

The PHY-ICM solution clearly offers a tight integration between the mechanical and electrical components, and reduces the overall board real estate for the solution, by utilizing the area within the RJ-45 connector to minimize trace lengths and pack electronic components within the connector.

A large concern for the system designer/vendor, is the subject of guaranteed supply. In an ideal scenario, all chips from all silicon suppliers would be identical in pin out and function, so that direct substitutions could be made. This is clearly not the case, and for a highly specialized device such as a PHY chip there is rarely a "second source" supplier. Here again, the PHY-ICM vendor can offer benefit to the system vendor, by offering a common footprint for a PHY-ICM family that can potentially utilize different PHY chips internally. Such a capability is clearly advantageous to the system vendor, but must be managed carefully by the PHY-ICM supplier to avoid a multitude of component "Stock Keeping Units" (SKUs) in order to manufacture the device.

All of the above-mentioned issues complicate both the system designer's job and the PHY-ICM supplier's inventory requirements due to the number of options. These factors are further exacerbated as the port density of the network equipment increases.

The system designer wants an integrated PHY-ICM solution that meets his/her target data rate with the optimal features and cost. In order for the PHY-ICM provider to meet the system designer's requirements, and offer a more integrated PHY-ICM solution, which covers a wide range of network equipment solutions, the PHY-ICM provider would need "a priori" knowledge of the network equipment designer's choice of system partitioning. For instance—one designer may want to provide his or her own regulated power supplies outside the PHY-ICM, where another may not; or another designer may want the Flash memory integrated in the PHY-ICM, where another may not.

Using a conventional design and manufacturing approach to implement a fully integrated PHY-ICM solution to suit the required data rate and system partitioning, as well as all of the technical requirements such as maximum data rate, PoE support, Flash memory, etc., would require multiple different design solutions, part/SKU numbers, and become a major inventory problem for the PHY-ICM manufacturer and the supply-chain.

What is needed is a modular integrated PHY-ICM solution, which can be configured at assembly time to support a data rate and PHY vendor independent system interface, across at least the 2.5/5/10GBASE-T data rates, for a single channel RJ-45 solution. This has multiple advantages as follows. Firstly, it allows the system vendors to mix PHY vendor and speed solutions across their product lines with minimum system board rework. Secondly, it allows the PHY-ICM vendor to offer a portfolio of solutions based on a common design, dependent on the specific data rate, integrated features and power consumption that a specific system vendor is targeting. Thirdly, it opens the field to multi-vendor support, offering a common footprint that multiple PHY-ICM vendors and system designers can adhere to for interoperation.

While this disclosure is primarily focused on single port implementations, typically referred to in the industry as an "1×1" (a single RJ-45 in height and width), it will become evident that the techniques that are disclosed will be applicable to higher port density applications. Such higher port density implementations are typically referred to a an "1×n" (a single RJ-45 in height and where "n" is typically 2, 4, 6 or 8 RJ-45s in width) or a "2×n" (a dual RJ-45 in height and where "n" is typically 2, 4, 6 or 8 RJ-45s in width) configurations.

It should be noted that in FIG. 1 through FIG. 19 and throughout this specification, like number suffixes correspond to identical or similar entities. For instance, PHY chip (304) in FIG. 3 corresponds to PHY chip (404) in FIG. 4, PHY I.C. (504) in FIG. 5, etc., and similarly through PHY I.C (1804) in FIG. 18.

Referring to FIG. 1A through FIG. 1F, prior art examples of a PHY-ICM (100) for 10/100/1000BASE-T operation are shown. These examples incorporate the PHY transceiver chip, isolation magnetics and some ancillary components, such as resistors, capacitors, inductors, crystal oscillator, etc.

FIG. 1A shows a view of the PHY-ICM (100) finished product appearance, with the RJ-45 connector (102) at the front of the module, and the two-part shielding case (110) which encloses the module. An RJ-45 plug (122) terminates the UTP or STP cable (123) and is inserted into the RJ-45 connector (102) to complete the network connection. The RJ-45 connector (102) is typically comprised of a housing incorporating a planar array of parallel electrical contacts for mating with the RJ-45 plug (122) and its aligned electrical contacts. The RJ-45 connector (102) contacts are typically spring loaded to bias engagement with the contacts of the RJ-45 plug (122). The RJ-45 connector and plug also provide a latching mechanism (not shown) to retain the RJ-45 plug captive in the RJ-45 connector, and a keying mechanism (not shown) to prevent insertion of improper plugs into the connector, both of which are well known in the prior art.

FIG. 1B shows an exploded view of the main component sub-assemblies of the PHY-ICM. The front shielding case (110*a*) and rear shielding case (110*b*) form the two-part shielding case (110) depicted in FIG. 1A which encloses the module. Plastic housing (111) provides a mechanical structure upon and within which the overall module is assembled, and provides the physical enclosure for the RJ-45 connector (102) of FIG. 1A. The light pipe (116) which separated from the plastic housing (111), allows light to be transferred from the PCB assembly (112) to the front face of the RJ-45 connector (102), such that the status of the Ethernet port can be viewed from the front panel of the networking equipment. PCB assembly (112) contains essentially all of the electrical components and connections, as described in more detail in FIG. 1C.

Figure 1C:
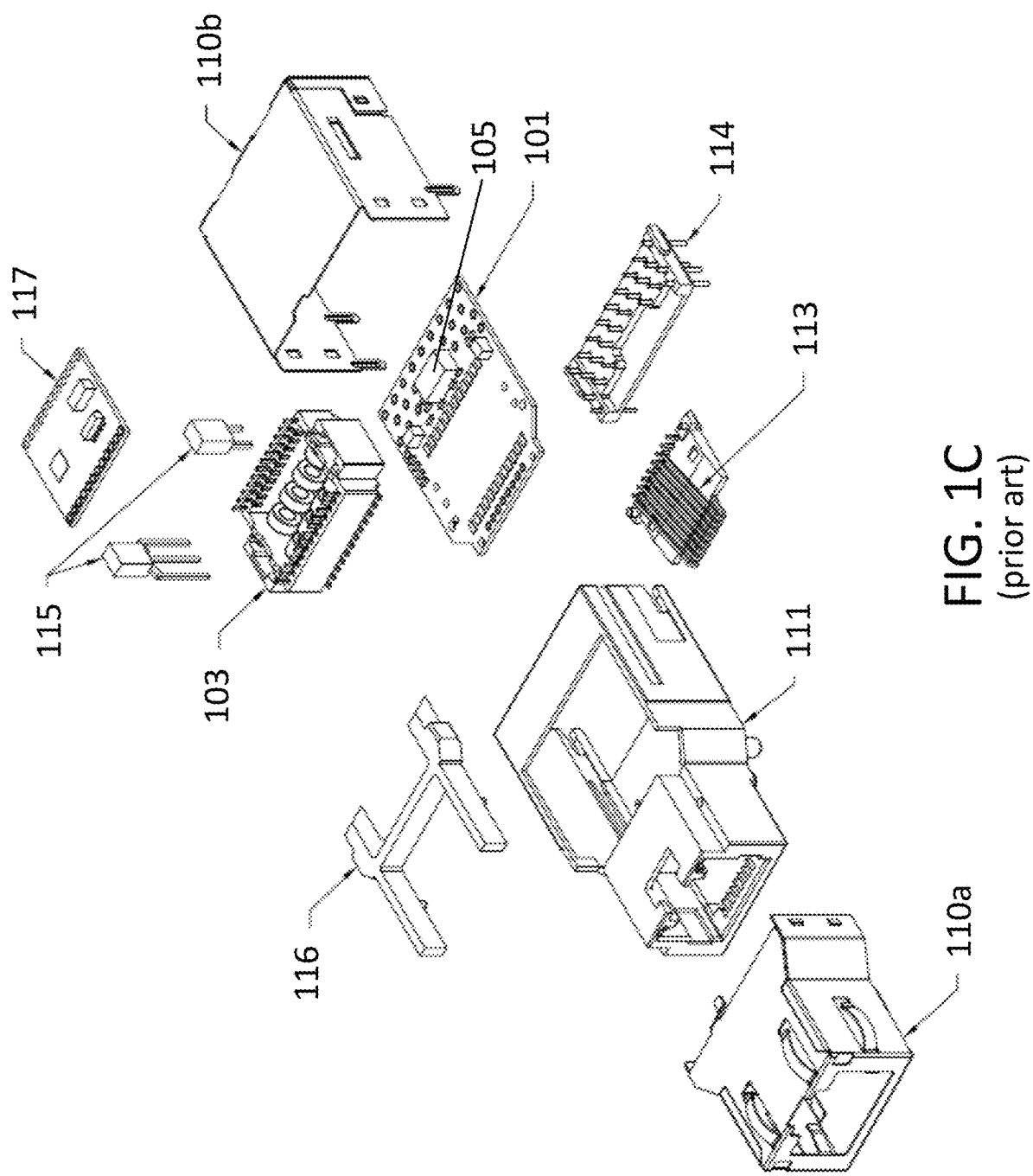

FIG. 1C primarily shows additional detail of the PCB assembly (112) of FIG. 1B, while front shielding case (110*a*), rear shielding case (110*b*), and plastic housing (111) are identical to those described in FIG. 1B. The PCB assembly (112) is composed of a baseboard (101) on which various components and sub-assemblies are mounted. These include components such as the PHY chip (104) (not shown in this view since it is soldered to the underside of baseboard (101), but shown in FIG. 1F), additional electronic components (105), and LEDs (115); as well as sub-assemblies for the Isolation Magnetics Module (103), RJ-45 contacts assembly (113), solder tail (114), and top PCB (117). RJ-45 contacts assembly (113) is soldered to the baseboard (101) and projects out and into the plastic housing (111) to form the finished RJ-45 connector (102) once fully assembled. Solder tail (114) is also electrically connected (soldered or press fitted, for example) to the baseboard (101) and contains the physical interface pins (or connectivity sites) that provide the electrical connection between the fully assembled PHY-ICM (100) and the system application board (not shown). Isolation and magnetics module (103) provides the required electrical isolation and EMI/RFI suppression, and in this embodiment, also provides additional contacts to its top surface to allow the top PCB (117) to be electrically connected. Top PCB (117) in this case contains components associated with the Bob Smith Termination (BST) for additional EMI/RFI performance enhancement. Light pipe (116) is shown separated from the plastic housing (111), which allows light to be transferred from the site of the LEDs (115) mounted on the baseboard (101) to the front face of the RJ-45 connector (102), such that the status of the Ethernet port can be viewed from the front panel of the networking equipment.

Figures 1D, 1E, 1F:
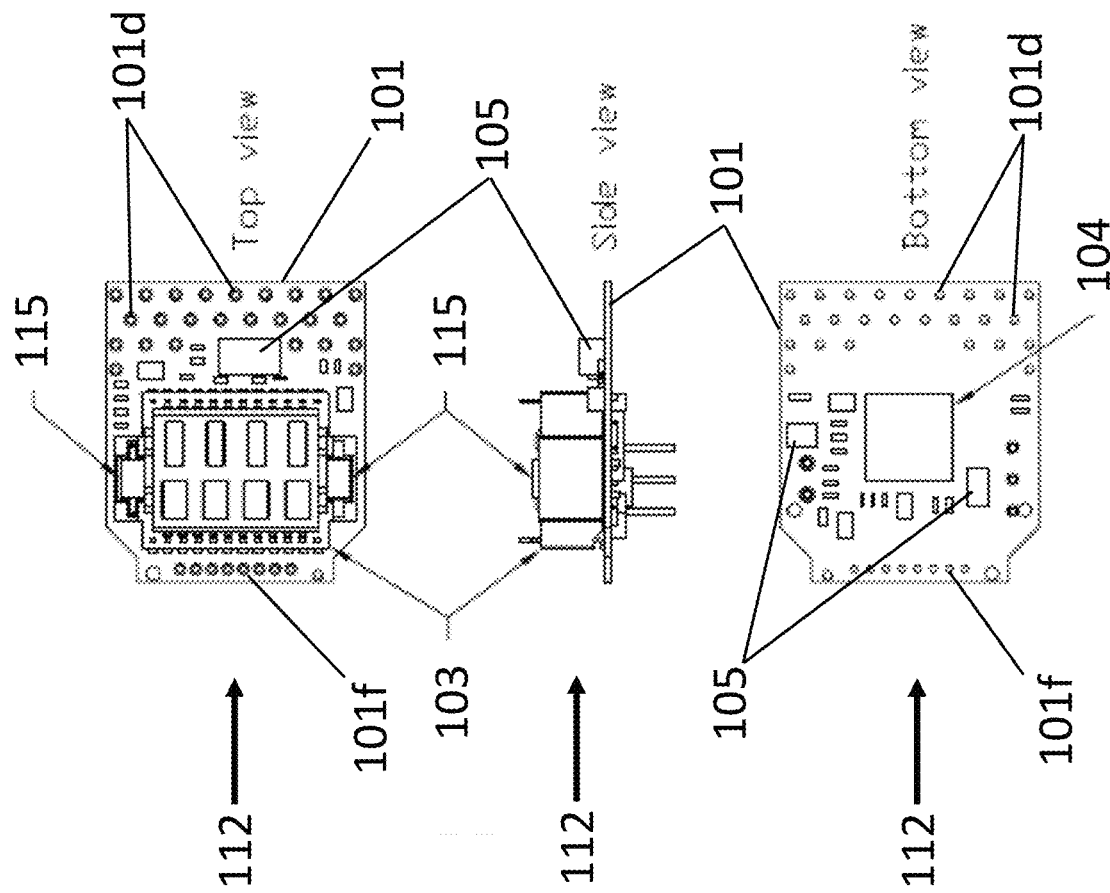

FIGS. 1D, 1E and 1F show respectively top, side and bottom views of part of the PCB assembly (112). In these views, the RJ-45 contacts assembly (113), solder tail (114), and top PCB (117) as shown in FIG. 1B, are omitted.

Referring to the top view of FIG. 1D, the baseboard (101) is shown with the Isolation Magnetics Module (103), additional electronic components (105), and LEDs (115), mounted on it. The vacant connectivity sites (101d) for the host interface are shown in the absence of the solder tail (114). In addition, the vacant connectivity sites/region (101f) for the RJ-45 connector (102) are shown in the absence of the RJ-45 contacts assembly (113), which connects via PCB traces to the Isolation Magnetics Module (103), as also shown in the connectivity region identified by the dotted area (1301f) in FIG. 13, and its associated description.

Referring to the side view of FIG. 1E, the baseboard (101) is shown with the Isolation Magnetics Module (103), additional electronic components (105), and LEDs (115), mounted on it.

Referring to the bottom view of FIG. 1F, the baseboard (101) is shown with the PHY chip (104) (shown in this view since it is soldered to the underside of the baseboard (101)), and additional electronic components (105) (soldered to both sides of the baseboard (101)), mounted on it. The vacant connectivity sites (101d) for the host interface are shown in the absence of the solder tail (114). In addition, the vacant connectivity sites/region (101f) for the RJ-45 connector (102) are shown in the absence of the RJ-45 contacts assembly (113), which connects via PCB traces to the Isolation Magnetics Module (103), as also shown in the connectivity region identified by the dotted area (1301f) in FIG. 13, and its associated description.

The prior art examples of FIG. 1A through FIG. 1F demonstrate an implementation for a 1000BASE-T (or 1GBASE-T) maximum data rate interface. However, as previously stated, as data rates increase, to 2.5GBASE-T, 5GBASE-T and 10GBASE-T, the design complexity challenges for both the network equipment designer and the PHY-ICM provider increase significantly across multiple fronts, such as, but not limited to, signal integrity, power supply noise, power consumption, EMI/RFI performance, and host system partitioning.

Figures 2A, 2B:
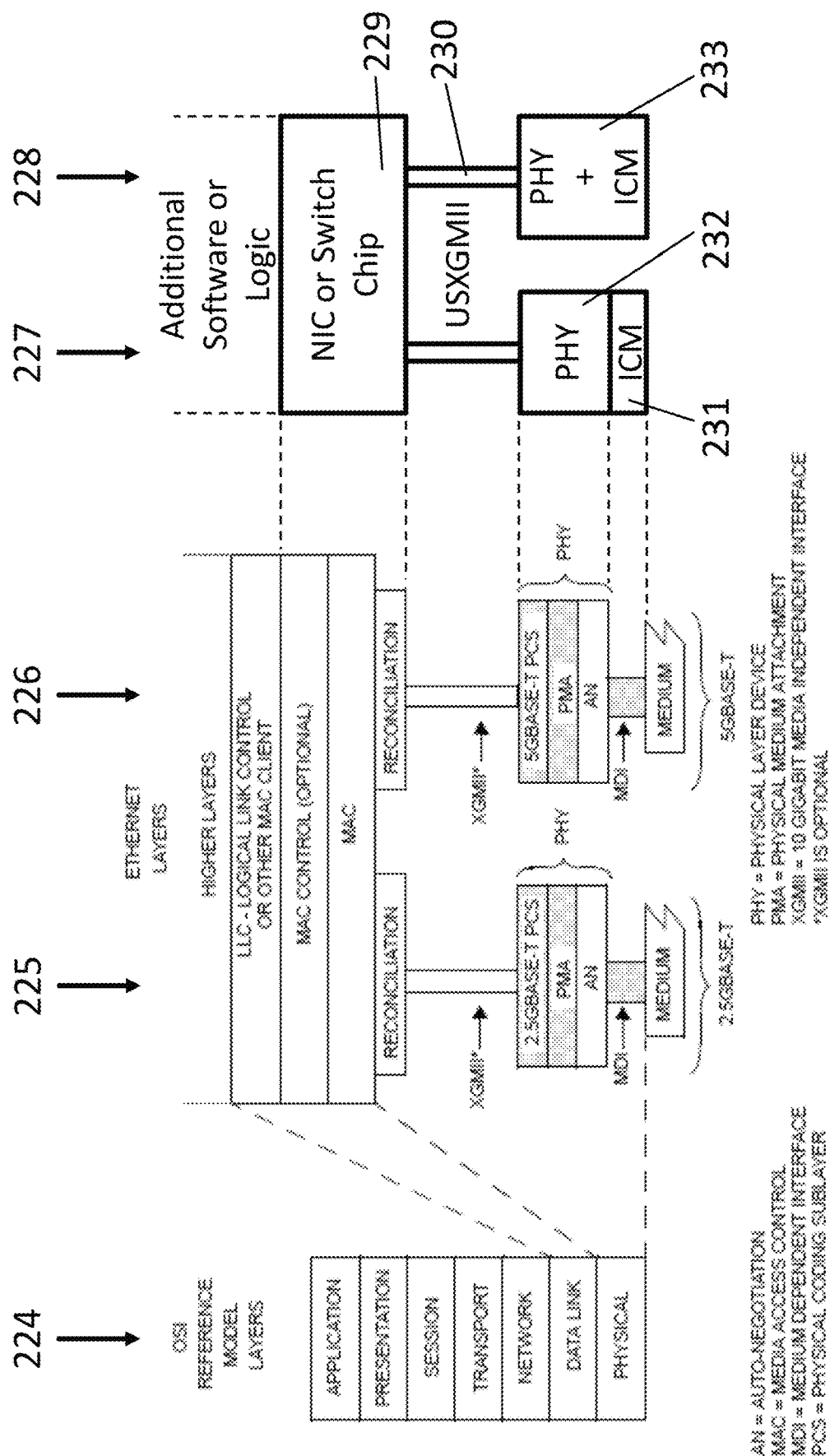
FIGS. 2A and 2B show respectively a hierarchical block diagram of the IEEE 802.3 layered architecture, and a simplified block diagram of a typical system application board architecture showing an ICM and a PHY-ICM and their relationship to the 802.3 reference model.

Referring to FIG. 2A and FIG. 2B, the definition, role and differences of the simple ICM (231) versus the more integrated PHY-ICM (233) are defined both in terms of the layered hierarchical model defined by IEEE 802.3, as well as in a practical implementation of a networking system product.

In FIG. 2A, the OSI Reference Model Layers (224) refer to the 7-layer hierarchy that the networking industry uses to describe the various functions in a networking device. The 802.3 Standards map the lower two layers, the Data Link Layer and the Physical Layer, into more detail as seen in the example for a 2.5GBASE-T (225) and 5GBASE-T (226) implementation. The 802.3 PHY device, as depicted in FIG. 2A, is typically implemented as a single chip semiconductor device, and integrates the Physical Coding Sublayer (PCS), the Physical Medium Attachment (PMA) and the Auto-Negotiation (A-N) functions, each of which incorporates features and attributes appropriate to the data rate and media type. The entire OSI 802.3 Physical Layer also includes the Medium Dependent Interface (MDI), which in this case is an RJ-45 connector, the Reconciliation Sublayer (RS, typically integrated into the MAC function of the Ethernet controller), and the 10 Gigabit Media Independent Interface (XGMII) layer, which may or may not physically exist in a practical implementation.

As depicted in FIG. 2B, an example of a practical implementation (227) of the discrete PHY function (232) and ICM (231) is shown. The host system application board, typically consisting of a software component operating on hardware such as a Network Interface Card (NIC) or switch chip (229), provides a system interface such as a Universal Serial 10 Gigabit Media Independent Interface (USXGMII) (230) which connects to the PHY function (232), implemented by a PHY chip and associated components. The discrete ICM (231) connects to the PHY function (232), but is a separate entity, and typically includes just the electrical isolation and the RJ-45 (the MDI). In the alternate example of a practical implementation (228), the integrated PHY-ICM (233) is shown. The host system application board, typically consisting of a software component operating on a NIC or switch chip (229), provides a system interface such as a USXGMII (230), which connects to the PHY-ICM (233). The PHY-ICM (233) integrates the functions of the physical layer interface appropriate to the media of choice, implemented by a PHY chip and associated components, and includes the electrical isolation and the RJ-45 connector. The PHY-ICM (233) may include one or more additional functions such as supply voltage regulation, memory, logic, temperature monitoring, or other functions. Typically, both the ICM (231) and PHY-ICM (233) are enclosed in a metal housing to further assist the communications equipment designer with minimizing radio frequency interference (RFI) and electro-magnetic interference (EMI) issues. The PHY-ICM (233) is logically equivalent to the preferred embodiments of the PHY-ICM (100) of FIG. 1A, and the PHY-ICM (1700) of FIG. 17A.

In FIG. 3 through FIG. 19, the innovative aspects of the design, implementation and construction of a modular PHY-ICM to scale across operating data rates of at least 2.5GBASE-T, 5GBASE-T and 10GBASE-T, are disclosed.

Figure 3:
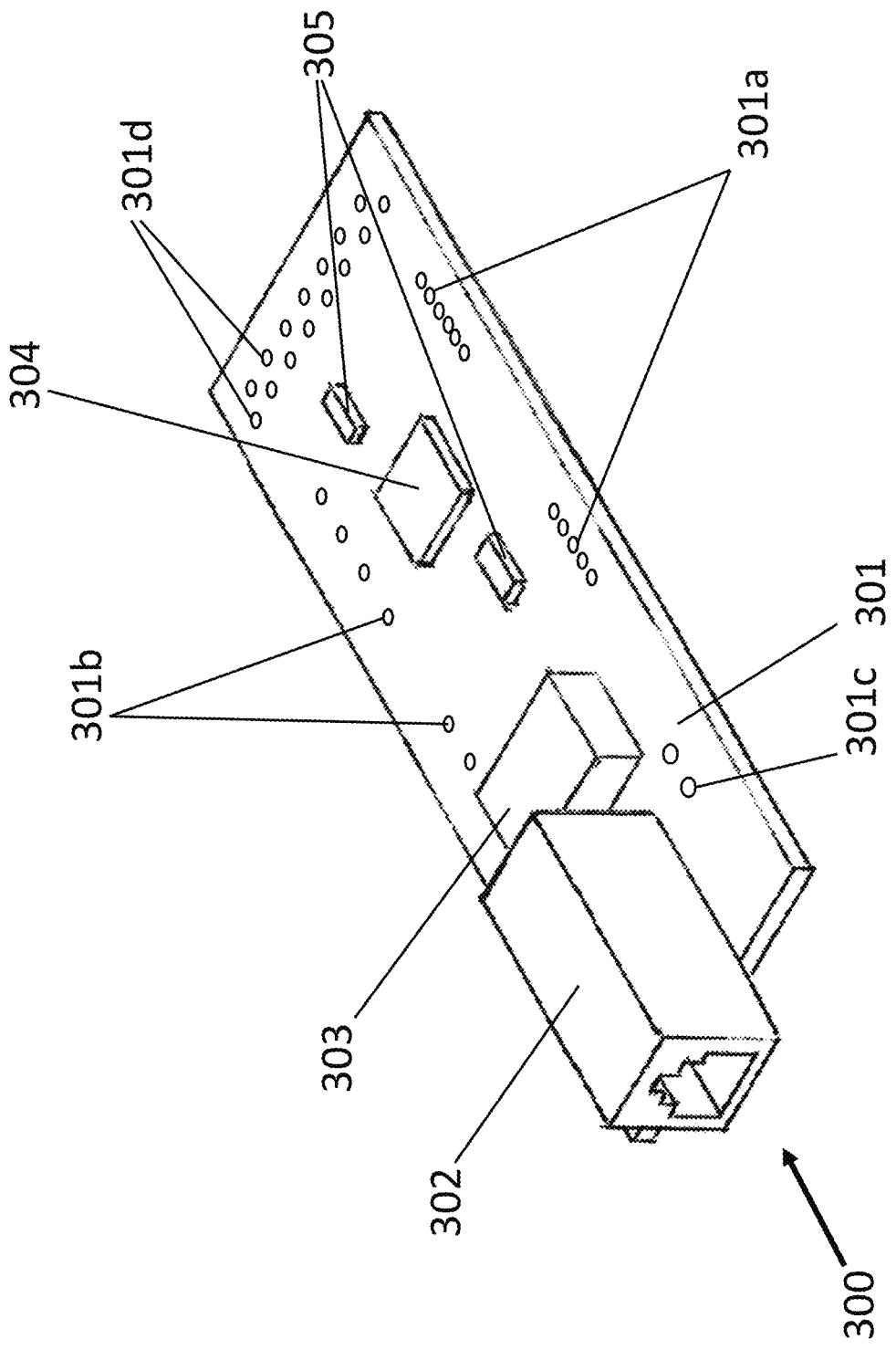
FIG. 3 is an illustrative example of a modular PHY-ICM baseboard assembly and the associated primary components mounted on the baseboard.

Referring to FIG. 3, an illustrative example of the physical representation of the modular PHY-ICM baseboard assembly (300) and the main component pieces of the preferred embodiment are shown, The PHY-ICM baseboard assembly (300) consists of the baseboard (301) PCB, which forms the mechanical and electrical platform on which the other main components parts of the PHY-ICM baseboard assembly (300) are attached, including the RJ-45 connector (302), Isolation Magnetics Module (303), PHY chip (304), and a plurality of additional electronic components (305). The baseboard (301) is optimally a 4-layer PCB, but may require a more advanced multilayer PCB fabrication technology, including the mounting of components on both sides of the PCB. However, any PCB or electrical carrier or substrate material or fabrication technology may be considered, and are both contemplated and obvious to one of ordinary skill in the art.

Electrical connection sites (301a and 301b) are present on baseboard (301) to allow for connection of one or more SIP modules (not shown). While the electrical connection site (301a) is shown as a row of 5 plus 6 through-hole positions separated by a space, and electrical connection site (301b) is shown as a row of 2 plus 4 through-hole positions separated by a space, these are intended as non-limiting examples, and any number, position, spacing or technology for connectivity of SIP modules is both contemplated and fully anticipated. Additionally, electrical connection sites (301c and 301d) are present on baseboard (301) to allow for connections between the PHY-ICM baseboard assembly (300) and a system application board (not shown), which are similarly shown as non-limiting examples. Typically, the electrical connection site (301d) at the rear of the PHY-ICM is integrated into a "solder tail" (114), previously shown in more detail in the prior art of FIG. 1C.

The RJ-45 connector (302) is an 8-pin modular connector, also referred to as an 8P8C (8 pin, 8 contact) connector, specified by IEEE 802.3 (see for example, IEEE Std 802.3bz-2016, Clause 126.8.1 MDI connectors) and well known to those of ordinary skill in the networking industry. RJ-45 connector (302) allows the Category 5 (Cat-5) or Category-6 (Cat-6) cable (not shown) to be plugged-in using a corresponding RJ-45 plug (as shown in FIG. 1A), to carry the communications signals and optional power between the two network devices at either end of the cable. The 8 spring loaded pins of the RJ-45 connector (302) connect to 8 individual PCB connections under the RJ-45 connector (302) which connect to corresponding contact sites on the baseboard (301).

While the RJ-45 connector (302) is shown as a discrete connector for simplicity, this is intended as a non-limiting example, and other form factors and/or constructions are both obvious and anticipated. More typically, the RJ-45 connector (302) would be constructed from several different sub-assemblies to better integrate with the PHY-ICM form factor, and would incorporate one or two built-in LEDs (not shown for simplicity) such that the status of the associated networking port can be readily viewed from the exterior of the networking equipment, as outlined in FIG. 1B and FIG. 1C, and their associated descriptions.

The Isolation Magnetics Module (303) provides a DC isolation barrier between the signals present on the network cable and those permitted on the baseboard (301), for safety reasons well known to those of ordinary skill in the art. The Isolation Magnetics Module (303) may contain additional functionality such as signal filtering and conditioning that may be necessary to meet specific national or international government EMI/RFI regulatory approvals. Additional detail regarding the modifications to the Isolation Magnetics Module (303) and associated signal conditioning are disclosed in FIG. 14 and FIG. 15 and their accompanying descriptions.

The PHY chip (304) is typically soldered to the baseboard (301) PCB using an appropriate manufacturing technology according to the construction type of the baseboard (301). The PHY chip (304) will typically have a significant number of connections to the baseboard (301) to provide for the various signals in and out of the device as well as connectivity to the components necessary to configure and/or program it appropriately. In one exemplary embodiment of a suitable PHY chip is the AQR112C, manufactured and sold by Aquantia Corp., which is offered in a 64 pin Ball Grid Array (BGA) package. The AQR112C has several modes of operation, such as, but not limited to, 2.5GBASE-T, 5GBASE-T and 10BASE-T. This device is factory programmed to operate at a maximum data rate, which allows support for data rates below that, but not above. For instance, a 5GBASE-T part will not be capable of operation at 10GBASE-T, but will support operation at 10BASE-T, 100BASE-T, 1000BASE-T, 2.5GBASE-T and 5GBASE-T. Typically, a PHY-ICM based on a PHY chip such as the AQR112C would not be a targeted for 1000BASE-T (or lower) data rate implementations, since there are numerous solutions that are far more cost effective for those data rates. However, the lower data rates are offered for legacy backwards compatibility reasons. In other exemplary embodiments of suitable PHY chips, the family of Aquantia devices include the AQR113C, the AQR114C, and the AQR115C. In one packaging version of the devices, they are offered in a 64 pin Ball Grid Array (BGA) package that is pin compatible with the AQR112C. The AQR113C supports a maximum operation at 2.5GBASE-T, including operation at 10BASE-T, 100BASE-T and 1000BASE-T. The AQR114C supports a maximum operation at 5GBASE-T, including operation at 10BASE-T, 100BASE-T, 1000BASE-T and 2.5GBASE-T. The AQR115C supports a maximum operation at 10GBASE-T, including operation at 10BASE-T, 100BASE-T, 1000BASE-T, 2.5GBASE-T and 5GBASE-T.

The plurality of additional electronic components (305) represent some of the physical components necessary to electrically configure the PHY chip (304) and operate the overall circuitry of the PHY-ICM correctly. Although shown simplistically in FIG. 3A, there would typically be a significant number of additional electronic components (305) including but not limited to, passive components such as resistors, capacitors, inductors, diodes and crystal oscillators, as well as active semiconductor components such as power regulation devices, logic, memory and transistors. By way of example, a preferred PHY-ICM embodiment utilizing the AQR112C requires that tightly controlled supply voltages at substantial currents are provisioned, and may require that Flash memory is attached to the PHY chip. Either of these requirements can be met by placing the associated voltage regulators and/or Flash memory either inside or outside the PHY-ICM. Hence a solution is required that has the flexibility to address either option while still maintaining a low overall cost structure and minimizing the number of different parts to be manufactured and assembled.

Figure 4:
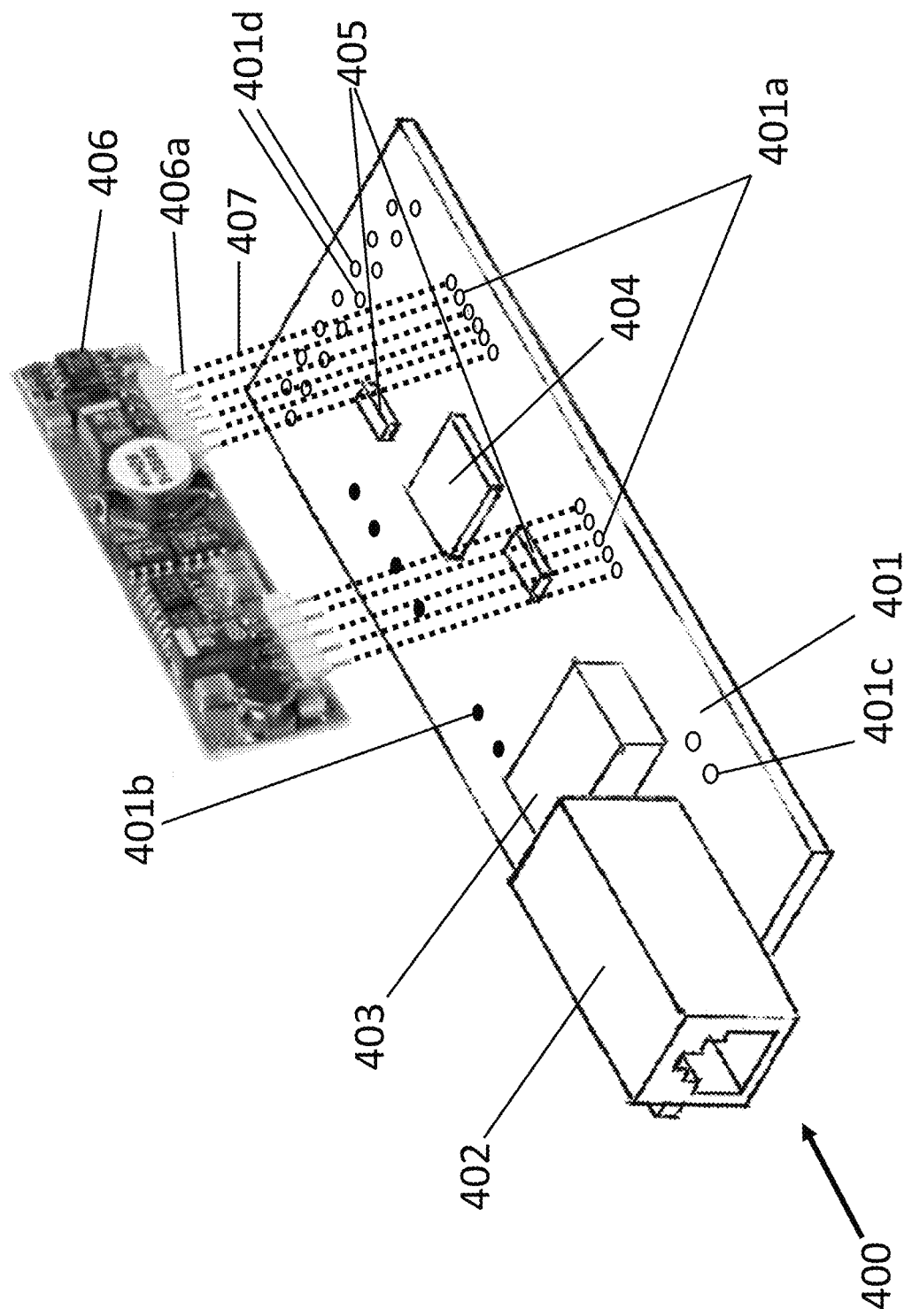
FIG. 4 shows an illustrative example of a first SIP module and its positional relationship to the PHY-ICM baseboard.

Referring to FIG. 4, an illustrative example of the physical representation of the modular PHY-ICM baseboard assembly (400) and the main component parts of the preferred embodiment are shown, including a SIP Module (406). The SIP Module (406) in this embodiment is shown with connector pins (406a) which are designed to allow for its electrical connection to the corresponding electrical connection sites (401a) present on baseboard (401), as shown by the dotted lines (407). Other components parts of the PHY-ICM baseboard assembly (400) are shown soldered to the baseboard (401) including the RJ-45 connector (402), Isolation Magnetics Module (403), PHY chip (404), and the plurality of additional electronic components (405). Electrical connection sites (401b) are present on baseboard (401) to allow for connection of an additional SIP module (not shown). Additionally, electrical connection sites (401c and 401d) are present on baseboard (401) to allow for connections between the PHY-ICM assembly (400) and a system application board (not shown).

Figure 5:
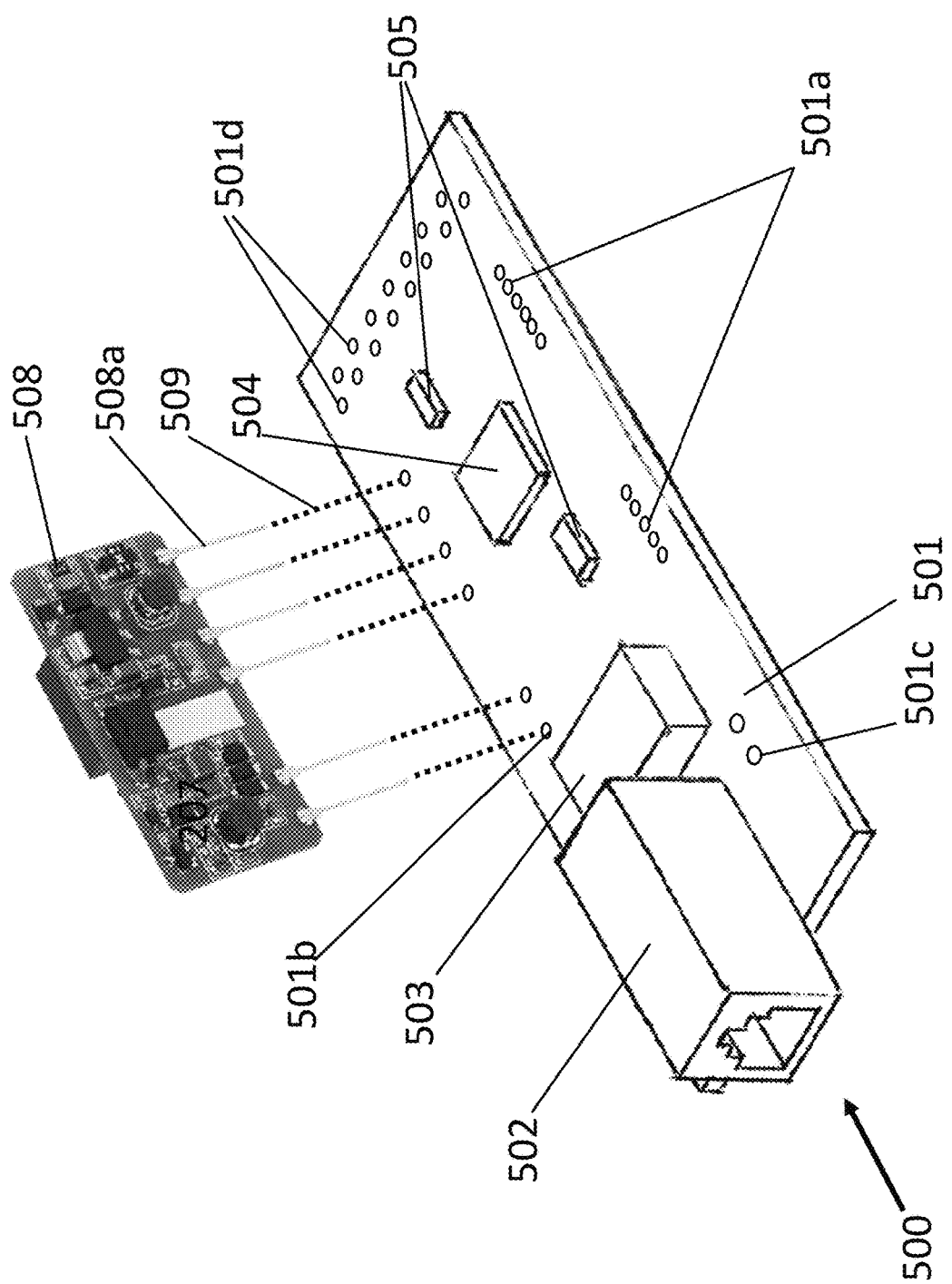
FIG. 5 shows an illustrative example of a second SIP module and its positional relationship to the PHY-ICM baseboard.

Referring to FIG. 5, an illustrative example of the physical representation of the modular PHY-ICM baseboard assembly (500) and the main component parts of the preferred embodiment are shown, including a SIP Module (508). The SIP Module (508) in this embodiment is shown with connector pins (508a) which are designed to allow for its electrical connection to the corresponding electrical connection sites (501b) present on baseboard (501), as shown by the dotted lines (509). Other components parts of the PHY-ICM baseboard assembly (500) are shown soldered to the baseboard (501) including the RJ-45 connector (502), Isolation Magnetics Module (503), PHY chip (504), and the plurality of additional electronic components (505). Electrical connection sites (501a) are present on baseboard (501) to allow for connection of an additional SIP module (not shown). Additionally, electrical connection sites (501c and 501d) are present on baseboard (501) to allow for connections between the PHY-ICM assembly (500) and a system application board (not shown).

Figure 6:
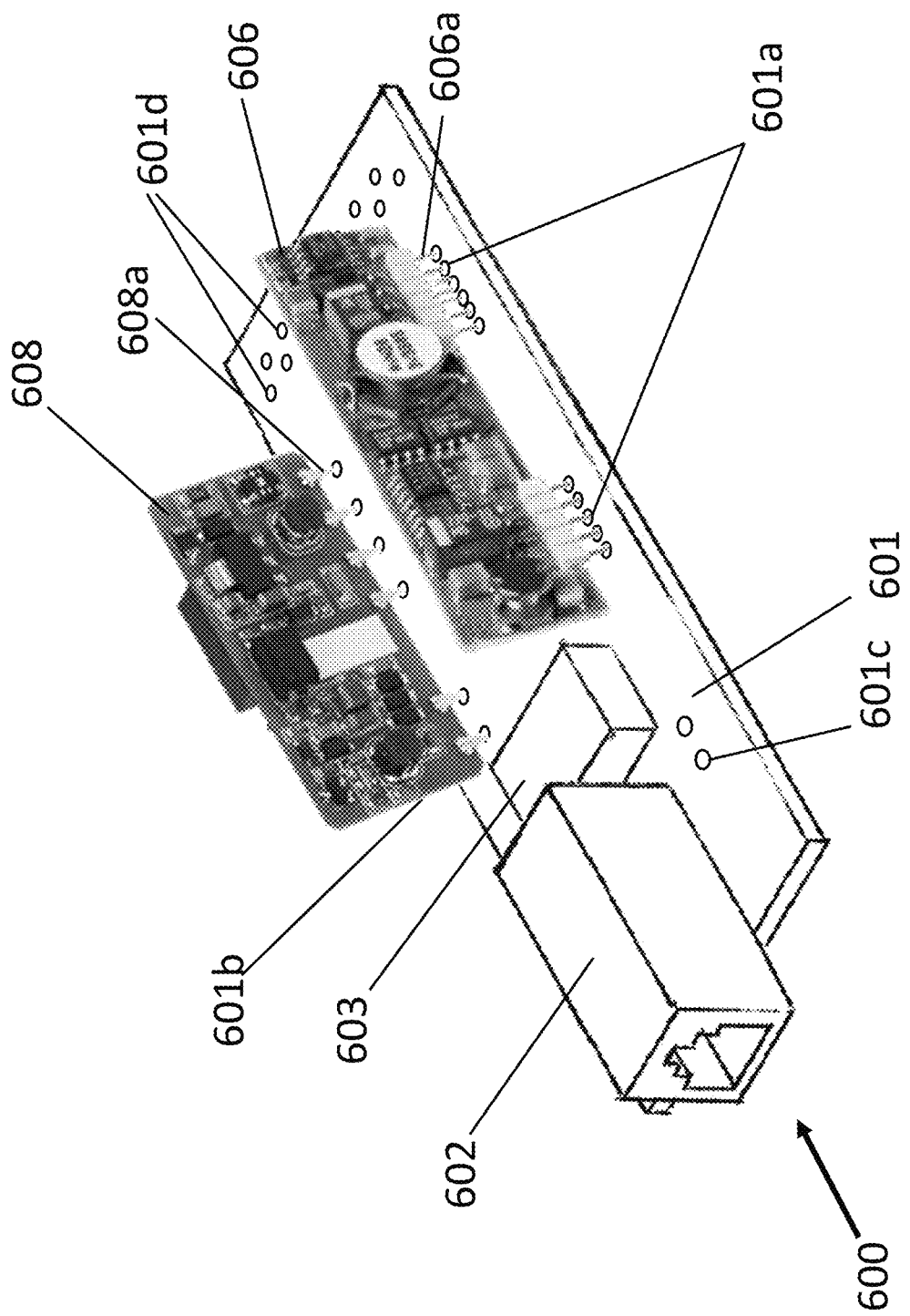
FIG. 6 shows an illustrative example of a first SIP module together with a second SIP module, and their mechanical mounting to the PHY-ICM baseboard.

Referring to FIG. 6, an illustrative example of the physical representation of the modular PHY-ICM baseboard assembly (600) and the main component parts of the preferred embodiment are shown, including a first SIP Module (606) and a second SIP Module (608). The first SIP Module (606) is shown with electrical connector pins (606a), mating directly with the corresponding electrical connection sites (601a) present on the baseboard (601). The second SIP Module (608) is shown with electrical connector pins (608a), mating directly with corresponding electrical connection sites (601b) present on the baseboard (601). Other components parts of the PHY-ICM baseboard assembly (600) are shown soldered to the baseboard (601) including the RJ-45 connector (602), Isolation Magnetics Module (603), PHY chip (604) (obscured behind SIP Module (606), but previously shown disposed as 404 in FIG. 4, and 504 in FIG. 5), and a plurality of additional electronic components (605). Additionally, electrical connection sites (601c and 601d) are present on baseboard (601) to allow for the connection of the PHY-ICM baseboard assembly (600) and a system application board (not shown). Typically, the electrical connection sites (601d) at the rear of the baseboard (601) are populated by a "solder tail" (not shown, see 114 in the prior art of FIG. 1C, or 1714 in the preferred embodiment of FIG. 17C, for additional detail) where the pins that form the host interface to the system application board are held captive Referring to FIG. 7A, a simplified block diagram of the primary components and circuit blocks and their interconnection for a modular PHY-ICM (700) are shown. The baseboard (701) provides the mechanical and PCB electrical interconnect between each of the components and/or circuit blocks. The host interface footprint consists of multiple connections, including the host interface connectivity region (701m), the majority of which are connected directly to/from the PHY I.C. (704). The host interface connectivity region (701m) essentially consists of the common set of baseline host interface functions, intended to be largely (although not mandatorily) present for all PHY-ICMs in a particular family. These include the plurality of signals for transmit/receive data (DATA IN/OUT, 741), control (CNTRL IN/OUT, 742), management data (MNGMNT IN/OUT, 743), clocking and synchronization (CLK IN/OUT, 744), test and debug (JTAG/DEBUG, 745), and configuration (CONFIG IN/OUT, 748).

Configuration signals (748) are also optionally connected between the host interface connectivity region (701m), the SIP Personality Module (706) and/or the PHY I.C. (704), although not all signal paths may exist in a specific implementation. The power input (POWER IN, 746) is passed via the SIP Power Module (708) which is connected (via 747) to the PHY I.C. (704) as well as other components on the baseboard (701).

On the Network Interface side of the PHY-ICM (700), network data to/from the PHY I.C. (704) is signaled over four bi-directional differential pairs (749) to/from the Isolation Magnetics Module (703) and again via bi-directional differential pairs (751) to/from the RJ-45 connector (702). LED signals (LEDs OUT, 752) are driven by the PHY I.C. (704) to indicate the status of the network connection, and LEDs (not shown) may be optionally mounted within and electrically connected to additional pins on the RJ-45 connector (702). Alternatively, the LEDs may be mounted on the baseboard and use a light pipe (116, 1716) technology to allow the light to be transferred to the front of the RJ-45 connector (702), as shown in detail in the prior art of FIGS. 1C and 1n the preferred embodiment of FIG. 17C.

PoE power (PoE IN/OUT, 750) is either injected into or drawn from the contact sites in electrical connection region (701p), which are connected to the transformer center taps (not shown, see 15122, 15125, 15128 and 15131, in FIG. 15 and its accompanying description for additional detail) of the Network Interface side of the Isolation Magnetics Module (703). While the PoE power (PoE IN/OUT, 750) is also shown optionally extended from the electrical connection region (701p), via the dotted connection (PoE IN/OUT, 740) to the host interface side of the PHY-ICM (700), typically the host interface connections for PoE are located physically close to the Isolation Magnetics Module (703), to avoid running high power traces across the length of the baseboard (701). The PHY-ICM, when configured for PoE operation, is equally applicable to either a PSE or PD applications.

In a preferred embodiment utilizing the Aquantia AQR112C chip for instance, the transmit/receive data (DATA IN/OUT, 741) is passed over dedicated transmit and receive data lanes using serializer/deserializer (SerDes) interfaces which operate under the USXGMII protocol using a 64B/66B coding scheme at up to 10.3125 GHz, well known to those of skill in the art. Management data (MNGMNT IN/OUT, 743) is also provided via a well-defined and known interface using a management data clock (MDC) signal sourced from the host interface, and a bi-directional management data input/output (MDIO) signal which transports read/write data from/to the PHY chip (704), synchronous with the MDC signal.

Figure 7A:
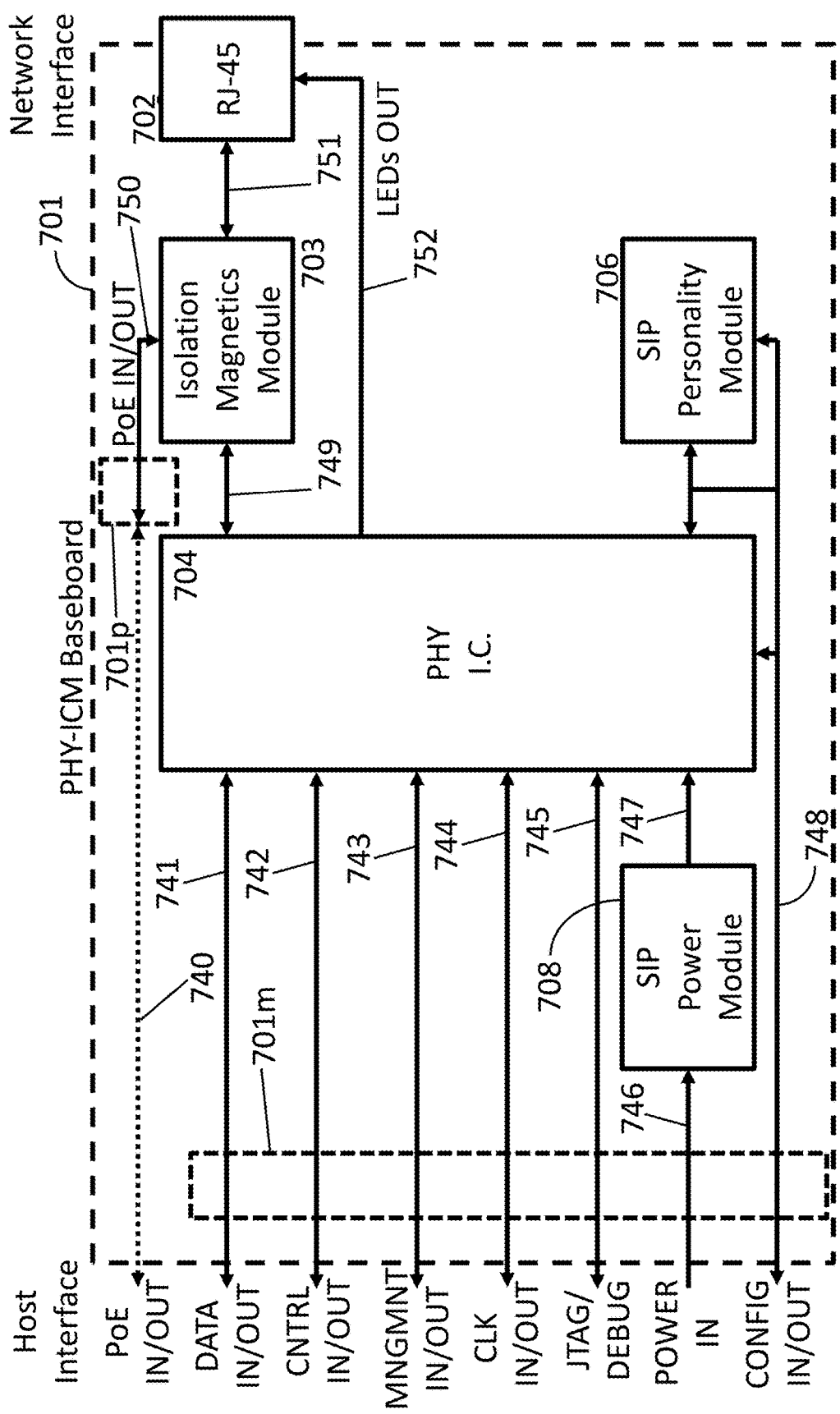
FIGS. 7A, 7B and 7C are illustrative block diagrams of the primary electronic components of the modular PHY-ICM and their interconnections, for different PHY chip devices.
Figure 7B:
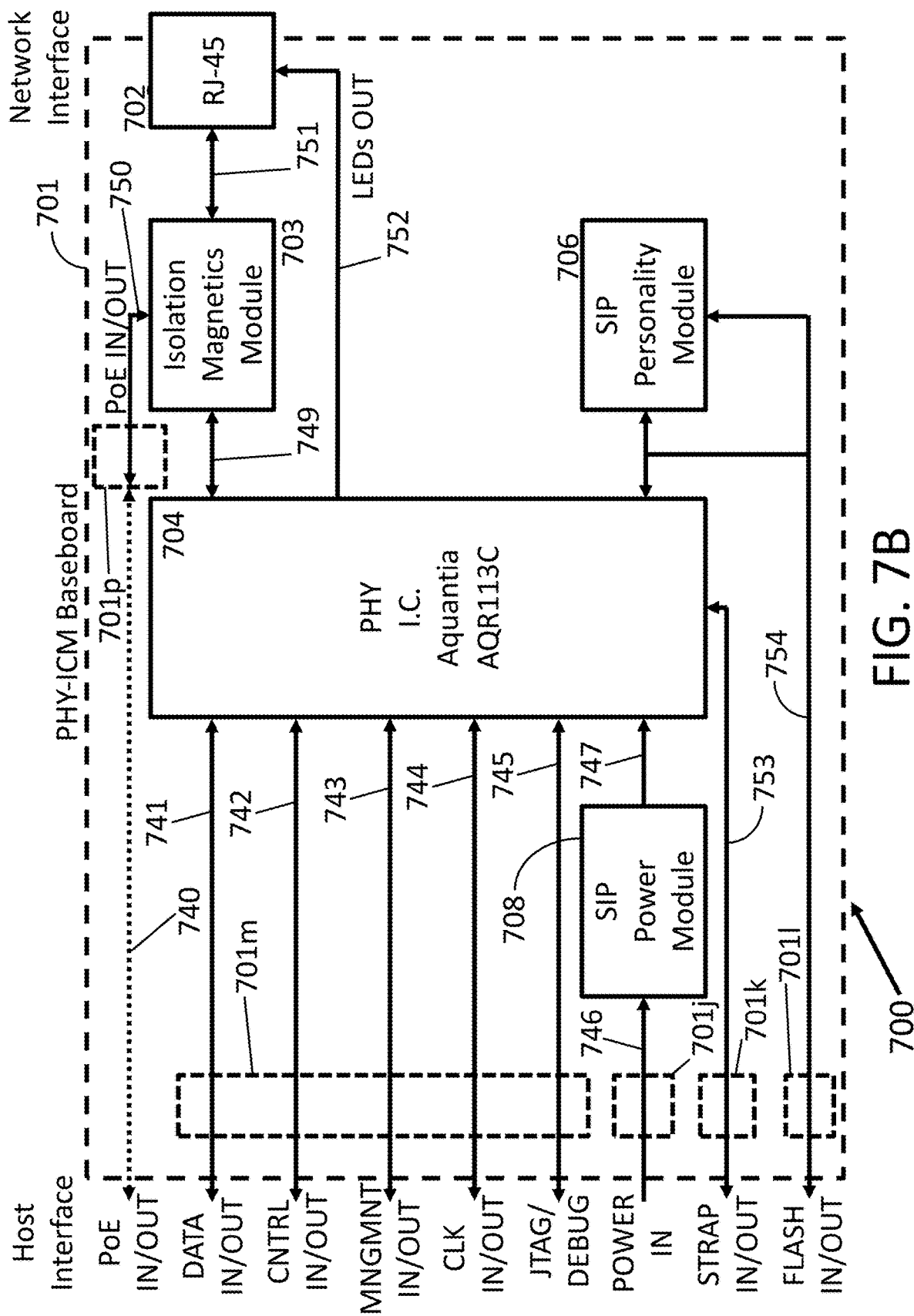

Referring to FIG. 7B, a simplified block diagram of the primary components and circuit blocks and their interconnection for a modular PHY-ICM (700) are shown. In this alternate preferred embodiment, an Aquantia AQR113C chip is utilized. The Aquantia AQR113C chip is a more recent version of the previous AQR112C, and a member of the family of devices including the AQR113C, the AQR114C, and the AQR115C. The AQR113/4/5C devices are completely pin compatible with the original AQR112C chip, with the exception of the power input voltages that are required to be provided by the SIP Power Module (708). The SIP Power Module (708) which is connected (via 747) to the PHY I.C., converts from the external host supply (POWER IN, 746) into the appropriate power supplies for the PHY chip (704). The AQR112C device of FIG. 7A requires three separate supply voltages of 2.0 V, 1.2 V and 0.85 V, but the family of AQR113/4/5C devices of FIG. 7B require voltages of 2.0 V, 1.0 V and 0.70 V. This clearly demonstrates the flexibility of this design approach, since an identical baseboard (701) can be utilized for all of the Aquatia AQR112C and the AQR113/4/5C chips, with an appropriate SIP Power Module (708) that can be changed or modified to match the PHY chip (704) as appropriate.

The block diagrams of FIGS. 7A and 7B are essentially identical in respect of the host interface, except in the case of FIG. 7B, the multiple connections are separated into different connectivity regions (701*j*, 701*k*, 701*l* and 701*m*). In FIG. 7B, the majority of the connections are directly to/from the PHY I.C. (704), in the host interface connectivity region (701*m*), which consists of the common set of baseline host interface functions, intended to be largely (although not mandatorily) present for all PHY-ICMs in a particular family. These include the plurality of signals for transmit/receive data (DATA IN/OUT, 741), control (CNTRL IN/OUT, 742), management data (MNGMNT IN/OUT, 743), clocking and synchronization (CLK IN/OUT, 744), test and debug (JTAG/DEBUG, 745), which are segregated into the connectivity region (701*m*).

The external host supply (POWER IN, 746) is segregated into a separate connectivity region (701*j*) and is connected to the SIP Power Module (708). The SIP Power Module (708) which is connected (via 747) to the PHY I.C., converts from the external host supply (POWER IN, 746) into the appropriate power supplies for the PHY chip (704). as well as other components on the baseboard (701).

In FIG. 7A, configuration signals (748) are connected between the host interface connectivity region (701*m*), the SIP Personality Module (706) and/or the PHY I.C. (704), In the case of FIG. 7B, these are broken out into the PHY chip (704) strapping signals (STRAP IN/OUT, 753) on a separate connectivity region (701*k*) for the AQR113/4/5C options, and the Flash interface (FLASH IN/OUT, 754) to/from the SIP Personality Module (706) and the PHY chip (704) is on a separate connectivity region (701*l*).

Figure 7C:
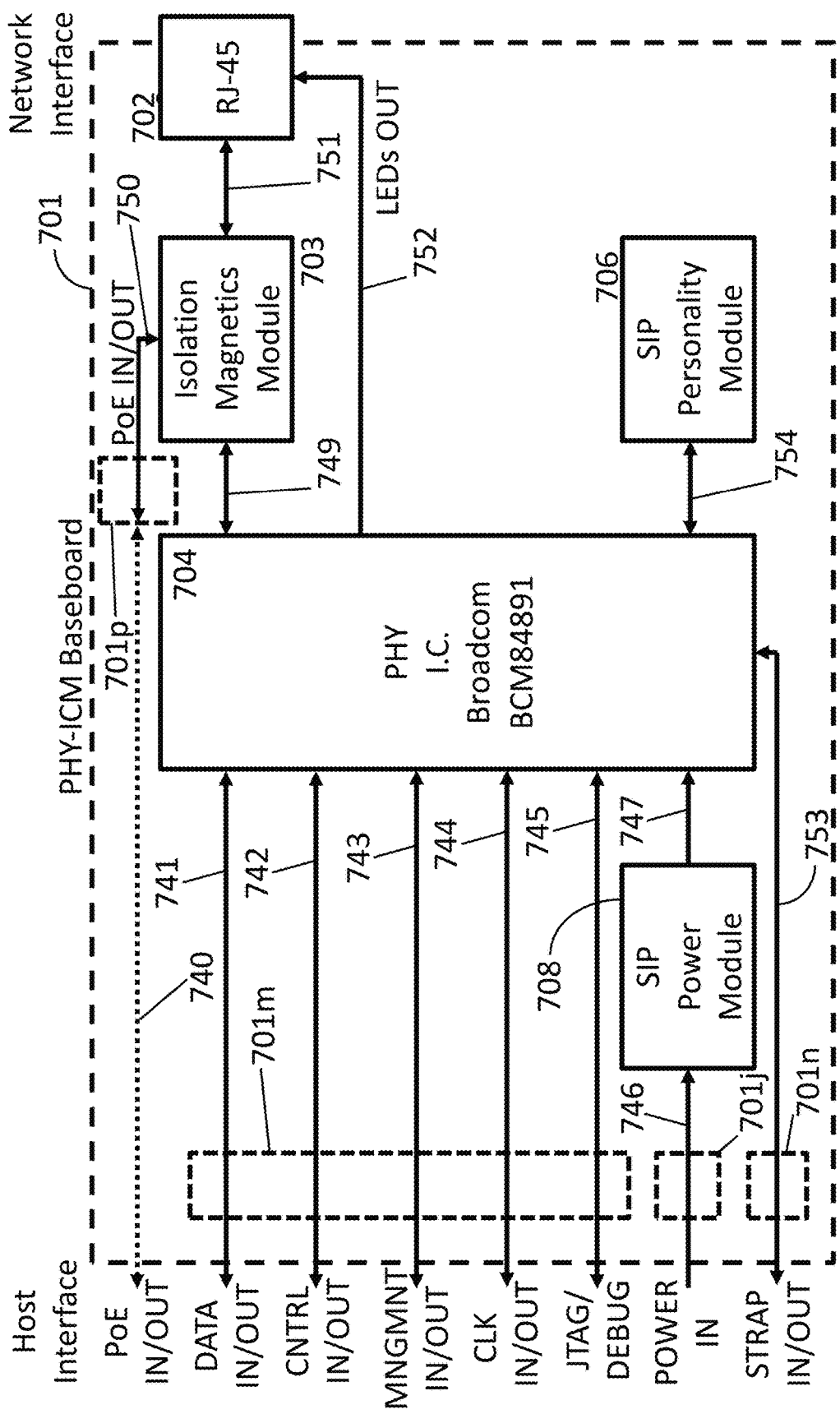

Referring to FIG. 7C, a simplified block diagram of the primary components and circuit blocks and their interconnection for a modular PHY-ICM (700) are shown. In this alternate preferred embodiment, a Broadcom BCM84891 chip is utilized. The Broadcom BCM84891 has a completely different pin out, and is not compatible to the AQR113/4/5C chips, which requires a different baseboard (701) design. However, the Broadcom BCM84891 provides the similar functionality for a 1/2.5/5/10GBASE-T device. The SIP Power Module (708) which is connected (via 747) to the PHY I.C., converts from the external host supply (POWER IN, 746) into the appropriate power supplies for the PHY chip (704). The BCM84891 device of FIG. 7C requires two separate supply voltages of 1.88 V and 0.80 V. This clearly demonstrates the flexibility of this design approach, since an appropriate baseboard (701), SIP Power Module (708), and SIP Personality Module (706), can be changed or modified to match the PHY chip (704) as appropriate, while maintaining the same PHY-ICM (700) compatible host interface footprint.

The block diagrams of FIGS. 7A and 7C are essentially identical in respect of the host interface, except in the case of FIG. 7C, the multiple connections are separated into different connectivity regions (701*j*, 701*m* and 701*n*). In FIG. 7C, the majority of the connections are directly to/from the PHY I.C. (704), in the host interface connectivity region (701*m*), which consists of the common set of baseline host interface functions, intended to be largely (although not mandatorily) present for all PHY-ICMs in a particular family. These include the plurality of signals for transmit/receive data (DATA IN/OUT, 741), control (CNTRL IN/OUT, 742), management data (MNGMNT IN/OUT, 743), clocking and synchronization (CLK IN/OUT, 744), test and debug (JTAG/DEBUG, 745), which are segregated into the connectivity region (701*m*).

The external host supply (POWER IN, 746) is segregated into a separate connectivity region (701*j*) and is connected to the SIP Power Module (708). The SIP Power Module (708) which is connected (via 747) to the PHY I.C., converts from the external host supply (POWER IN, 746) into the appropriate power supplies for the PHY chip (704). as well as other components on the baseboard (701).

In FIG. 7C the PHY chip (704) strapping signals (STRAP IN/OUT, 753) are on a separate connectivity region (701*n*) for the BCM84891 options, and the Flash interface (FLASH IN/OUT, 754) to/from the SIP Personality Module (706) and the PHY chip (704) is not connected to an external connectivity region.

In FIGS. 7A, 7B and 7C, the Isolation Magnetics Module (703) provides the identical functions, and is selected to exhibit the appropriate isolation, RFI/EMI emissions, induced noise and PoE support. Where applicability, PoE power (PoE IN/OUT, 750) is either injected into or drawn from the contact sites in electrical connection region (701*p*), The PoE power (PoE IN/OUT, 750) is also shown optionally extended from the electrical connection region (701*p*), via the dotted connection (PoE IN/OUT, 740) to the host interface side of the PHY-ICM (700), It should be noted in FIGS. 7A, 7B and 7C, that any connectivity regions (701*j*, 701*k*, 701*l*, 701*m*, 701*n*) are not mandatory for all applications, that they may be mutually segregated or joined or integrated, and can be fully populated or de-populated to customize the members of the family of PHY-ICM (700) implementations.

Figure 8:
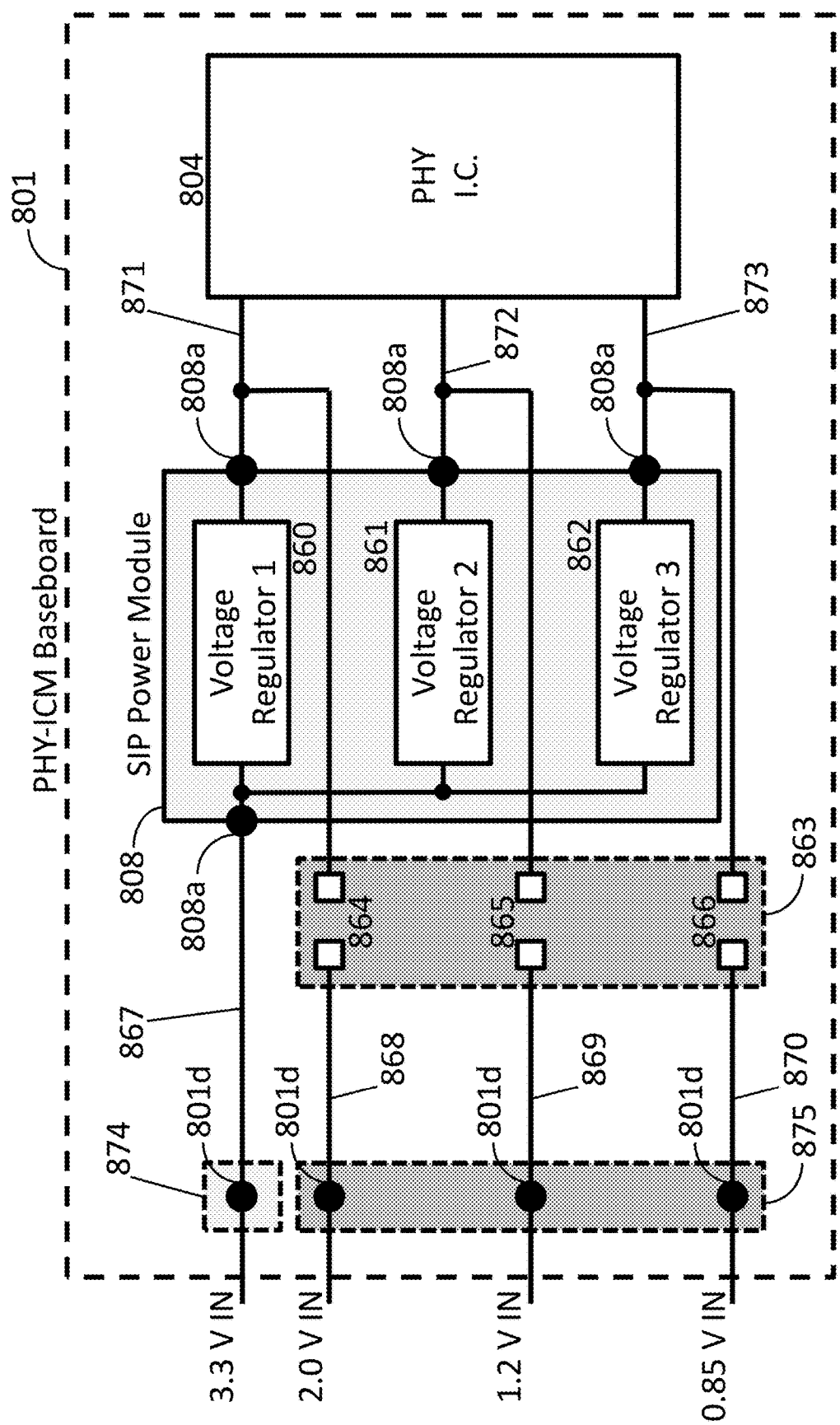
FIG. 8 is an illustrative block diagram of one method of electrical connectivity between a PHY-ICM baseboard and a SIP Power Module and the electrical/electronic hardware incorporated in a SIP Power Module.

Referring to FIG. 8, a preferred embodiment of a SIP Power Module (808) and its connectivity options between the host interface, the PHY-ICM baseboard (801) and the PHY I.C. (804) are shown.

In this preferred embodiment, the SIP Power Module (808) generates the required voltages for operation of the PHY I.C. (804) and other circuitry of the baseboard (801). In an example embodiment in FIG. 7A, using the Aquantia AQR112C as the PHY I.C. (804) for instance, three separate supply voltages of 2.0 V, 1.2 V and 0.85 V are required. Other input/output (I/O) pins of the PHY chip (104) can also be programmed to operate at 3.3 V or 1.8 V. While the system application board may provide some or all of these supply voltages, it is often costly or inconvenient to provide these multiple supply voltages at the required current level, while maintaining the rigorous noise and ripple specifications required by the PHY I.C. (804). Failure to adhere to these power supply specifications, such as excess power supply ripple, can lead to the inability of the PHY chip (804) to perform to IEEE 802.3 specifications or other regulatory requirements, causing effects such as the inability to maintain the required BER, or the generation of extraneous system level noise or interference.

FIG. 8 shows one preferred embodiment where each of the required voltages for the PHY I.C. (804) and/or baseboard (801) components can be generated from a single 3.3 V IN supply provided by the host system, or alternatively the individual voltages can be supplied by the host system. PHY-ICM baseboard (801) provides multiple connection sites (801*d*) in two groups (874, 875). The 3.3 VIN supply line (867) from the host system is connected to the SIP Power Module (808) where it is connected to the inputs of Voltage Regulator 1 (860), Voltage Regulator 2 (861) and Voltage Regulator 3 (862). Voltage Regulator 1 (860) generates 2.0 V which is fed to the PHY I.C. (804) and is also connected (871) to one connection site (864) in the jumper bank (863) located on the baseboard (801). Voltage Regulator 2 (861) generates 1.2 V which is fed to the PHY I.C. (804) and is also connected (872) to one connection site (865) in the jumper bank (863) located on the baseboard (801). Voltage Regulator 3 (862) generates 0.85 V which is fed to the PHY I.C. (804) and is also connected (873) to one connection site (866) in the jumper bank (863) on the baseboard (801).

One of ordinary skill would recognize that the various voltage outputs (871, 872 and 873), as well as the 3.3 V IN (867) may also be connected to other components (not shown) on the baseboard (801). In addition, the output voltages are exemplary in terms of the preferred embodiment, but any appropriate voltage required by the PHY-ICM circuits could be generated. Further, Voltage Regulators (871, 872 and 873) would typically require additional external components (not shown for simplicity) to configure specific parameters and/or for power supply noise/ripple filtering, and may be programmable in nature such that their output voltage and/or current can be configured to specific levels.

With the SIP Power Module (808) present, and shorting links in the jumper bank (863) absent on the three connection sites (864, 865, and 866), power is provided to the baseboard (801) via a first connection group (874) through the connection site (801*d*), and powers the entire PHY-ICM through a single 3.3 VIN (867) supply line.

With the SIP Power Module (808) absent, and shorting links in the jumper bank (863) present on the three connection sites (864, 865, and 866), power is provided to the baseboard (801) via a second connection group (875) through the connection sites (801*d*), and powers the entire PHY-ICM through separate dedicated 2.0 V (868), 1.2 V (869) and 0.85 V (870) supply lines.

Hence, by either inserting the SIP Power Module (808), or the shorting links on the three connection sites (864, 865, 866) of the jumper bank (863) at assembly time, the choice can be made of whether the PHY-ICM is powered externally from a single 3.3 V supply using the internal Voltage Regulators 1, 2, and 3 (860, 861, and 862), or separate power supplies are used from the host interface to power the PHY-ICM. All the connection sites (801*d*) on the two host interface connector groups (874, 875), and the connection sites (808*a*) on the SIP Power Module (808), can be present in either case, as denoted by their solid black infill.

In the preferred embodiment of FIG. 8, the system designer is afforded the option to provide a single, relaxed specification 3.3 V input supply, instead of three very tightly specified input voltages, each of which may fluctuate in power draw requirements due to worst case conditions such as, but not limited to, the operation of the desired network data rate.

One of ordinary skill would recognize that any one or more of the Voltage Regulators 1, 2, or 3 (860, 861, or 862), or corresponding shorting links on the three connection sites (864, 865, 866) of the jumper bank (863), may optionally be absent or present in a particular implementation, so that any combination of power supplies that may be available from the host system may be used to power the PHY-ICM baseboard (801).

Further, it would be recognized that a SIP Power Module may be designed provide fixed or flexible or power supply outputs. For instance, each SIP Power Module design may be implemented using voltage regulator circuits that are specific to the power requirement of a particular PHY chip or mode. In an alternate embodiment, utilizing programmable voltage regulators, the same SIP Power Module design may be re-configured to allow the voltage and/or current outputs to be optimized to suit multiple different output power requirements, each one suiting a particular PHY chip or mode.

Figure 9:
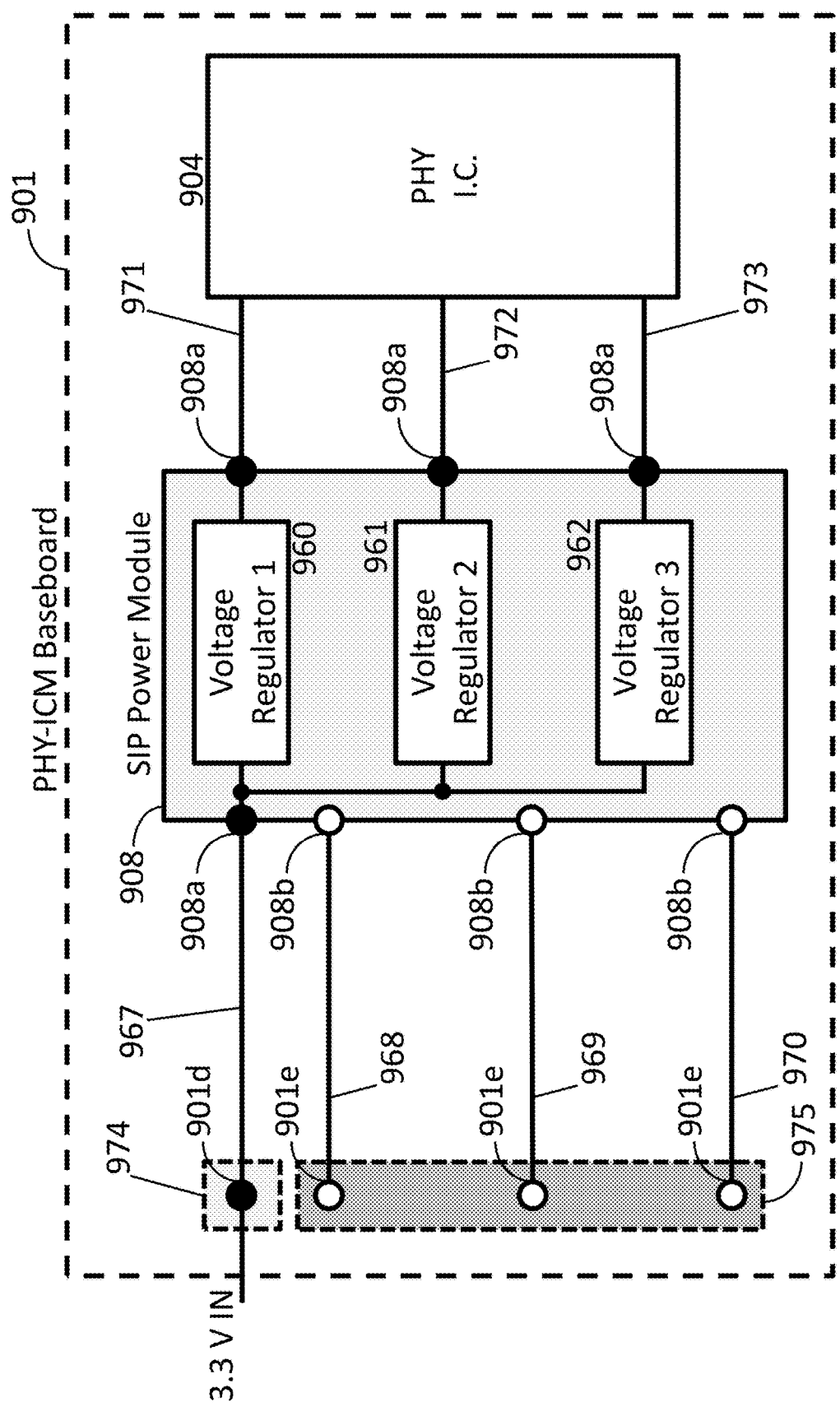
FIG. 9 is an illustrative block diagram of an alternate method of electrical connectivity between a PHY-ICM baseboard and a SIP Power Module and the electrical/electronic hardware incorporated in a SIP Power Module.

Referring to FIG. 9, a second preferred embodiment of a SIP Power Module (908) and its connectivity options between the host interface, the PHY-ICM baseboard (901) and the PHY I.C. (904) are shown.

In common with the first embodiment of FIG. 8, each of the required voltages for the PHY I.C. (904) and/or components on the baseboard (901) can be generated from a single 3.3 V IN supply provided by the host system, or alternatively the individual voltages can be supplied by the host system. However, in this second embodiment, the power supply configuration is dictated only by the SIP Power Module (908), or by an alternate SIP Bypass Module (not shown, see 1056, in FIG. 10 and its accompanying description for additional detail).

PHY-ICM baseboard (901) provides multiple connection sites (901*d*, 901*e*) in two groups (974, 975 respectively). The 3.3 VIN supply line (967) from the host system is connected to the SIP Power Module (908) where it is connected to the inputs of Voltage Regulator 1 (960), Voltage Regulator 2 (961) and Voltage Regulator 3 (962). Voltage Regulator 1 (960) generates 2.0 V which is fed to the PHY I.C. (904) via a connection (971). Voltage Regulator 2 (961) generates 1.2 V which is fed to the PHY I.C. (904) via a connection (972). Voltage Regulator 3 (962) generates 0.85 V which is fed to the PHY I.C. (904) via connection (973). One of ordinary skill would recognize that the various voltage outputs (971, 972 and 973), as well as the 3.3 V IN (967) may also be connected to other components (not shown) on the baseboard (901).

With the SIP Power Module (908) present, power is provided to the baseboard (901) via a first connection group (974) through the connection site (801*d*), and powers the entire PHY-ICM through a single 3.3 VIN (967) supply line.

Only the connection site (901*d*) on one host interface connector group (974) and the connection site (908*a*) on the SIP Power Module (908) are required to be present, as denoted by their solid black infill. However, while the PCB connections (968, 969, 970) would likely remain present, the host interface connection sites (901*e*) on the second host interface connector group (975), and the connection sites (908*b*) on the SIP Power Module (908) are not required to be present, as denoted by their lack of black infill.

Figure 10:
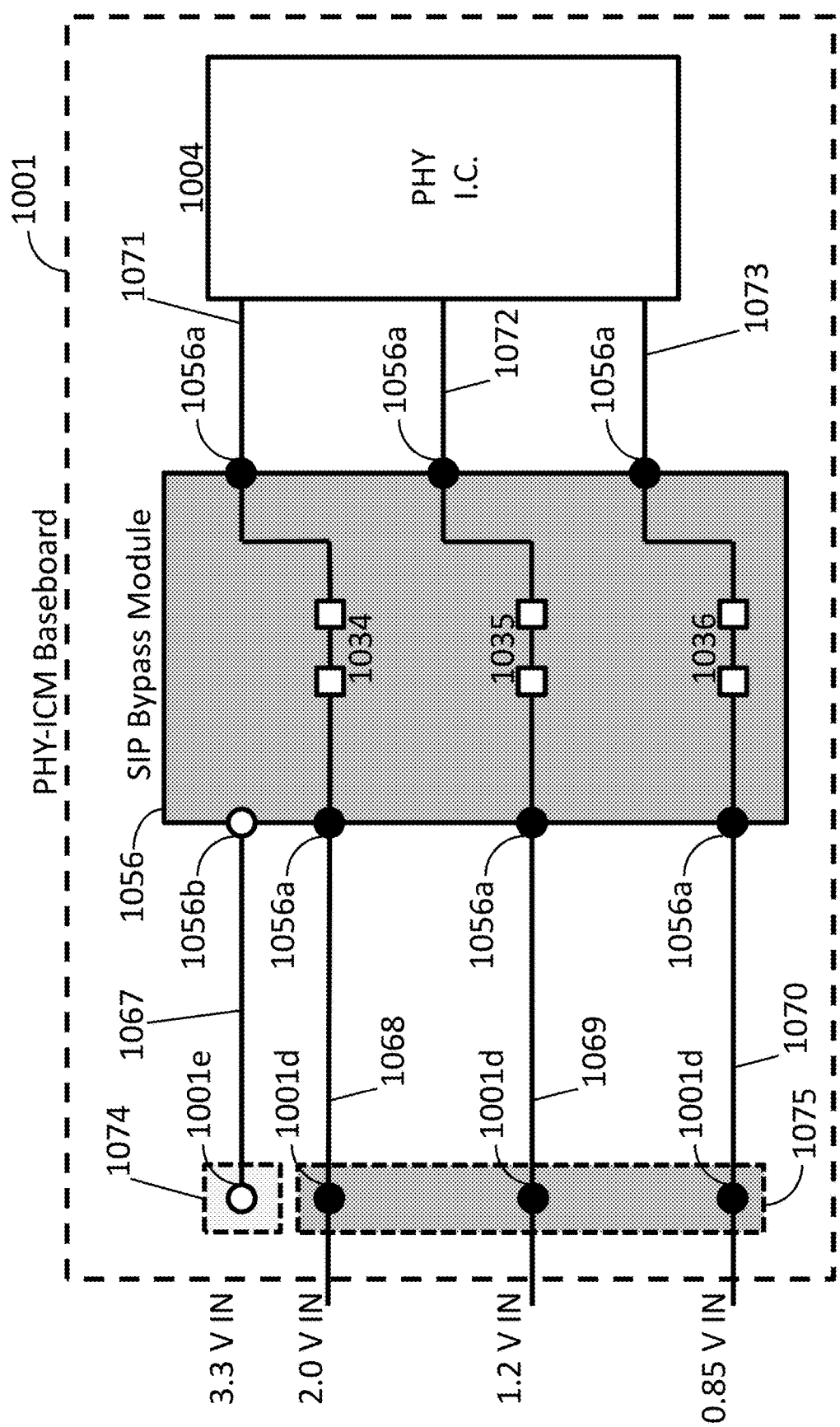
FIG. 10 is an illustrative block diagram of an alternate method of electrical connectivity between a PHY-ICM baseboard and a SIP Bypass Module and the electrical/electronic hardware incorporated in one example of a SIP Bypass Module.

FIG. 10 shows a second version of the preferred embodiment of FIG. 9, where again, each of the required voltages for the PHY I.C. (1004) and/or baseboard (1001) components can be generated from a single 3.3 V IN supply provided by the host system, or alternatively the individual voltages can be supplied by the host system. However, in this second version of the embodiment of FIG. 9, the power supply configuration is dictated only by the alternate SIP Bypass Module (1056) being fitted, instead of the SIP Power Module (not shown, see 908, in FIG. 9 and its accompanying description for additional detail).

PHY-ICM baseboard (1001) provides multiple connection sites (1001*d*, 1001*e*) in two groups (1074, 1075 respectively). The 3.3 VIN supply line (1067) while physically present and connected to the SIP Bypass Module (1056), its connectivity ends there since no other connectivity exists to the connection site (1056*b*) on the SIP Bypass Module (1056). The SIP Bypass Module (1056) contains only shorting links (1034, 1035 and 1036) which respectively provide a direct connectivity path between the host interface power supply inputs of 2.0 V IN (1068) via the connection (1071), 1.2 V IN (1069) via the connection (1072), and 0.85 V IN (1070) via the connection (1073), to the PHY I.C. (1004). Clearly, the shorting links (1034-1036) on the SIP Bypass Module (1056) could equally be simple PCB traces. One of ordinary skill would recognize that the various voltage outputs (1071, 1072 and 1073), as well as the 3.3 V IN (1067) may also be connected to other components (not shown) on the baseboard (1001).

With the SIP Bypass Module (1056) present in FIG. 10, versus the SIP Power Module (908) of FIG. 9, power is provided to the baseboard (1001) via a second connection group (1075) through the connection sites (1001*d*), and the PHY-ICM can be powered through multiple supply voltages (1068, 1069 and 1070) provided by the host interface.

Only the connection sites (1001*d*) on one host interface connector group (1075), and the connection sites (1056*a*) on the SIP Bypass Module (1056) are required to be present, as denoted by their solid black infill. However, the connection site (1001*e*) on a second host interface connector group (1074), and the connection site (1056*b*) on the SIP Bypass Module (1056) are not required to be present, as denoted by their lack of black infill.

Hence with the two versions of the second embodiment as described in FIG. 9 and FIG. 10 and their accompanying descriptions, the choice can be made at final assembly, of whether the PHY-ICM is powered externally from a single supply from the host interface by inserting the SIP Power Module (908) and using its onboard Voltage Regulators (960, 961, 962), or separate power supplies are used from the host interface by inserting the SIP Bypass Module (1056).

One of ordinary skill would recognize that a hybrid approach, merging the capabilities of the SIP Power Module (908) and the SIP Bypass Module (1056), could be used to eliminate one or more of the Voltage Regulators 1, 2, or 3 (960, 961, or 962), replacing it with a corresponding shorting link, so that any combination of voltage supplies that are available from the host system may be used to power the PHY-ICM baseboard (901 and 1001). Further, any number of voltage regulators which produce any suitable supply voltage(s) for the PHY chip of choice are both obvious and contemplated.

Figure 11A:
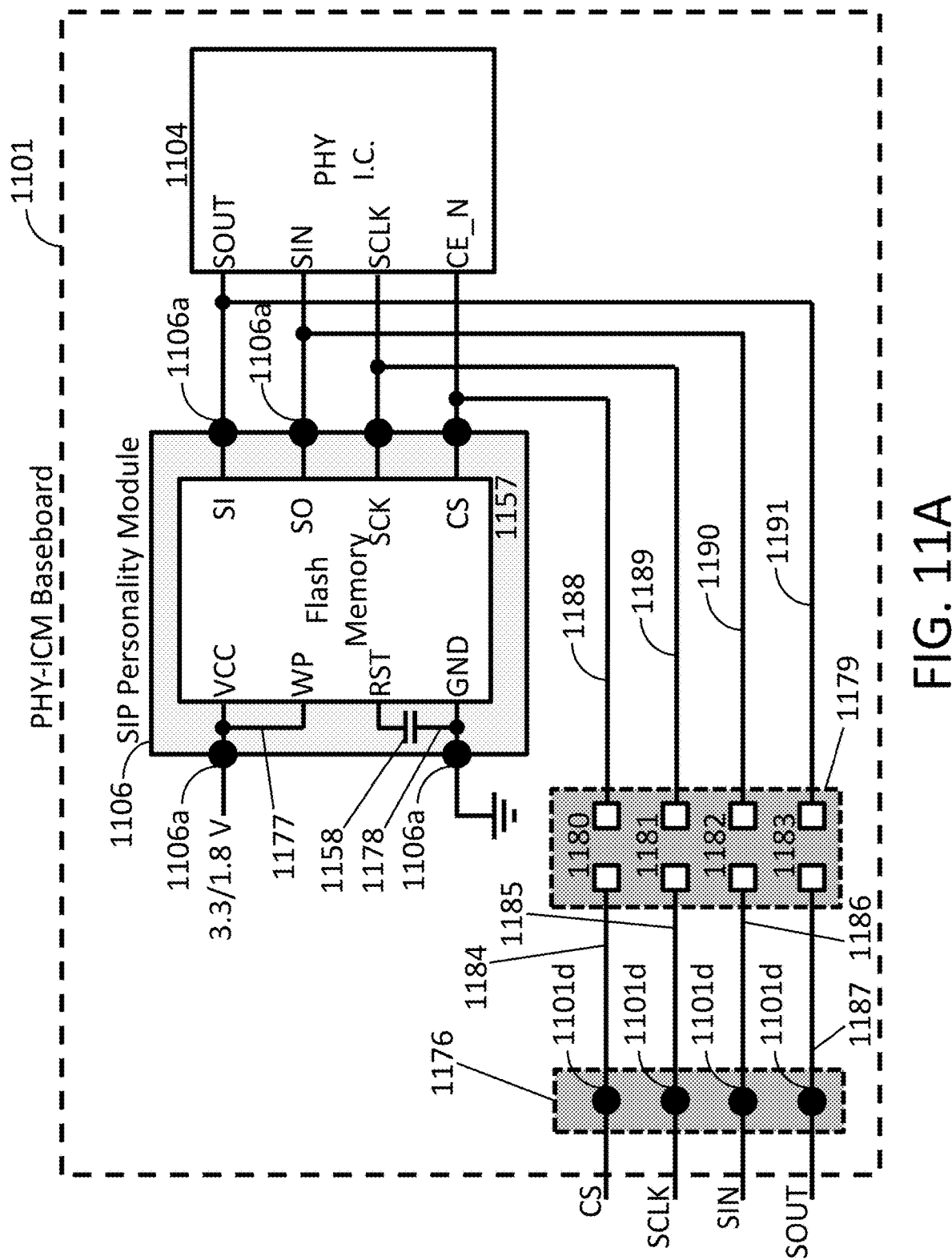
FIGS. 11A and 11B are respectively illustrative block diagrams of a first and a second method of electrical connectivity between a PHY-ICM baseboard and a SIP Personality Module and the electrical/electronic hardware incorporated in an example SIP Personality Module.

Referring to FIG. 11A, a preferred embodiment of a SIP Personality Module (1106) and its connectivity options between the host interface, the PHY-ICM baseboard (1101) and the PHY I.C. (1104) are shown.

In this preferred one embodiment, the SIP Personality Module (1106) houses a Flash Memory (1157) device, used as non-volatile storage. The example PHY I.C. (1104) embodiment utilizing the Aquantia AQR112C for instance, integrates a 32-bit microcontroller and internal RAM for program and data storage. The firmware image for the microcontroller is designed to be loaded after power-up/reset from an attached Flash memory device, or loaded by a host processor on the system application board via the MDIO/MDC interface, part of the MNGMNT IN/OUT interface (not shown, see 743, in FIG. 7A and its accompanying description for additional detail). Typically, the Flash memory approach is faster especially if there are multiple actions for the host processor to perform after power-up. However, there is still the issue of whether to integrate the Flash memory inside the PHY-ICM or keep it external to it.

The preferred embodiment allows the choice of internal versus external Flash memory selection to be made during the final assembly of the PHY-ICM with minimal cost or complexity. The SIP Personality Module (1106) contains at a minimum the Flash Memory (1157), with its power supply (1177) and ground (1178) connections, including a capacitor (1158) to provide a reset signal at power-on.

With the SIP Personality Module (1106) present, the Flash Memory (1157) is directly connected to the Flash memory interface signals on the PHY I.C. (1104), via serial interface signals. From the perspective of the PHY I.C. (1104), these signals are as follows: Chip Enable (CE_N, 1188), driven by the PHY I.C. (1104) to Chip Select (CS) or enable the Flash Memory (1157); Serial Clock (SCLK, 1189), driven by the PHY I.C. (1104) to clock serial data in/out of the Flash Memory (1157); Serial Data In (SIN, 1190), sampled by the PHY I.C. (1104) to read serial data from the Flash Memory (1157); and Serial Data Out (SOUT, 1191), driven by the PHY I.C. (1104) to write serial data into the Flash Memory (1157). Connected to these same signals is a jumper bank (1179) with four jumper sites (1180, 1181, 1182 and 1183). When the SIP Personality Module (1106) is present, and the Flash Memory (1157) is integrated into the PHY-ICM, these jumper sites (1180, 1181, 1182 and 1183) in the jumper bank (1179) located on the baseboard (1101), are left as open circuits (unconnected).

However, when the SIP Personality Module (1106) is not present, and the Flash Memory (1157) is external into the PHY-ICM, these jumper sites (1180, 1181, 1182 and 1183) in the jumper bank (1179) have shorting links inserted, and the Flash memory interface signals on the PHY I.C. (1104) are directly connected to/from the host interface on connector group (1176), via connection sites (1101*d*). From the perspective of the PHY I.C. (1104), these signals are as follows: Chip Enable (CE_N, 1188) is connected through shorting link (1180) to Chip Select (CS, 1184) on the host interface; Serial Clock (SCLK, 1189) is connected through shorting link (1181) to Serial Clock (SCLK, 1185) on the host interface; Serial Data In (SIN, 1190) is connected through shorting link (1182) to Serial Data In (SIN, 1186) on the host interface; and Serial Data Out (SOUT, 1191) is connected through shorting link (1183) to Serial Data Out (SOUT, 1187) on the host interface.

One exemplary embodiment identified in FIG. 11A is provided as an example, and one of ordinary skill in the art would understand that other improvements could be made, including (but not limited to), replacing the jumper sites (1180-1183) of the jumper bank (1179) with direct PCB or otherwise permanent connections. In this case, with the SIP Personality Module (1106) present, an additional stub length of PCB trace would remain connected to the Flash interface pins of the PHY I.C. (1104). This may be acceptable if trace lengths are not excessive and the frequency of operation is modest so that reflections are minimized and data integrity is maintained. In the case where the SIP Personality Module (1106) is absent, the alternate path to the host interface would already exist without the need for jumpers, but design analysis would be required for an individual implementation.

Figure 11B:
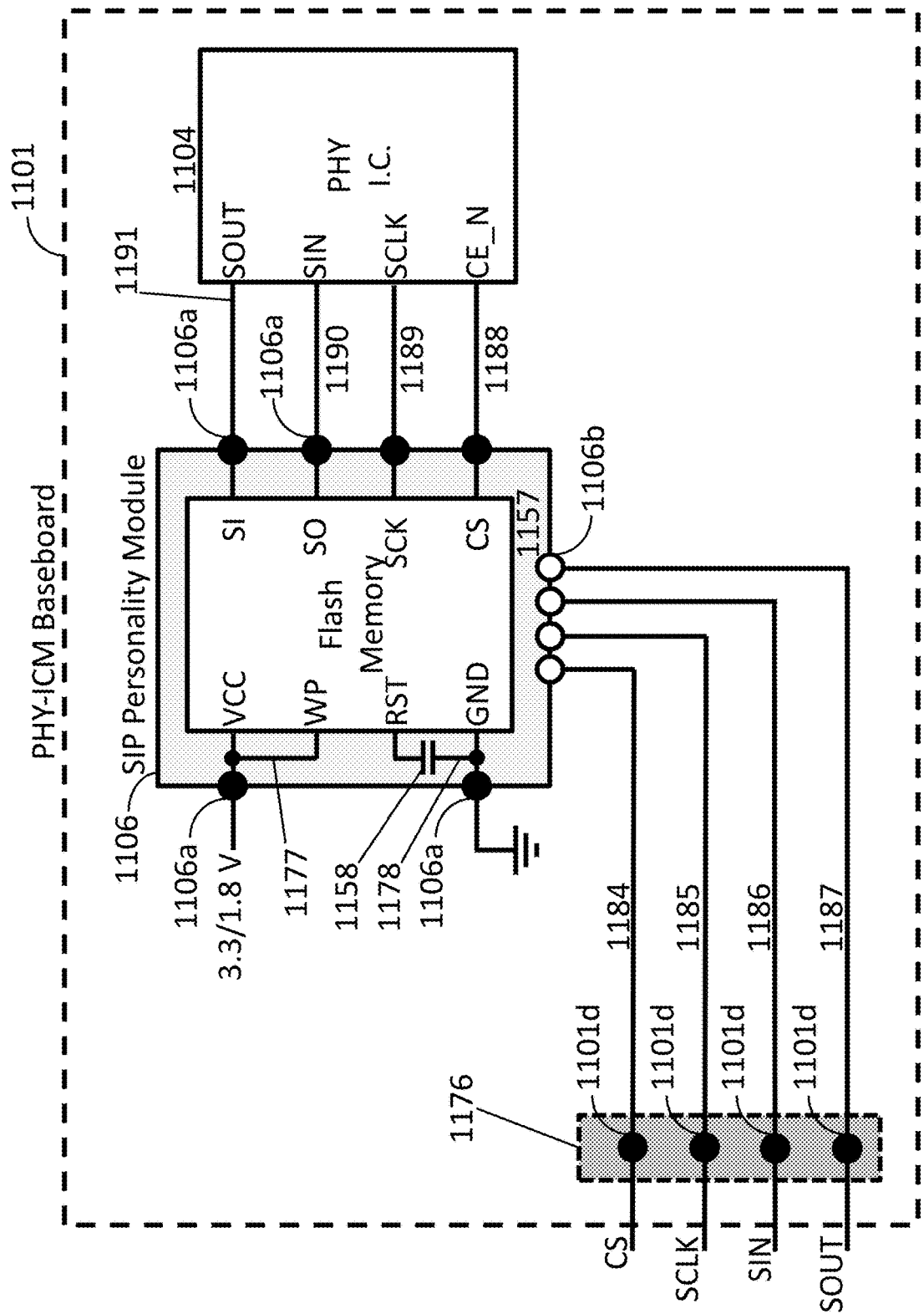

Referring to FIG. 11B, an alternative embodiment of a SIP Personality Module (1106) and its connectivity options between the host interface, the PHY-ICM baseboard (1101) and the PHY I.C. (1104) are shown.

The host interface signals for an external Flash memory (not shown) are routed to the site of the SIP Personality Module (1106). These include the host interface signals Chip Select (CS, 1184), Serial Clock (SCLK, 1185), Serial Data In (SIN 1186), and Serial Data Out (SOUT, 1187). These host interface signals would be unconnected when the SIP Personality Module (1106) was present, and connection sites (1106*b*) of the SIP Personality Module (1106) may not be populated (as denoted by their lack of black infill). In addition, all the clock and data signals to/from the Flash memory interface on the PHY I.C. (1104) are connected to the SIP Personality module (1106). These include Chip Enable (CE_N, 1188), Serial Clock (SCLK, 1189), Serial Data In (SIN, 1190), and Serial Data Out (SOUT, 1191).

With a SIP Personality Module (1106) containing the Flash Memory (1157) inserted in the baseboard (1101), the PHY I.C. (1104) has access to the local Flash memory. But with a suitably designed SIP Bypass Module (not shown) inserted, mimicking the function of the jumper block (1179) of FIG. 11A, these connections would route the host interface signals (1184, 1185, 1186 and 1187) to the Flash memory interface signals (1188, 1189, 1190 and 1191, respectively) of the PHY I.C. (1104), such as demonstrated for the SIP Power Module in FIG. 9 and FIG. 10 and their respective descriptions.

One of ordinary skill in the art would recognize that the pin out of the SIP Personality Module (1106) will be defined appropriate to the PHY-ICM baseboard (1101) and the PHY I.C. (1104), and is arbitrary and independent to that of the Flash Memory chip pin out. By appropriate routing on the SIP Personality Module (1106), it can host any suitable internal Flash Memory (1157) device. Similarly, with a suitably designed SIP Bypass Module (not shown) inserted, any suitable external Flash memory device can be accommodated. Hence, a range of modular PHY-ICM devices can be defined, which at final assembly, allows the choice of either on-board or off-board Flash memory location, and provides Flash memory vendor (and pin out) independence.

Figure 12:
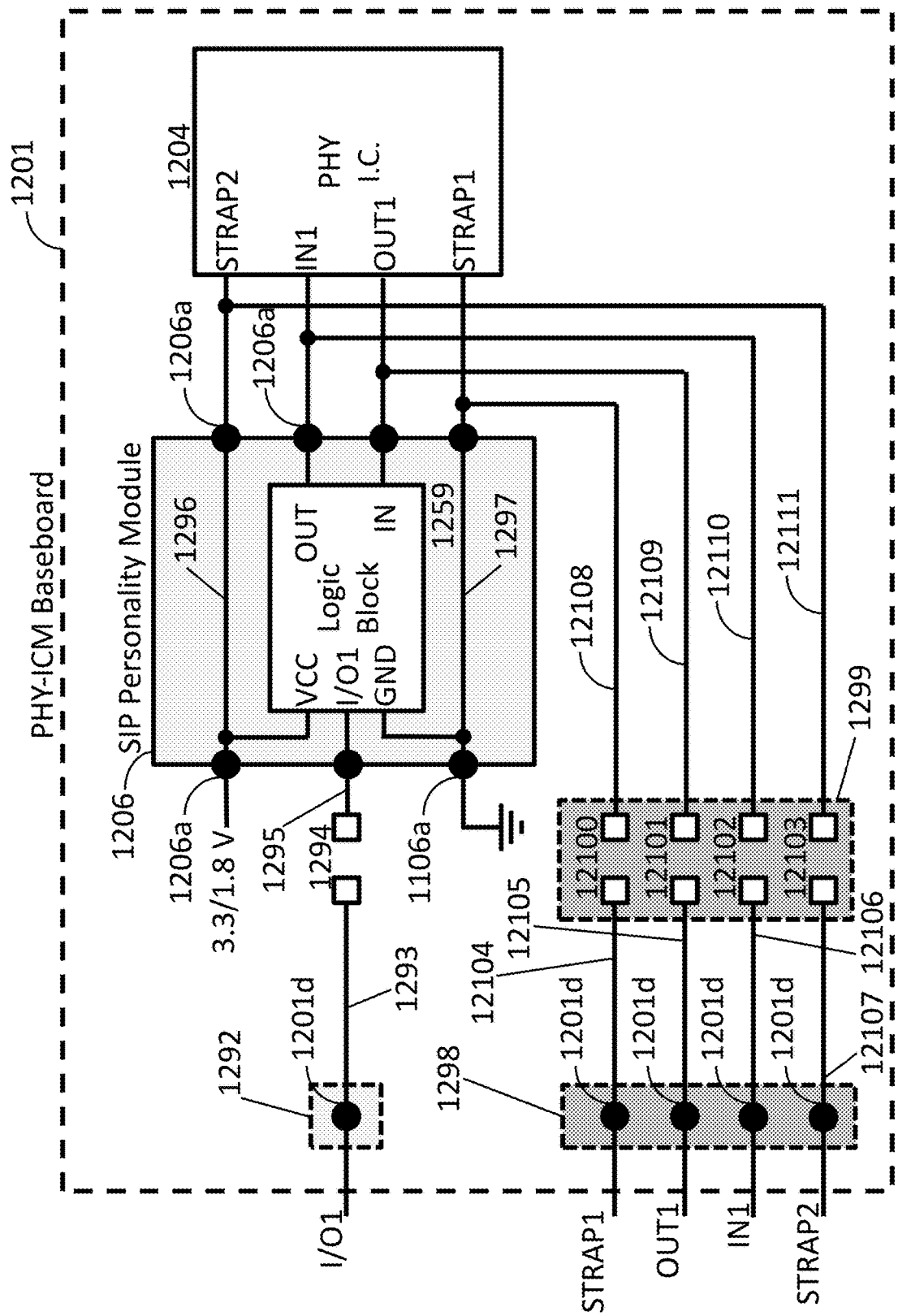
FIG. 12 is an illustrative block diagram of a method of electrical connectivity between a PHY-ICM baseboard and a second SIP Personality Module and the electrical/electronic hardware incorporated in a second example of a SIP Personality Module.

Referring to FIG. 12, a second preferred embodiment of a SIP Personality Module (1206) and its connectivity options between the host interface, the PHY-ICM baseboard (1201) and the PHY I.C. (1204) are shown.

In this preferred embodiment, the SIP Personality Module (1206) houses a Logic Block (1259) device, which monitors input signals from the host interface and/or the PHY I.C. (1204), and based on those input signals and the logic function, provides output signals and/or state information to the host interface and/or the PHY I.C. (1204). The example PHY I.C. (1204) embodiment using the Aquantia AQR112C for instance, provides functions that may be externally configured using pin strapping options, such as the operational voltage of certain I/O pins, or a Reset input function. In addition, the PHY I.C. (1204) may provide status outputs on other pins such as an Interrupt line indicating it is requesting attention. Clearly, different PHY chip (104) embodiments from other semiconductor vendors may require different pin strapping and/or configuration input data or provide different status output information.

The Logic Block (1259) takes inputs from a variety of sources in the system, which may include the host interface or processor, the PHY I.C. (1204), or other sources. For instance, other system resources may be monitored, such as failure to successfully complete PoE 2-Event Physical Layer Classification, PoE overcurrent detection, the PHY-ICM could incorporate monitoring of the power-up supply voltage sequence or over temperature conditions, etc. Any of these could be used by the Logic Block (1259) to produce outputs to a variety of destinations in the system, which may include the host interface, a host processor, the PHY I.C. (1204), or other destinations.

The preferred embodiment allows the choice of internal versus external Logic Block (1259) selection to be made during the final assembly of the PHY-ICM with minimal cost or complexity. The SIP Personality Module (1206) contains at a minimum the Logic Block (1259) but may also contain additional functions such as Flash memory (not shown, see 1157, in FIG. 11A or FIG. 11B and their accompanying descriptions for additional detail), together with appropriate power supply (1296) and ground (1297) connections, and may include other functions such as, but not limited to, temperature monitoring, power supply sequencing, etc.

With the SIP Personality Module (1206) present, the Logic Block (1259) is directly connected to the PHY I.C. (1204), via various I/O and pin strapping interface signals. From the perspective of the PHY I.C. (1204), these signals are as follows: STRAP1 (12108), an input pin strapping option sampled by the PHY I.C. (1104); OUT1 (12109), an output pin driven by the PHY I.C. (1204) to indicate its status to the Logic Block (1259); IN1 (12110), an input pin sampled by the PHY I.C. (1204) to detect output status from the Logic Block (1259); and STRAP2 (12111), an input pin strapping option sampled by the PHY I.C. (1104). Connected to these same signals is a jumper bank (1299) with four jumper sites (12100, 12101, 12102 and 12103). When the SIP Personality Module (1206) is present, and the Logic Block (1259) is integrated into the PHY-ICM, these jumper sites (12100, 12101, 12102 and 12103) in the jumper bank (1299) located on the baseboard (1201), are left as open circuits (unconnected).

In this preferred embodiment I/O1 (1293) is connected to/from the host interface on connector group (1292), via connection site (1201*d*), and connected through a single jumper site (1294) to I/O1 (1295) on Logic Block (1259) of the SIP Personality Module (1206). In this configuration, I/O1 (1293) is clearly an input and/or output signal between the Logic Block (1259) and the host interface. One of ordinary skill in the art would recognize that in an alternate embodiment, the I/O1 (1293) signal may not be an external connection available to the host interface of the PHY-ICM module, and may be purely an internal signal, or a combination of both. For instance, the I/O1 (1293) signal may be an output from an on-board PHY-ICM temperature monitoring or overcurrent detection device. Further, the I/O1 (1293) signal is a non-limiting example, and there may be any number of I/O signals to the Logic Block (1259) which are connected to the host interface, local signals within the PHY-ICM, or both.

In the case the SIP Personality Module (1206) is not present, or Logic Block (1259) or its functional equivalent is external into the PHY-ICM, any of the jumper sites (12100, 12101, 12102 and 12103) in the jumper bank (1299) may have shorting links inserted, to directly connect the logic interface signals on the PHY I.C. (1204) to/from the host interface on connector group (1298), via connection sites (1201*d*). From the perspective of the PHY I.C. (1204), these signals are as follows: STRAP1 (12108) is connected through shorting link (12100) to STRAP1 (12104) on the host interface; OUT1 (12109) is connected through shorting link (12101) to OUT1 (12105) on the host interface; IN1 (12110) is connected through shorting link (12102) to IN1 (12106) on the host interface; and STRAP2 (12111) is connected through shorting link (12103) to STRAP2 (12107) on the host interface.

One of ordinary skill in the art would recognize there is nothing limiting about the disclosed Logic Block (1259) in FIG. 12, including the number of specific I/O or pin strapping options, the complexity of the logic functions integrated, the locations of the inputs monitored or outputs controlled, and whether it is physically integrated into the PHY-ICM or external to it. By way of example, Logic Block (1259) may be integrated onto the same physical SIP Personality Module (1206) as the Flash Memory (1157) of FIG. 11A or FIG. 11B. Further, Logic Block (1259) could for instance monitor the operating temperature of the PHY-ICM using an internal or external sensor. On detection of an over temperature condition, the Logic Block (1259) could inform the host interface of the condition, and the host processor could perform actions to reduce the power/temperature, by for instance resetting the PHY I.C. (1204) and forcing it to Auto-Negotiate to a lower speed, power mode, etc. The host processor may use further inputs and/or outputs of the Logic Block (1259), and/or may use a combination of interfaces in addition to or instead of the Logic Block (1259), to accomplish these actions (such as the management interface of MDC/MDIO).

one exemplary embodiment identified in FIG. 12 is provided as an example, and one of ordinary skill in the art would understand that other improvements could be made, including (but not limited to), replacing the jumper sites (12100-12103) of the jumper bank (1299) with direct PCB or otherwise permanent connections. In this case, with the SIP Personality Module (1206) present, an additional stub length of PCB trace would remain connected to the I/O pins of the PHY I.C. (1204). However, since the signals to/from the Logic Block (1259) are generally either static or low frequency, this would likely be acceptable providing trace lengths are not excessive. In the case where the SIP Personality Module (1206) is absent, the alternate path to the host interface would already exist without the need for jumpers, but again, design analysis would be required for an individual implementation.

Alternatively, the host interface signals for an external logic block (not shown) could be routed to the site of the SIP Personality Module (1206) instead of the jumper block (1299). These host interface signals would be unconnected when the SIP Personality Module (1206) was present. But when a suitably designed SIP Bypass Module (not shown) were inserted, mimicking the function of the jumper block (1299), these connections would route the host interface signals to the I/O signals of the PHY I.C. (1204), such as demonstrated in FIG. 9 and FIG. 10 and their respective descriptions.

While SIP Modules for power regulation, Flash memory, logic functions and/or bypass functions have been disclosed, one of ordinary skill would recognize that other SIP Modules may be defined with a combination of these functions or alternate functions, and may benefit from a similar implementation. One or more of such alternate SIP Modules may be present or absent in order to allow the provision of a specific function to be either integrated within the PHY-ICM or implemented elsewhere in the system application, and allow that choice to be made at final assembly of the overall PHY-ICM.

Figure 13A:
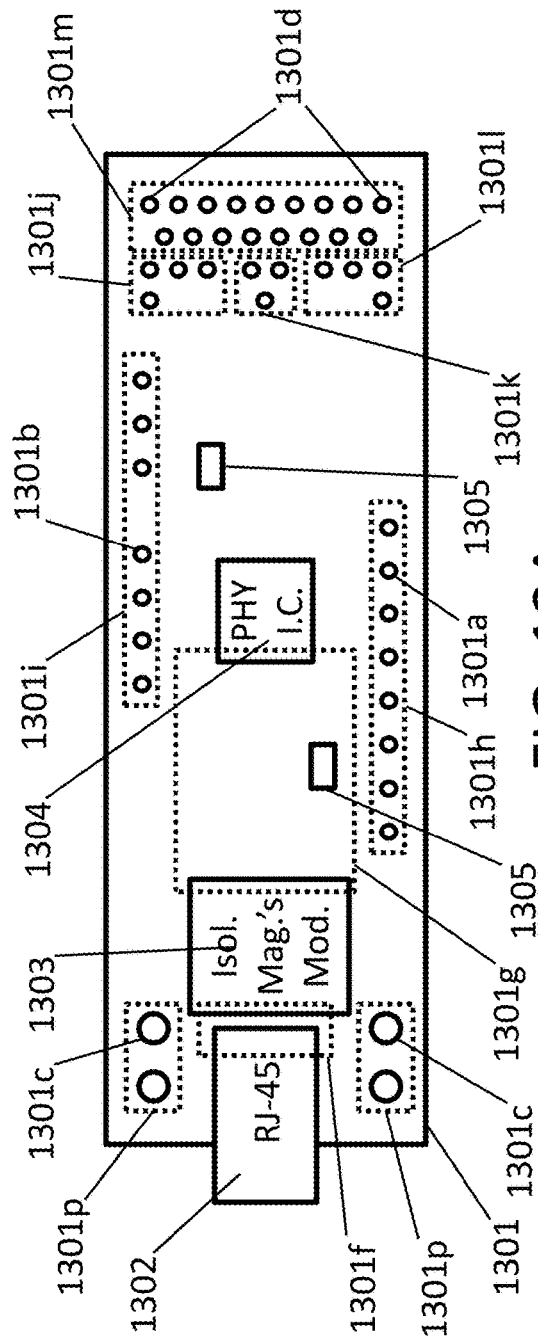
FIGS. 13A and 13B show respectively an illustrative example of the top side and bottom side PCB layout of the modular PHY-ICM baseboard.
Figure 13B:
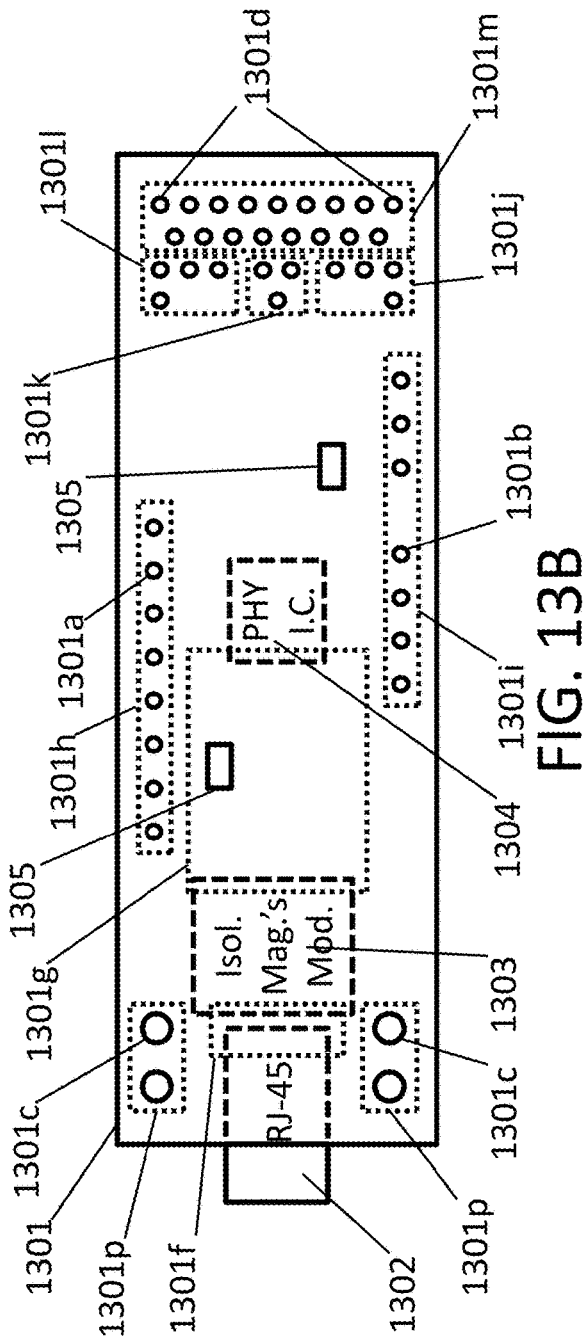

Referring to FIG. 13A and FIG. 13B, simple representative examples of the top side and bottom side PCB connection sites for a modular PHY-ICM baseboard (1301) are illustrated respectively. These examples are intended to show the primary external connection sites between the PHY-ICM baseboard (1301), the host interface, and/or any optional component parts that may be added during the final assembly process. These include, but are not limited to, the host interface connection to a solder tail (not shown, see 114 in FIG. 1C, or 1714 in FIG. 17C for additional detail) via a group of connection sites (1301*d*); the interface to a first SIP Module (not shown, see 406 in FIG. 4 for additional details) via a group of connection sites (1301*a*); the interface to a second SIP Module (not shown, see 508 in FIG. 5 for additional details) via a group of connection sites (1301*b*); and the interface to the host interface PoE phantom power connections, via a group of connection sites (1301*c*).

One of ordinary skill would recognize that the RJ-45 connector (1302) and the Isolation Magnetics Module (1303) would have appropriate PCB interconnections between each other, via the baseboard (1301) on the Line Side (not shown, see 14120-14131 in FIG. 14, or 15120-15131 in FIG. 15 for additional details), as denoted by the dotted area (1301*f*). In addition, the Isolation Magnetics Module (1303) and the PHY I.C. (1304) would also have appropriate PCB interconnections between each other, via the baseboard (1301) on the Chip Side (not shown, see 14132-14143 in FIGS. 14 and 15132-15143 in FIG. 15 for additional details), as denoted by the dotted area (1301*g*). While these individual PCB trace connections are omitted here for clarity, they are discussed in more detail in the descriptions of FIG. 14 and FIG. 15.

The PoE phantom power connections via the group of connection sites (1301*c*) to/or from the baseboard (1301) may carry considerable current, so while shown as a single connection site (1301*c*) for each of the 4 center tap connections to/from each of the 4-pairs of UTP, each of these connection sites (1301*c*) may require a plurality of connection sites, by the regions denoted by dotted areas (1301*p*). Similarly, the power connections from the host interface via the connection sites (1301*d*) to either the PHY I.C. (1304), a SIP Power Module (not shown, see 801*d* in FIG. 8, or 901*d* in FIG. 9), and/or additional circuitry (not shown) on the PHY-ICM baseboard (1301), may be shown as a single connection site (1301*d*) for each of the supply voltages, but such connection sites (1301*d*) may actually require a plurality of connection sites.

In order to support the additional capabilities of a particular PHY chip, or potentially even support an alternate PHY chip, the host interface footprint has a number of regions defined, to support different functions and or I/O requirements. As shown in FIGS. 13A an 13B, the host interface consists of several regions denoted by dotted areas (1301*j*, 1301*k*, 1301*l*, 1301*m* and 1301*p*). For a common set of baseline host interface functions, intended to be largely (although not mandatorily) present for all PHY-ICMs, the associated individual connection sites (1301*d*) are grouped into a connectivity region (1301*m*), common to all the PHY-ICM versions of a particular family. In addition, the associated individual connection sites (1301*c*) are grouped into a connectivity region (1301*p*), common to all the PHY-ICM versions of a particular family that support PoE. In order to support additional functions, other connectivity regions (for example, 1301*j*, 1301*k*, 1301*l*) can be defined, each associated with a specific feature or function, and the physical location and/or function of that region with respect to the overall host interface, can be reserved to support options outside of the common baseline functions. In this way, a family of PHY-ICM devices can be produced which conform to a baseline and extended feature set and a common host interface footprint. By way of example, a connectivity region (for example 1301*j*, 1301*k*, or 1301*l*) could be assigned as the host interface for Flash memory, in which case it may contain signals such as Chip Select (CS, 1184), Serial Clock (SCLK, 1185), Serial Data In (SIN 1186), and Serial Data Out (SOUT, 1187), as described in FIGS. 11 an 11B, and their associated descriptions.

Hence a baseline host interface footprint for the PHY-ICM, can be defined, constrained, and standardized across a family of devices, Extended feature options for a PHY-ICM family can be supported using optional but predefined regions; with each region, or connections within the region, being present or absent depending on whether the feature is supported or not.

This approach allows the PHY-ICM vendor to provide a significant benefit to the system designer/vendor. Consider for instance, the following typical and very practical scenario. PHY vendor "A" and PHY vendor "B" both produce PHYs that support 2.5/5/10GBASE-T operation. The majority of the hardware/software features are identical, since they are predetermined by the relevant 802.3 Specification. However, neither PHY chip is directly pin compatible with the other, and both PHY vendors offer extended features, which may or may not be used by the system vendor in certain applications. To support the option for either PHY chip, the system designer/vendor is faced with supporting two different host system footprints, an expensive and highly undesirable proposition. However, by offering different PHY-ICM baseboards (or carriers/substrates) on which the PHY chip will reside, the PHY-ICM vendor can isolate this pin out change from the system vendor. While this requires the PHY-ICM vendor to produce different baseboards, with careful attention, and using the multiple innovative techniques disclosed herein, the number of SKUs the PHY-ICM vendor must offer can be minimized. Further, by offering the different host interface regions, and segregating them, either PHY vendor "A" or "B" can be used in a system design. The used or unused hardware regions simply need to be configured into a known state. Software feature extensions are generally easier to accommodate since these are typically programmed using a well-defined interface, such as the management MDC/MDIO pins (see 743 in FIG. 7A and its associated description for additional detail), or using Flash memory. Various embodiments of the SIP Power Module, SIP Personality Module, and/or SIP Bypass Module, may be added, deleted or exchanged, up to the point of final assembly, to allow the PHY-ICM to be personalized to its particular target host system application. Various individual connection sites (1301*a*) may be used or unused within the connectivity region (1301*h*) by a particular (for example) SIP Power Module or SIP Bypass Module (not shown, see respectively FIG. 9 or FIG. 10 and their accompanying descriptions for additional detail). Similarly, various individual connection sites (1301*b*) may be used or unused within the connectivity region (1301*i*) by a particular (for example) SIP Personality Module or SIP Bypass Module (not shown, see respectively FIG. 11A, FIG. 11B, or FIG. 12 and their accompanying descriptions for additional detail).

Figure 14:
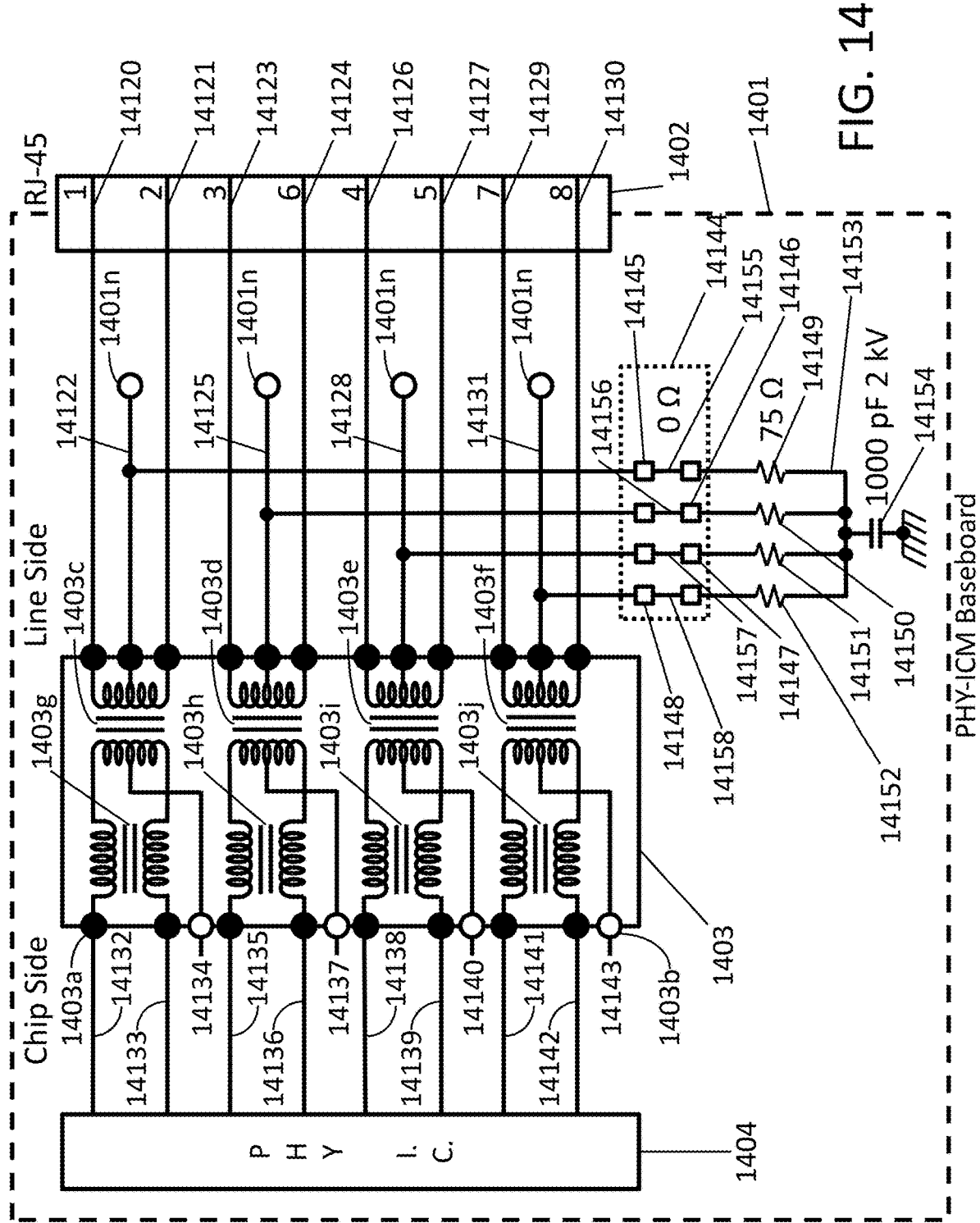
FIG. 14 is an illustrative circuit diagram of a modified Bob Smith Termination (BST) designed for operation in non-PoE applications.

Referring to FIG. 14, a detailed interface between the RJ-45 connector (1402), the Isolation Magnetics Module (1403), and the PHY I.C. (1404) of the PHY-ICM is shown. This particular example is for a network interface that does not support PoE.

On the Line Side of the Isolation Magnetics Module (1403), the UTP network connects to the eight contacts of the RJ-45 connector (1402). PCB interconnects on the baseboard (1401), connect pins 1 through 8 of the RJ-45 connector (1402) to the corresponding eight connections on the Line Side of the Isolation Magnetics Module (1403); respectively via pins 1 and 2 (14120, 14121), pins 3 and 6 (14123, 14124), pins 4 and 5 (14126, 14127) and pins 7 and 8 (14129, 14130). These eight connections do not vary whether the application is PoE enabled or not, and they correspond to the connectivity region identified by the dotted area (1301*f*) in FIG. 13. In the case of non-PoE applications, the Line Side interface between the RJ-45 connector (1402) and the Isolation Magnetics Module (1403) also consists of PCB traces (14122, 14125, 14128, 14131) between the center taps of the four isolation transformers (1403*c*, 1403*d*, 1403*e*, 1403*f*) and the connection sites (1401*n*) of the host interface. While the PCB traces (14122, 14125, 14128, 14131) will likely be physically present on the baseboard (1401), the connection sites (1401*n*) of the host interface may not be populated (as denoted by their lack of black infill), since these are specific to the PoE application (as discussed in FIG. 15 and its associated description).

The Line Side of each of the four isolation transformers (1403*c*, 1403*d*, 1403*e*, 1403*f*) are connected to a typical Bob Smith Termination (BST) network. Respectively, the center taps of the transformers (1403*c*, 1403*d*, 1403*e*, 1403*f*), via individual PCB connections (14122, 14125, 14128, 14131), are connected to connecting links (14145, 14146, 14147, 14148) within the jumper bank (14144), where a shorting link (14155, 14156, 14157, 14158) is inserted in each of said connecting links (14145, 14146, 14147, 14148), then individually connected to 75Ω resistors (14149, 14150, 14151, 14152), and then via a common connection (14153), through a 1000 pF capacitor (14154) to ground. Use of the BST for Ethernet applications is well known to those of ordinary skill in the art, to reduce EMI/RFI emissions and susceptibility over Ethernet UTP cabled systems. An innovative attribute of the disclosed BST embodiment is the configurability provided by the connecting links (14145, 14146, 14147, 14148), which allow the shorting links (14155, 14156, 14157, 14158) to be inserted to operate as a standard BST in a non-PoE implementation, or be substituted by blocking capacitors in a modified BST in a PoE implementation (as described in FIG. 15 and its accompanying description).

Referring again to FIG. 14, inside the Isolation Magnetics Module (1403), the four data paths from the RJ-45 connector (1402) are transformer coupled via the four isolation transformers (1403*c*, 1403*d*, 1403*e*, 1403*f*), then connected through the four common mode chokes (CMCs) (1403*g*, 1403*h*, 1403*i*, 1403*j*), to the Chip Side of the Isolation Magnetics Module (1403) and then via the four data pair PCB connections (14132 and 14133, 14135 and 14136, 14138 and 14139, 14141 and 14142), to the PHY I.C. (1404).

In the preferred embodiment of FIG. 14, the CMCs (1403*g*, 1403*h*, 1403*i*, 1403*j*) may not be required, and eliminated, in which case the four isolation transformers (1403*c*, 1403*d*, 1403*e*, 1403*f*) would be directly connected to the four data pair PCB connections (14132 and 14133, 14135 and 14136, 14138 and 14139, 14141 and 14142) to the PHY I.C. (1404). The presence or absence of the CMCs is dependent on the overall EMI/RFI performance of the combined system application solution, which includes the host system and one or more of the PHY-ICM instances.

In an alternative embodiment, the four isolation transformers (1403*c*, 1403*d*, 1403*e*, 1403*f*) and the four CMCs (1403*g*, 1403*h*, 1403*i*, 1403*j*) may be located in separate physical modules or packages (not shown, see 1703*c/d/e/f* and 1703*g/h/i/j* in FIGS. 17D through 17F and their accompanying descriptions for additional detail).

Further, the four isolation transformers (1403*c*, 1403*d*, 1403*e*, 1403*f*), are shown to have center tap connections (14134, 14137, 14140, 14143) on the Chip Side, connected to the four pin sites (1403*b*), which are shown as not connected and may not be present, as denoted by their lack of black infill. These center tap connections (14134, 14137, 14140, 14143) may be optionally present depending on the PHY I.C. (1404) and/or the overall twisted-pair driver/receiver circuit implementation. If the isolation transformers (1403*c*, 1403*d*, 1403*e*, 1403*f*) have their center tap connections (14134, 14137, 14140, 14143) present, these may be used for a variety of functions, including (but not limited to) applying biasing conditions to the PHY I.C. (1404) transmitter/receiver circuitry, signal conditioning to reduce externally generated environmental noise sources from being received by the PHY I.C. (1404), and/or reduce internally generated noise sources from being transmitted by the host system in conjunction with the PHY I.C. (1404). Typically, such noise reduction would be performed using decoupling capacitors or alternative circuit techniques, not shown but well known to those of ordinary skill in the art.

Figure 15:
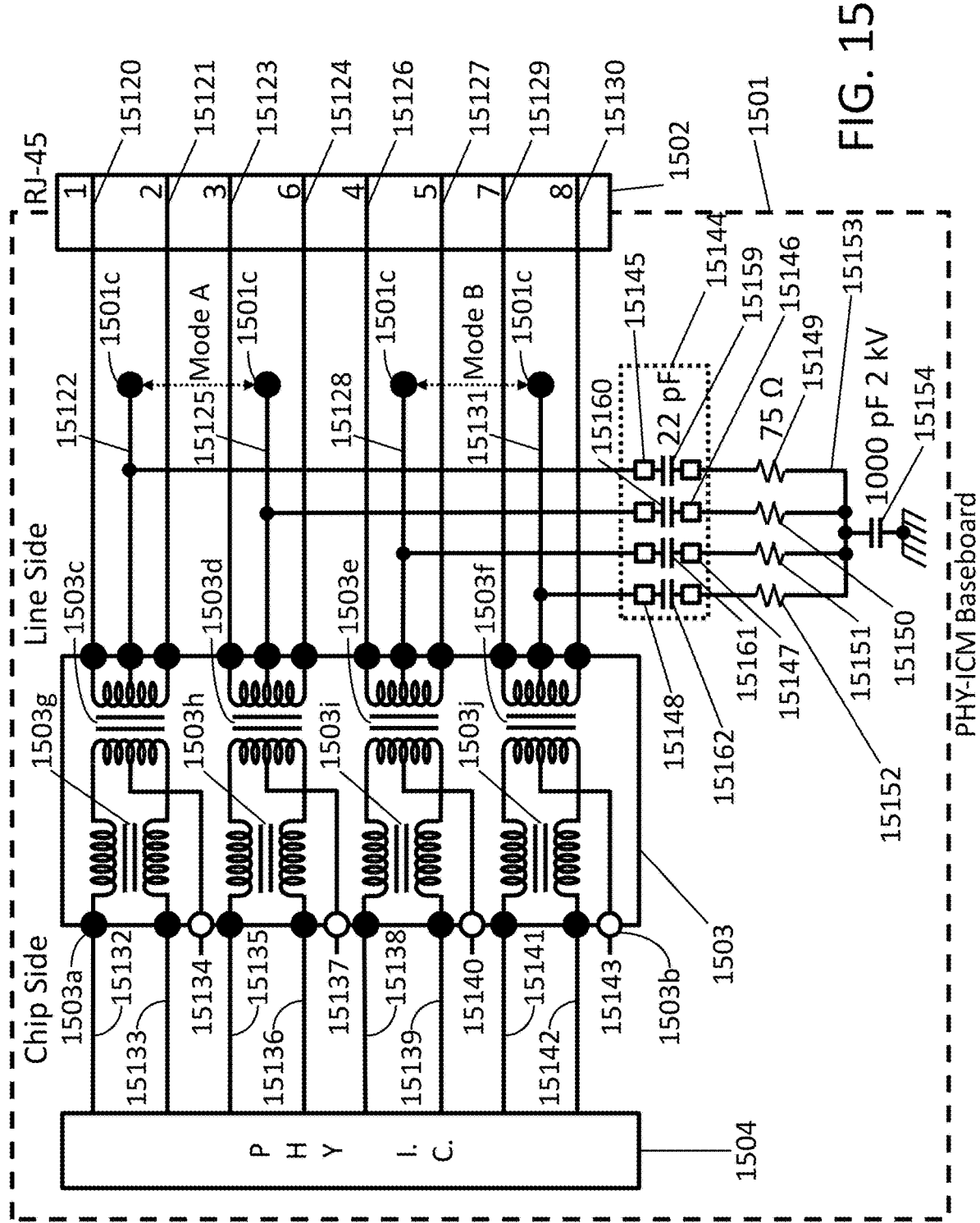
FIG. 15 is an illustrative circuit diagram of a modified Bob Smith Termination (BST) designed for operation in PoE applications.

Referring to FIG. 15, a detailed interface between the RJ-45 connector (1502), the Isolation Magnetics Module (1503), and the PHY chip (1504) of the PHY-ICM is shown. This particular example is for a network interface that supports PoE. This means that DC power can be injected (in the case the equipment is a PSE) or extracted (in the case the equipment is a PD) via the center taps of the Line Side (network side) of the isolation transformers using a phantom power arrangement, well known to those of ordinary skill in the art. In this way, both data and power can co-exist over the same UTP network cables. The PHY-ICM, when provisioned for PoE operation, can be operated in either a PSE or PD configuration.

On the Line Side of the Isolation Magnetics Module (1503), the UTP network connects to the eight contacts of the RJ-45 connector (1502). PCB interconnects on the baseboard (1501), connect pins 1 through 8 of the RJ-45 connector (1502) to the corresponding eight connections on the Line Side of the Isolation Magnetics Module (1503); respectively via pins 1 and 2 (15120, 15121), pins 3 and 6 (15123, 15124), pins 4 and 5 (15126, 15127) and pins 7 and 8 (15129, 15130). These eight connections do not vary whether the application is PoE enabled or not, and they correspond to the connectivity region identified by the dotted area (1301f) in FIG. 13. In the case of PoE applications, the Line Side interface between the RJ-45 connector (1502) and the Isolation Magnetics Module (1503), provides the PoE path via PCB traces (15122, 15125, 15128, 15131) between the center taps of the four isolation transformers (1503c, 1503d, 1503e, 1503f) and connection sites (1501c) of the host interface, which would be populated (as denoted by their solid black infill).

The Line Side of each of the four isolation transformers (1503c, 1503d, 1503e, 1503f) are connected to a modified Bob Smith Termination (BST) network. Respectively, the center taps of the transformers (1503c, 1503d, 1503e, 1503f), via individual PCB connections (15122, 15125, 15128, 15131), are connected to connecting links (15145, 15146, 15147, 15148) within the jumper bank (15144), where a 22 pF capacitor (15159, 15160, 15161, 15162) is inserted in each of said connecting links (15145, 15146, 15147, 15148), then individually connected to 75Ω resistors (15149, 15150, 15151, 15152), and then via a common connection (15153), through a 1000 pF capacitor (15154) to ground. Use of the modified BST for PoE applications is well known to those of ordinary skill in the art, to reduce EMI/RFI emissions and susceptibility over Ethernet UTP cabled systems. An innovative attribute of the disclosed BST embodiment is the configurability provided by the connecting links (15145, 15146, 15147, 15148), which allow the 22 nF capacitors (15159, 15160, 15161, 15162) to be inserted in order to operate as a modified BST in a PoE implementation, or be substituted by shorting links in a standard BST, non-PoE, implementation (as described in FIG. 14 and its accompanying description). A PoE implementation introduces a 48V DC power supply across either one pair of transformer (1503c, 1503d) center taps (15122, 15125), in the case of Mode A, or the other pair of transformer (1503e, 1503f) center taps (15128, 15131), in the case of Mode B. Without the insertion of the DC blocking capacitors (15159, 15160, 15161, 15162), this high current capability 48 V DC path, would be applied across the resistors (15149-15152) of a standard BST implementation, and would likely burn them out and render the BST or the network equipment itself useless.

Note that in the embodiment of FIG. 15, while the circuitry of the Isolation Magnetics Module (1503) would be identical, the wire gauge of the copper wire for the windings of the four isolation transformers (1503c, 1503d, 1503e, 1503f) would be sized differently dependent on which of the various IEEE Standards for PoE were to be supported. 802.3af (PoE) would require the smallest gauge wire, with 802.3bt (PoE+) a thicker gauge wire, and 802.3at (PoE++) the thickest gauge wire. Since the raw material cost of the copper wire is significant, a different Isolation Magnetics Module (1503) may be substituted at assembly time to optimize the wire gauge and cost to the appropriate PoE power requirement.

Referring again to FIG. 15, inside the Isolation Magnetics Module (1503), the four data paths from the RJ-45 connector (1502) are transformer coupled via the four isolation transformers (1503c, 1503d, 1503e, 1503f), then connected through the four common mode chokes (CMCs) (1503g, 1503h, 1503i, 1503j), to the Chip Side of the Isolation Magnetics Module (1503) and then via the four data pair PCB connections (15132 and 15133, 15135 and 15136, 15138 and 15139, 15141 and 15142), to the PHY chip (1504).

In the preferred embodiment of FIG. 15, the CMCs (1503g, 1503h, 1503i, 1503j) may not be required, and eliminated, in which case the four isolation transformers (1503c, 1503d, 1503e, 1503f) would be directly connected to the four data pair PCB connections (15132 and 15133, 15135 and 15136, 15138 and 15139, 15141 and 15142) to the PHY chip (1504). The presence or absence of the CMCs is dependent on the overall EMI/RFI performance of the combined system application solution, which includes the host system and one or more of the PHY-ICM instances.

In an alternative embodiment, the four isolation transformers (1503c, 1503d, 1503e, 1503f) and the four CMCs (1503g, 1503h, 1503i, 1503j) may be located in separate physical modules or packages (not shown, see 1703c/d/e/f and 1703g/h/i/j in FIGS. 17D through 17F and their accompanying descriptions for additional detail).

Further, the four isolation transformers (1503c, 1503d, 1503e, 1503f), are shown to have center tap connections (15134, 15137, 15140, 15143) on the Chip Side, connected to the four pin sites (1503b), which are shown as not connected and may not be present, as denoted by their lack of black infill. These center tap connections (15134, 15137, 15140, 15143) may be optionally present depending on the PHY chip (1504) and/or the overall twisted-pair driver/receiver circuit implementation. If the isolation transformers (1503c, 1503d, 1503e, 1503f) have their center tap connections (15134, 15137, 15140, 15143) present, these may be used for a variety of functions, including (but not limited to) applying biasing conditions to the PHY chip (1504) transmitter/receiver circuitry, signal conditioning to reduce externally generated environmental noise sources from being received by the PHY chip (1504), and/or reduce internally generated noise sources from being transmitted by the host system in conjunction with the PHY chip (1504). Typically, such noise reduction could be performed using decoupling capacitors or alternative circuit techniques, not shown but well known to those of ordinary skill in the art.

Note that although all four pairs are shown on the Line Side of FIG. 14 and FIG. 15, 802.3/Ethernet implementations for 10BASE-T and 100BASE-T only require two pairs of the UTP cable and the RJ-45 connector (1402 in FIG. 14, 1502 in FIG. 15) to be present for data transmission/reception, provided via pins 1 and 2 (14120 and 14121 in FIGS. 14, 15120 and 15121 in FIG. 15), and pins 3 and 6 (14123 and 14124 in FIGS. 14, 15123 and 15124 in FIG. 15), these commonly being referred to as the "data pairs". However, since most installations use 4-pair UTP cabling, the other pairs are normally physically present in the cable, and available on the RJ-45 connector (1402 in FIG. 14, 1502 in FIG. 15), via pins 4 and 5 (14126 and 14127 in FIGS. 14, 15126 and 15127 in FIG. 15) and pins 7 and 8 (14129 and 14130 in FIG. 14, and 15129 and 15130 in FIG. 15), these commonly being referred to as the "spare pairs". PoE makes use of this fact, and the IEEE 802.3af and 802.3at Standards only specify power to be supplied on either one of the pairs, referred to as Mode A where power is supplied over the data pairs, and Mode B where power is supplied over the spare pairs. The later 802.3bt Standard for PoE allows higher power to be supplied by utilizing both the data pairs and spare pairs simultaneously to supply power. For implementation of 1000BASE-T and above, all four pairs are required for data transmission and reception. In one exemplary preferred embodiment using the Aquantia AQR112C, all four pairs are used for the 1000BASE-T, 2.5GBASE-T, 5GBASE-T and 10GBASE-T modes, as depicted in FIG. 14 and FIG. 15.

While the Isolation Magnetics Module (1403, 1503) as described in FIGS. 14 and 15 respectively, is a necessary component of the PHY-ICM for isolation of the UTP Ethernet network connection, as has been discussed, it may have different characteristics or form factors. For instance, the Isolation Magnetics Module (1403, 1503) may or may not support PoE on the Line Side transformer center tap connections. Further it may or may not require the CMC function, and if required, the CMC function may be physically separate from the isolation transformer function, and it may or may not provide the Chip Side transformer center tap connections, and if provided they may or may not require decoupling components connected; etc. One of ordinary skill would recognize that other embodiments of the isolation transformer module may be possible, but these do not detract from the overall scope of the disclosure. Note also that the isolation magnetics module may not be required at all for alternate network embodiments such as fiber optic cable interfaces.

Figure 16A:
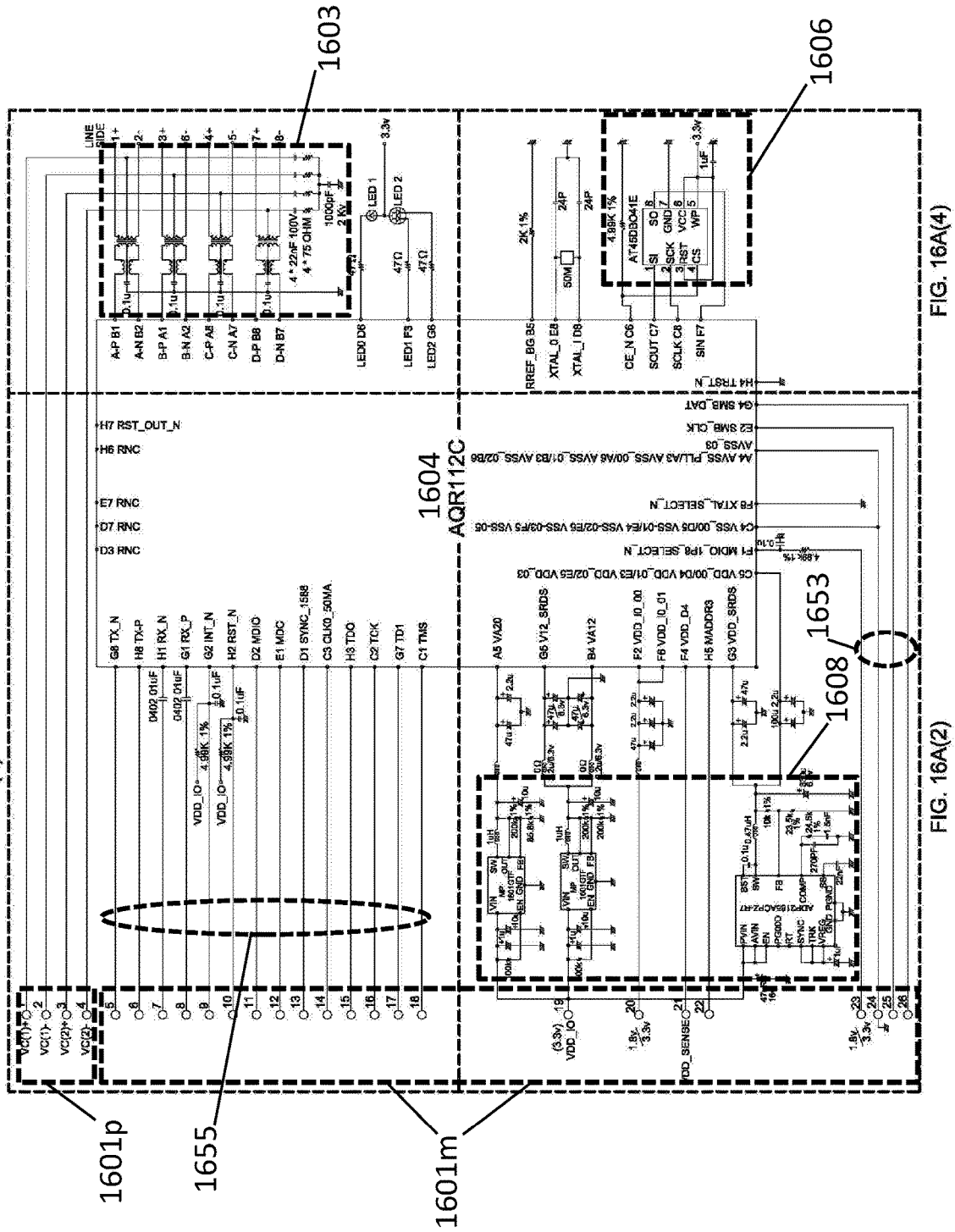
FIGS. 16A, 16B and 16C are schematics of one preferred embodiment of a modular PHY-ICM circuit.

Referring to FIG. 16A, a schematic of a representative modular PHY-ICM is shown using the one exemplary Aquantia AQR112C (1604) PHY chip. FIG. 16A is represented collectively by FIGS. 16A(1), 16A(2), 16A(3) and 16A(4). The host interface is formed by a region of interface signals (1601m) specific to the AQR112C (1604) PHY chip, as well as a region of PoE interface signals (1601p) which connect to/from the transformer center taps of the Isolation Magnetics Module (1603). The host interface signal region (1601m) is shown by way of example, and may consist of other interface signal regions, which may be associated with a particular function or feature supported by a specific PHY chip such as the AQR112C (1604), or an alternate PHY chip. For instance, PHY chip I/O and configuration signals (1655) are part of the host interface signal region (1601m) (and logically equivalent to 741-745 in FIGS. 7A, 7B and 7C, and 1855 in FIG. 18). A family of pin compatible PHY-ICM devices may require multiple interface signal regions to be defined, to support the overall host interface (not shown, see for instance regions 1301j, 1301k, 1301l and 1301m in FIG. 13 and its associated description).

Figure 16B:
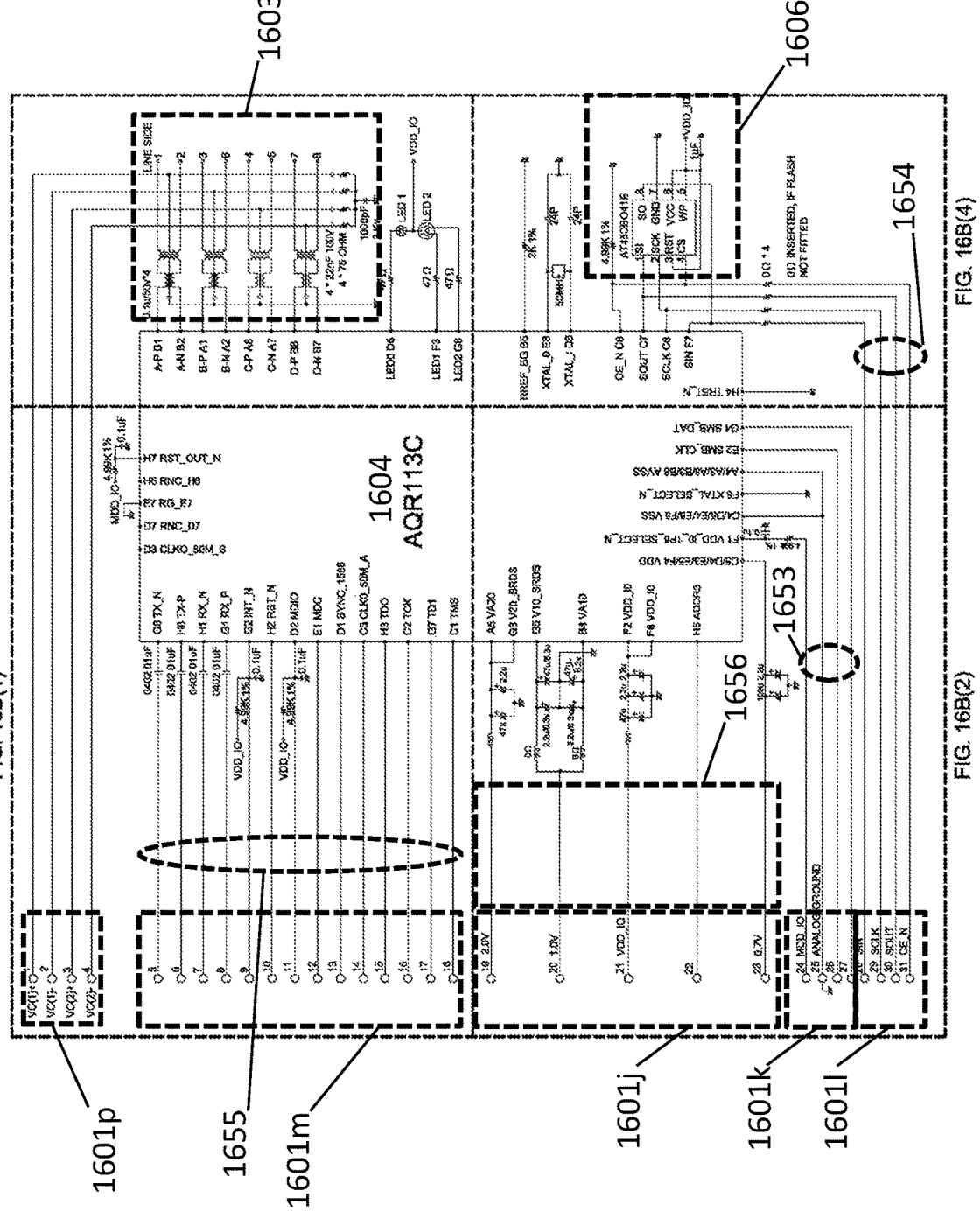
Figure 16C:
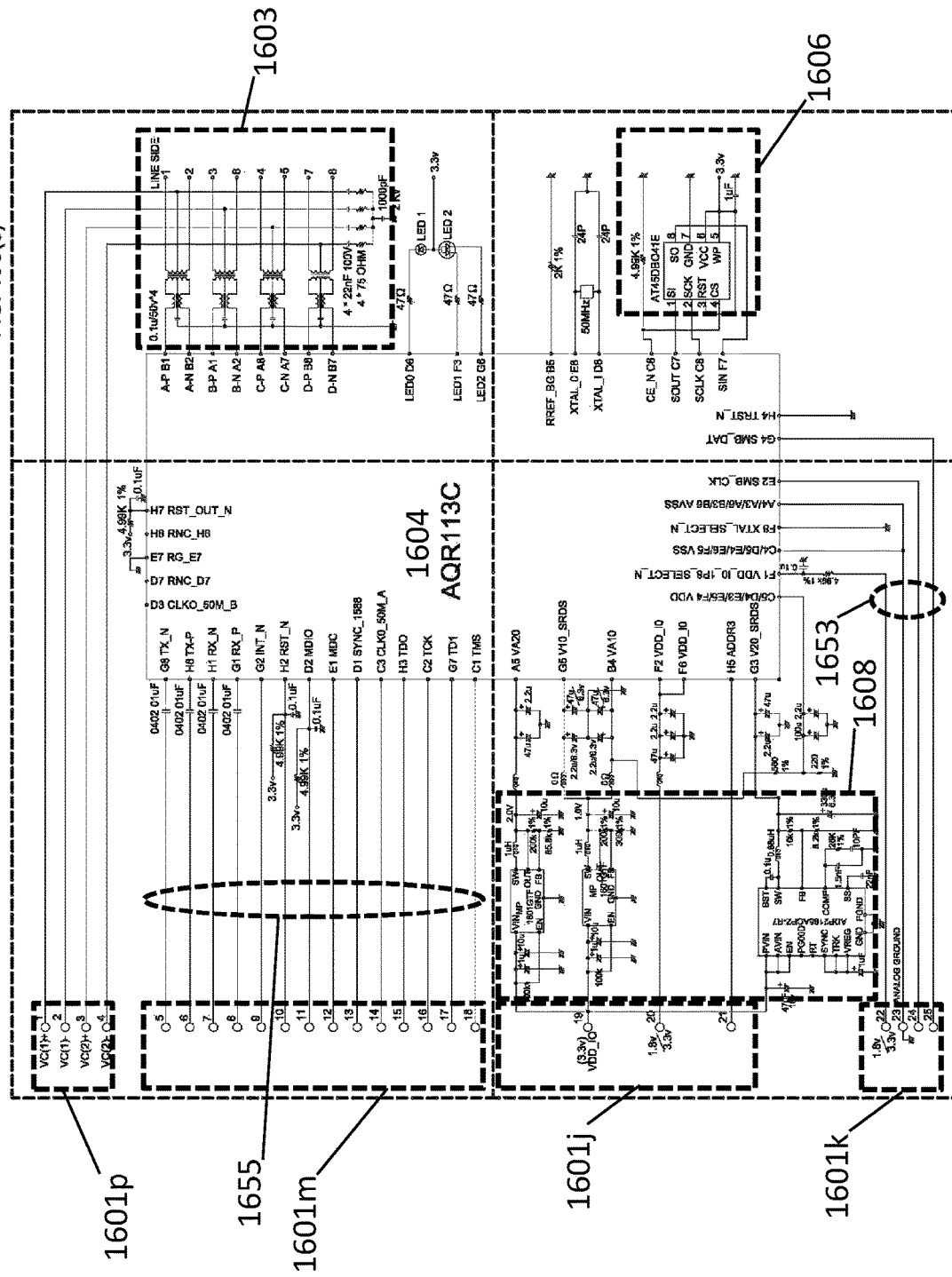

Referring to FIGS. 16B and 16C, two different schematics of a representative modular PHY-ICM are shown using another exemplary Aquantia AQR113C (1604) PHY chip. FIG. 16B is represented collectively by FIGS. 16B(1), 16B(2), 16B(3) and 16B(4). FIG. 16C is represented collectively by FIGS. 16C(1), 16C(2), 16C(3) and 16C(4). The host interface is formed by a region of interface signals (1601m) specific to the AQR113C (1604) PHY chip, a region of interface signals (1601j) specific to the SIP Power Module (1608), a region of interface signals (1601l) (present in FIG. 16B, but not in FIG. 16C) specific to the SIP Personality Module (1606), a region of interface signals (1601k) strapping options for the PHY chip (1604), as well as a region of PoE interface signals (1601p) which connect to/from the transformer center taps of the Isolation Magnetics Module (1603). The host interface signal region (1601m) is shown by way of example, and may consist of other interface signal regions, which may be associated with a particular function or feature supported by a specific PHY chip such as the AQR113C (1604), or an alternate PHY chip. For instance, PHY chip I/O and configuration signals (1655) are part of the host interface signal region (1601m) (and logically equivalent to 741-745 in FIGS. 7A, 7B and 7C, and 1855 in FIG. 18). A family of pin compatible PHY-ICM devices may require multiple interface signal regions to be defined, to support the overall host interface (not shown, see for instance regions 1301j, 1301k, 1301l and 1301m in FIG. 13 and its associated description).

In FIG. 16B, the circuit schematic has two significant changes versus FIG. 16A. The SIP Power Module (1608) functionality is removed and replaced with a SIP Bypass Module (1656), such as shown in the example of FIG. 10. The connectivity region (1601j), which is analogous to the POWER IN (746) of FIG. 7B, provides the interface to the SIP Bypass Module (1656), and the host system provides the power supplies for the PHY I.C (1604). The area associated with a SIP Personality Module (1606) is identified which includes a Flash memory, such as described in (for example) FIG. 11A and FIG. 11B. The Flash memory interface signals (1654) are connected to the connectivity region (1601l), which is analogous to the FLASH IN/OUT (754) of FIG. 7B. In this configuration, the Flash memory device can be supported to be integrated within the PHY-ICM or can be provided by an external device in the host system. In FIG. 16B, the PHY I.C. (1604) strapping signals (1653) are connected to the connectivity region (1601k), which is analogous to the STRAP IN/OUT (753) of FIG. 7B.

In FIG. 16C, the circuit schematic has two significant changes versus FIG. 16B. The area associated with a SIP Power Module (1608) is also identified, which includes three voltage regulators, such as described in (for example) FIG. 9. The SIP Power Module (1608) is connected to the connectivity region (1601j), which is analogous to the POWER IN (746) of FIG. 7B. The area associated with a SIP Personality Module (1606) is identified which includes a Flash memory, such as described in (for example) FIG. 11A and FIG. 11B. The Flash memory interface signals (1654) are connected to the PHY I.C. (1604), but the connectivity region (1601l) of FIG. 16B is deleted. In FIG. 16C, similarly to FIG. 16B, the PHY I.C. (1604) strapping signals (1653) are connected to the connectivity region (1601k), which is analogous to the STRAP IN/OUT (753) of FIG. 7B.

The FIGS. 16A, 16B and 16C, each clearly demonstrates the ability to configure the PHY-ICM module for different options during manufacturing.

The area associated with a SIP Personality Module (1606) is identified, which includes a Flash memory, such as described in (for example) FIG. 11A and FIG. 11B. The area associated with a SIP Power Module (1608) is also identified, which includes three voltage regulators, such as described in (for example) FIG. 9.

While the schematics of FIGS. 16A, 16B and 16C, do not explicitly identify all of the jumpers and/or connection sites to accommodate a SIP Personality Module (1606) or SIP Power Module (1608), one of ordinary skill in the art would recognize that incorporation of the techniques in FIGS. 8 through 12 and their associated descriptions, would allow a modular PHY-ICM to be implemented, which could optionally accommodate such SIP Modules at final assembly time. In addition, FIGS. 13A and 13B and their associated descriptions explain how specific connectivity regions can be defined for the host interface (see for instance regions 1301$j$, 1301$k$, 1301$l$ and 1301$m$), a SIP Personality Module (1606), or a SIP Power Module (1608) (see for instance regions 1301$h$ and 1301$i$). Further, FIG. 14 and FIG. 15 and their associated descriptions explain how different Isolation Magnetics Modules (1603) may be selected and/or configured, including the ability to operate as a device with or without the PoE capability, configure the BST circuit appropriately, and/or select transformer windings appropriate to the PoE power rating. Referring to FIGS. 17A through 17F, the construction of a modular PHY-ICM (1700) based on a SIP Transceiver Module is described. These examples incorporate the SIP Transceiver Module (1720), together with a transformer isolation module (1703$c/d/e/f$), a common mode choke module (1703$g/h/i/j$), as well as additional electronic components (1705) (such as resistors, capacitors, inductors, etc.), and LEDs (1715), all mounted on the PHY-ICM baseboard (1701) or substrate.

FIG. 17A shows a simple two dimensional view of the PHY-ICM (1700) finished product appearance, with the RJ-45 connector (1702) at the front of the module, and the two-part metal shielding case (1710) which encloses the module.

Figure 17C:
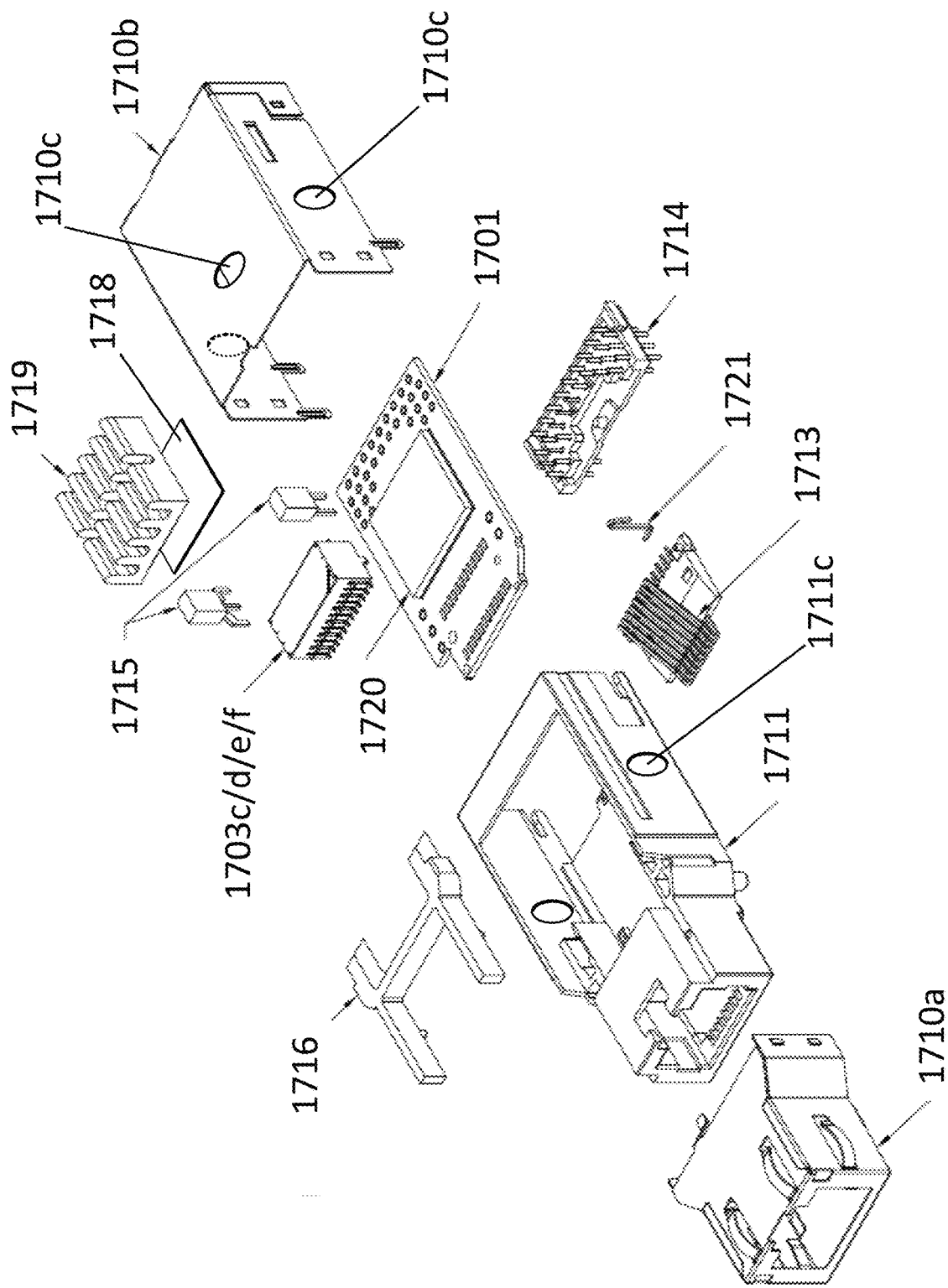

FIG. 17B shows an exploded view of the main component sub-assemblies of the PHY-ICM. Front shielding case (1710$a$) and rear shielding case (1710$b$) form the two-part metal shielding case (1710) depicted in FIG. 17A which encloses the module. Plastic housing (1711) provides a mechanical structure upon and within which the overall module is assembled, and provides the physical enclosure for the RJ-45 connector (1702) of FIG. 17A. PCB assembly (1712) contains essentially all of the electrical components and connections, as described in more detail in FIG. 17C.

FIG. 17C primarily shows additional detail of the PCB assembly (1712) of FIG. 17B, while front shielding case (1710$a$), rear shielding case (1710$b$), and plastic housing (1711) are identical to those described in FIG. 17B.

Note that in this embodiment, the Isolation Magnetics Module (1403 in FIG. 14, and 1503 in FIG. 15, and as detailed in their associated descriptions) is separated into two functions. These comprise of a transformer isolation module (1703$c/d/e/f$), mounted on the top side of the baseboard (1701), and a common mode choke (CMC) module (1703$g/h/i/j$), mounted on the bottom side of the baseboard (1701) (not visible in FIG. 17C, but detailed in FIGS. 17E and 17F).

The PCB assembly (1712) is composed of a baseboard (1701) on which various components and sub-assemblies are mounted. These include components such as the additional electronic components (1705) (not visible in FIG. 17C, since in this embodiment they are mounted on the bottom side of baseboard (1701), shown in FIGS. 17E and 17F), and LEDs (1715); as well as sub-assemblies for the SIP Transceiver Module (1720), transformer isolation module (1703$c/d/e/f$), RJ-45 contacts assembly (1713), and solder tail (1714). RJ-45 contacts assembly (1713) is soldered to the baseboard (1701) and projects out and into the plastic housing (1711) to form the finished RJ-45 connector (1702) of FIG. 17A, once fully assembled. Solder tail (1714) is also electrically connected (soldered or press fitted, for example) to the baseboard (1701) and contains the physical interface pins (or connectivity sites) that provide the electrical connection between the fully assembled PHY-ICM (1700) and the system application board (not shown). Transformer isolation module (1703$c/d/e/f$) together with CMC module (1703$g/h/i/j$), provide the required electrical isolation and EMI/RFI suppression. Light pipe (1716) is also shown, which allows light to be transferred from the site of the LEDs (1715) mounted on the baseboard (1701) to the front face of the RJ-45 connector (1702), such that the status of the Ethernet port can be viewed from the front panel of the networking equipment.

A grounding pin (1721) is used to provide electrical coupling between the combined front shielding case (1710$a$) and rear shielding case (1710$b$) to a suitable protective ground connection provided by the system application board.

An optional heatsink (1719) component is shown, together with its associated thermal bonding material (1718), which allows additional cooling to be provided to the SIP Transceiver Module (1720) under certain configurations and/or conditions. Additionally, optional cooling vents (1710$c$, 1711$c$) are shown in the rear shielding case (1710$b$), and plastic housing (1711) respectively. The innovative aspects of the modular Thermal Management Subsystem are discussed in additional detail in the descriptions of FIG. 17C and FIG. 19 below.

FIGS. 17D, 17E and 17F show respectively top, side and bottom views of part of the PCB assembly (1712). In these views, the RJ-45 contacts assembly (1713), and solder tail (1714) as shown in FIG. 17C, are omitted.

Referring to the top view of FIG. 17D, the baseboard (1701) is shown with the isolation transformer module (1703$c/d/e/f$), and LEDs (1715), mounted on it. The vacant through-hole connectivity sites (1701$d$) for the host interface are shown in the absence of the solder tail (1714).

Referring to the side view of FIG. 17E, the baseboard (1701) is shown with the isolation transformer module (1703$c/d/e/f$), and LEDs (1715), mounted on the top side, and additional electronic components (1705), and CMC module (1703$g/h/i/j$), mounted on the bottom side.

Referring to the bottom view of FIG. 17F, the baseboard (1701) is shown with the CMC module (1703$g/h/i/j$) mounted on it, together with additional electronic components (1705), which in this non-limiting embodiment are shown soldered only to the bottom side of the baseboard (1701). The vacant through-hole connectivity sites (1701$d$) for the host interface are shown in the absence of the solder tail (1714). In addition, the vacant SMT connectivity sites/region (1701$f$) for the RJ-45 connector are shown in the absence of the RJ-45 contacts assembly (1713), which connects via PCB traces to the separate isolation transformer module (1703$c/d/e/f$) and CMC module (1703$g/h/i/j$), as also shown in the connectivity region identified by the dotted area (1301*f*) in FIGS. 13A and 13B, and their associated descriptions.

It should be noted that the following differences exist between the PCB assembly in FIGS. 1A through 1F and FIGS. 17A through 17F, versus the PHY-ICM baseboard assembly of FIGS. 3, 4, 5 and 6:

1. The solder tail (114 in FIG. 1C, 1714 in FIG. 17C) is shown connected to the PCB assembly (112 in FIG. 1B, 1712 in FIG. 17B), but is not shown on the PHY-ICM baseboard assembly (300, 400, 500, 600).
2. Only the RJ-45 contacts assembly (113 in FIG. 1C, 1713 in FIG. 17C) is shown on the PCB assembly (112 in FIG. 1B, 1712 in FIG. 17B), but the complete RJ-45 connector (302, 402, 502, 602) is shown on the PHY-ICM baseboard assembly (300, 400, 500, 600).
3. LEDs (115 in FIG. 1C, 1715 in FIG. 17C) are shown on the PCB assembly (112 in FIG. 1B, 1712 in FIG. 17B), but no LEDs are shown on the PHY-ICM baseboard assembly (300, 400, 500, 600).
4. Individual SIP modules are not shown on FIG. 1C, and the SIP Transceiver Module (1720) is shown on FIGS. 17C, 17D and 17E, whereas electrical connection sites (301*a*, 401*a*, 501*a*, 601*a*, and 301*b*, 461*b*, 501*b* and 601*b*) to support two separate SIP modules are shown on the PHY-ICM baseboard assembly (300, 400, 500, 600).
5. Additional electronic components (105 in FIG. 1F, 1705 in FIGS. 17E and 17F) are shown mounted on the bottom side of the PCB assembly (112 in FIG. 1F, 1712 in FIGS. 17E and 17F, versus only on the top side a the PHY-ICM baseboard assembly (300, 400, 500, 600).

Figure 18:
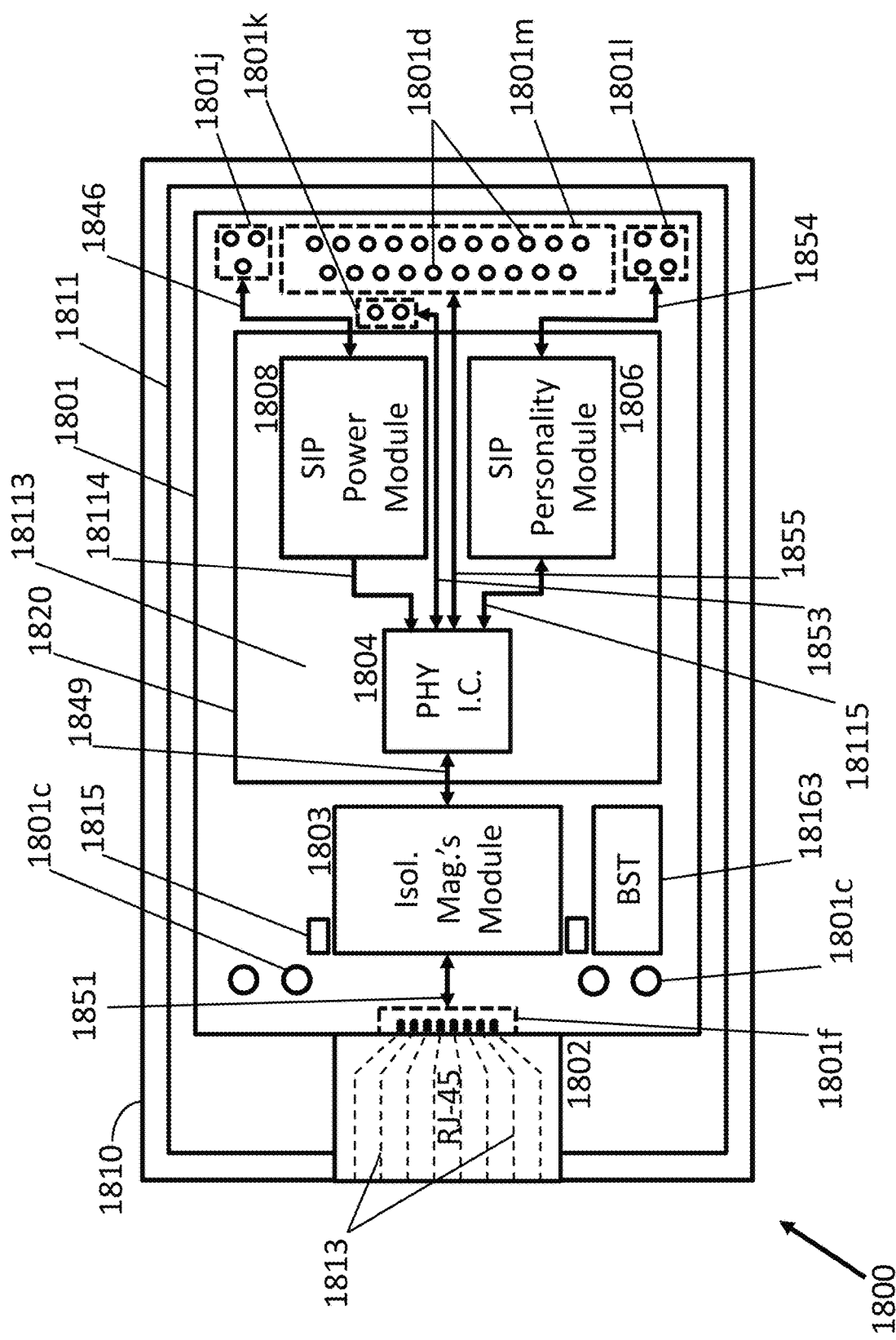
FIG. 18 shows an electrical and mechanical block diagram representing the primary components, construction and interconnections of a modular PHY-ICM, implemented using a integrated SIP Transceiver Module.

Referring to FIG. 18, the implementation of a modular PHY-ICM (1800) based on a highly integrated SIP Transceiver Module (1820) is defined, in terms of the major mechanical, electrical, and connectivity components. An external two-part metal shielding case (1810) encloses the PHY-ICM (1800), module, enclosing the plastic housing (1811) cage, upon and within which the other mechanical and electrical sub-assemblies are mounted.

A UTP cable and RJ-45 plug (as shown in 123 and 122 of FIG. 1A) would be inserted into the RJ-45 connector (1802) of the PHY-ICM (1800) to provide the network data in/out connectivity. The RJ-45 connector (1802) is composed of the molded front section of plastic housing (1811) and the internal RJ-45 contacts assembly (1813), which in turn connects to connectivity sites/region (1801*f*) on the baseboard (1801), and via four bi-directional differential pairs (1851) to the Isolation Magnetics Module (1803).

The BST circuit (18163) block incorporates the components and connectivity as previously described in FIG. 14 or FIG. 15, for the transformer center tap connections (14122, 14125, 14128, 14131, or 15122, 15125, 15128, 15131, respectively). In the case PoE is not supported, these would include the jumper bank (14144), shorting links (14155-14158) inserted in each of the connecting links (14145-14148), 75Ω resistors (14149-14152), a common connection (14153) and a 1000 pF capacitor (14154) to ground. In the case PoE is supported, these would include the jumper bank (15144), 22 pF capacitors (15159-15162) inserted in each of the connecting links (15145-15148), 75Ω resistors (15149-15152), a common connection (15153) and a 1000 pF capacitor (15154) to ground.

One of ordinary skill would recognize that the BST circuit (18163) can simply be configured at final assembly by selection of whether shorting links (14155-14158) as in the case of FIG. 14, or 22 nF capacitors (15159-15162) as in the case of FIG. 15, are inserted into the jumper bank (14144 or 15144 respectively).

The BST circuit (18163) is shown mounted on the baseboard (1801), since the high voltage isolation requirements typically mandate large components (such as the 1000 pF 2 kV capacitor (14154, 15154)) and wide PCB trace spacing, not well suited to the miniaturization typically employed in the SIP Transceiver Module (1820). However, providing the required isolation breakdown voltages can be maintained, there is no restriction on BST circuit (18163) component placement. The BST circuit (18163) and the Isolation Magnetics Module (1803) are implemented in concert with each other, and they may be separate entities or integrated in any way, such as into a single Isolation Magnetics Module (103) as shown in the prior art of FIG. 1C. Any integration between the BST circuit (18163) and the Isolation Magnetics Module (1803) is both contemplated and fully anticipated.

The Isolation Magnetics Module (1803) is also selected appropriately at final assembly, in terms of transformer wire gauge, depending on whether PoE is not supported, or is supported, In the case PoE is supported, the PoE standard (802.3af, 802.3at, or 802.3bt) dictates the power requirement and maximum current capability, and hence the transformer wire gauge.

In the case that the selected Isolation Magnetics Module (1803) and BST circuit (18163) support PoE, the four connectivity sites (1801*c*) would be populated with pins which would protrude from the bottom of the baseboard (1801) and out of the PHY-ICM (1800) to connect PoE power to the host system application board (not shown). In the case that the selected Isolation Magnetics Module (1803) and BST circuit (18163) do not support PoE, the four connectivity sites (1801*c*) would remain unpopulated and there would be no PoE power connection from the bottom of the baseboard (1801) to the host system application board (not shown).

LEDs (1815) for network status indication are shown located directly above and below the Isolation and Magnetics Module (1803), but their actual position is irrelevant to the overall design or functionality.

The SIP Transceiver Module (1820) is mounted on its own separate carrier circuit (18113). Four bi-directional differential pairs (1849) connect the Isolation Magnetics Module (1803) located on the baseboard (1801), via the carrier circuit (18113), to the PHY I.C. (1804) located in the SIP Transceiver Module (1820). The PHY I.C. (1804) has multiple additional electrical connections to support its configuration, management, programming and status, of which only four interfaces (1853, 1855, 18114 and 18115) are explicitly shown in FIG. 18.

Individual connection sites (1801*d*) on the host interface are grouped into a connectivity region (1801*m*), common to a family of PHY-ICM versions, and include one or more voltage inputs (1846) to the SIP Power Module (1808), host interface I/O (1854) to/from the SIP Personality Module (1806), and the PHY chip I/O and configuration signals (1855) (logically equivalent to 1655 in FIGS. 16A, 16B and 16C) to/from the PHY I.C. (1804). A number of additional connectivity regions (1801*j*, 1801*k*, 18011) may also be defined on the host interface, which are associated with additional features or options, or to support the functionality of an alternate PHY I.C. (1804) manufacturer. In this way, a family of PHY-ICM devices can be produced which conform to a baseline and extended feature set and a common host interface footprint. In this example, specific host interface configuration signals (1853) are connected to connectivity region (1801k) to/from the PHY I,C, (1804), and can be used to programmable features of the device (see for example 753 in FIGS. 7B and 7C, or 1653 in FIGS. 16B and 16C).

The SIP Power Module (1808) contains the functionality as described in FIG. 8 and FIG. 9, and their associated descriptions, but in this case, the functionality is subsumed and integrated within the SIP Transceiver Module (1820) and is not implemented as a separate module. The SIP Power Module (1808) function receives one or more supply voltages (1846) from the host interface, via a connectivity region (1801j). The SIP Power Module (1808) function develops one or more voltage outputs (18114) which power the various internal PHY I.C. (1804) circuits and any additional circuits on the PHY-ICM baseboard (1801). One of ordinary skill in the art would understand that a SIP Bypass Module (not shown, see 1056, in FIG. 10 and its accompanying description for additional detail) function, could be used to replace the SIP Power Module (1808) function, or any hybrid arrangement could be used, such that the various internal voltages required by the PHY-ICM baseboard (1801) can be generated through a combination of supplies from the host interface, or developed by regulators on the SIP Power Module (1808) function.

Note that the one or more supply voltages (1846) from the host interface to the SIP Power Module (1808) function contained within the SIP Transceiver Module (1820), are logically equivalent to the connections from the host interface to the SIP Power Module as shown previously (see for example 746 in FIGS. 7A, 7B and 7C, or 967, 968, 969 and 970 in FIG. 9, or 1067, 1068, 1069 and 1070 in FIG. 10). Similarly, the one or more voltage outputs (18114) from the SIP Power Module (1808) function contained within the SIP Transceiver Module (1820) to the PHY IC. (1804), are logically equivalent to the connections from the SIP Power Module to the PHY IC. as shown previously (see for example 747 in FIGS. 7A, 7B and 7C, or 971, 972, 973 in FIG. 9, or 1071, 1072, 1073 in FIG. 10).

The SIP Personality Module (1806) contains the functionality as described in FIGS. 11A, 11B and 12, and their associated descriptions, but in this case, the functionality is subsumed and integrated within the SIP Transceiver Module (1820) and is not implemented as a separate module. The SIP Personality Module (1808) function may have host interface I/O connectivity (1854), via a connectivity region (18011), PHY chip I/O connectivity (18115), or both. The SIP Personality Module (1806) may contain components such as but not limited to, Flash memory, logic functions, and/or pin strapping options to configure the PHY I.C. (1804) or the PHY-ICM (1800). Additionally, I/O signals to/from the PHY I.C. (1804) and/or the host interface may be used by the logic function to modify the configuration or state of the PHY-ICM (1800). One of ordinary skill in the art would understand that a SIP Bypass Module (not shown, see FIGS. 11A, 11B and 12, and their associated descriptions) function, could be used to replace the SIP Personality Module (1806) function, such that the various I/O signals required by the PHY-ICM (1800) and the host interface can be generated.

Note that the host interface I/O connectivity (1854) between the host interface and the SIP Personality Module (1806) function contained within the SIP Transceiver Module (1820), is logically equivalent to the connections between the host interface and the SIP Personality Module as shown previously (see for example 754 in FIGS. 7B and 7C, or 1184, 1185, 1186 and 1187 in FIGS. 11A and 11B, or 12104, 12105, 12106 and 12107 in FIG. 12). Similarly, the PHY chip I/O connectivity (18115) between the SIP Personality Module (1806) function contained within the SIP Transceiver Module (1820) and the PHY IC. (1804), is logically equivalent to a hybrid of the connections between the SIP Personality Module and the PHY IC. as shown previously (see for example 754 in FIGS. 7B and 7C, 1188, 1189, 1190 and 1191 in FIGS. 11A and 11B, or 12108, 12109, 12110 and 12111 in FIG. 12).

With the SIP Transceiver Module (1820) approach, a change of PHY I.C. (1804) may not mandate a change to the host interface footprint of the PHY-ICM, or the PHY-ICM baseboard (1801). The carrier circuit (18113) of the SIP Transceiver Module (1820) can act as an adaptor, to accommodate the differences between PHY chip pin outs, external components and layout, such that signals are routed to a common footprint shared between the carrier circuit (18113) and the baseboard (1801). While this potentially means a different carrier circuit (18113) for the SIP Transceiver Module (1820) would be required to support each different PHY I.C. (1804), this still significantly assists in reducing the overall parts and inventory count, and can permit PHY vendor independence.

A further advantage of the SIP Transceiver Module (1820) approach is that it can be used to mitigate the cost burden of the fine pitch PCB geometries typically imposed by the BGA packages employed by the PHY I.C. (1804) (or Flash memory, logic and/or other components, if applicable). While the carrier/substrate of the SIP Transceiver Module (1820) must accommodate the more aggressive PHY I.C. (1804) package connectivity geometry, there is no reason to impose this on the entire PHY-ICM baseboard (1801) PCB. As an example, the package for the Aquantia AQR112C PHY chip is a 64 pin BGA, based on a 0.8 mm (0.031 inch) ball pitch. Once again, the carrier circuit (18113) of the SIP Transceiver Module (1820) can act as an adaptor, and the common footprint shared between the carrier circuit (18113) and the baseboard (1801) can be implemented with a less aggressive interconnect geometry. This may, for instance, allow the baseboard (1801) to be routed in a reduced number of PCB layers (such as a 2-layer board), and more suitable to the connectivity geometry of other components such as the Isolation Magnetics Module (1803), and not require the entire PHY-ICM baseboard (1801) design and cost to be dictated by the more aggressive PHY I.C. (1804) package connectivity geometry.

Any suitable interconnect technology may be used to implement the placement of chips and/or components onto the SIP Transceiver Module (1820) carrier circuit (18113), such as, but not limited to, SMT, BGA, flip chip, flatpack, wire bonding, die attach/bonding, etc. Similarly, any common carrier circuit (18113) to baseboard (1801) interconnect technology may be used between the SIP Transceiver Module (1820) and the baseboard (1801), such as, but not limited to, through-hole, SMT, BGA, die attach/bonding, etc.

The placement of the component sub-assemblies of FIG. 18 are intended to be non-limiting. One of ordinary skill in the art would understand that components may be placed on both sides of the baseboard (1801), and that other components such as resistors, capacitors, inductors, diodes, jumpers, connectors, etc., would be required but have been omitted for clarity.

Referring to FIG. 17C and FIG. 19, various elements of a Thermal Management Subsystem are defined for the modular PHY-ICM, to suit differing system application designs, provide a flexible and cost effective range of solutions to manage the heat dissipation of the modular PHY-ICM, and allow the thermal performance to be configured at final assembly of the PHY-ICM.

Referring initially to FIG. 17C, a heatsink (1719) is shown which would be physically attached to the SIP Transceiver Module (1720), in cases where the thermal dissipation warrants it, such as overall power dissipation of the PHY chip at a certain data rate and/or condition. A thermal bonding material (1718), such as thermal adhesive or tape, may be used to maximize the heat transfer from the SIP Transceiver Module (1720) to the heatsink (1719). In addition, for system applications that provide additional air circulation, cooling vents (1710c, 1711c) may be added to the rear shielding case (1710b) and/or plastic housing (1711) respectively, to allow external air flow through the PHY-ICM. Cooling vents (1710c) may be positioned anywhere on the side or top surfaces of the rear shielding case (1710b), and depending on their location may require corresponding cooling vents (1711c) to be added in the plastic housing (1711). While cooling vents (1710c) are only shown on the rear shielding case (1710b), one of ordinary skill in the art would recognize that in different embodiments of the two-part metal shielding case (1710), such as placing the cooling vents (1710c, 1711c) in alternate locations on the rear or front shielding case (1710a, 1710b), or varying the different size and/or shape, may yield superior cooling results. In an alternate embodiment, a heatsink (1719) of appropriate physical dimensions, physically and/or thermally attached to the SIP Transceiver Module (1720), may additionally be thermally attached to any part of the shielding case (1710), front shielding case (1710a), or rear shielding case (1710b), in order to provide additional thermal dissipation to any of the circuits enclosed within the PHY-ICM (1700).

Referring to FIG. 19A through FIG. 19D, two alternate Thermal Management Subsystem implementations are shown, utilizing the rear shielding as a built-in heatsink. In this case, no explicit heatsink (such as 1719) needs to be added and/or thermally bonded to the PHY chip or the SIP Transceiver Module. Rather, the exiting rear shielding is redesigned to make contact with the PHY chip, and is repurposed to act as a heatsink.

Figure 19A:
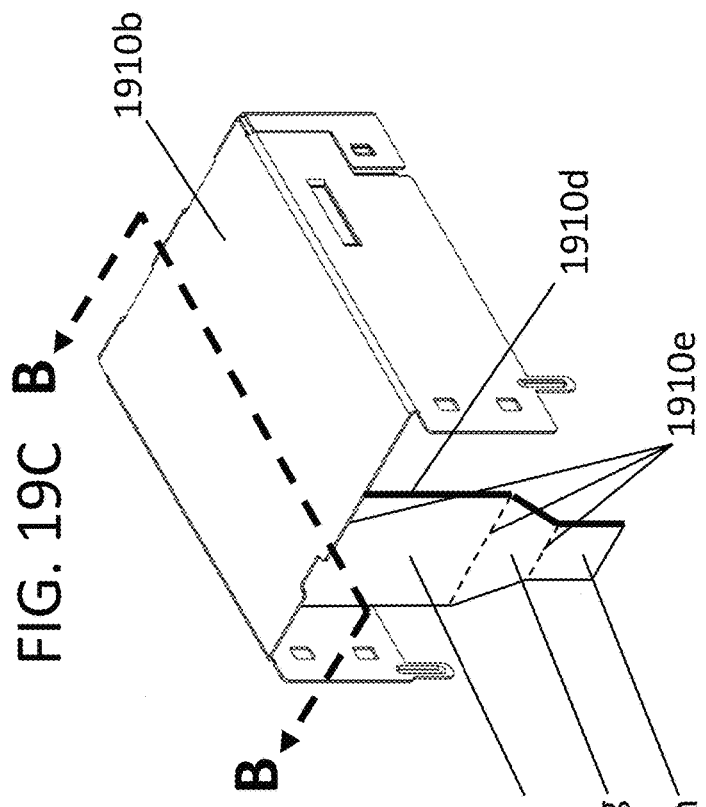
FIG. 19A through FIG. 19D show respectively mechanical and cross sectional examples of a first and second modification to the construction of the modular PHY-ICM, to allow enhanced thermal dissipation.
Figure 19B:
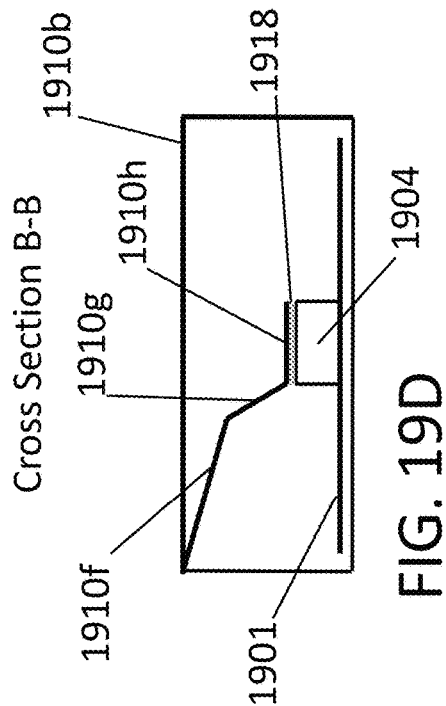

FIG. 19A shows a two-dimensional drawing, and FIG. 19B shows a corresponding cross sectional view (A-A) of an embodiment where two additional "side wings" (1910d) are added to the metal case of the rear shielding (1910b). These are formed along bend lines (1910e) such that they create a three-faced (1910f, 1910g, 1910h) spring loaded assembly which applies downward pressure on the PHY chip (1904) once final assembly is complete. Thermal bonding material (1918) such as thermal adhesive, tape or paste, may be used to maximize the thermal transfer between the bottom face (1910h) of the side wings (1910d), which make thermal contact with the PHY chip (1904), which is mounted on the baseboard (1901).

Figure 19C:
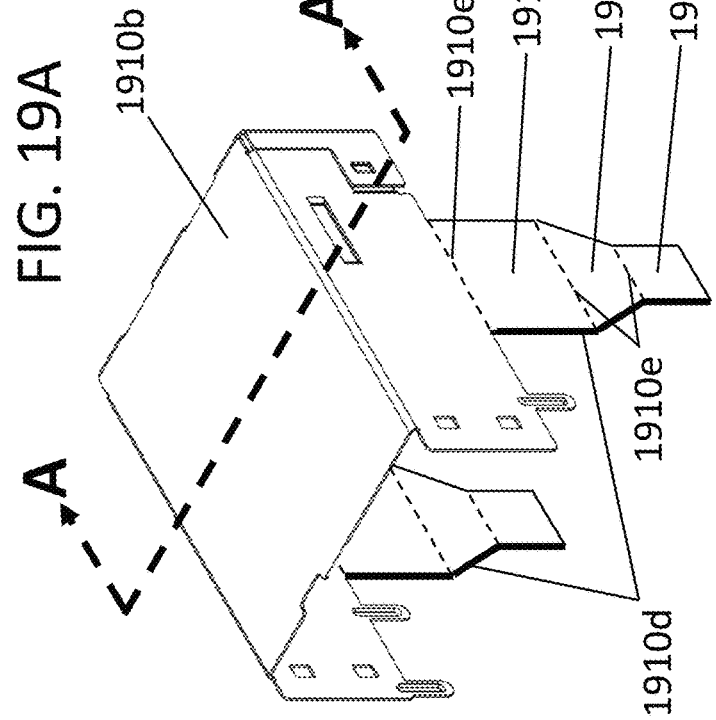
Figure 19D:
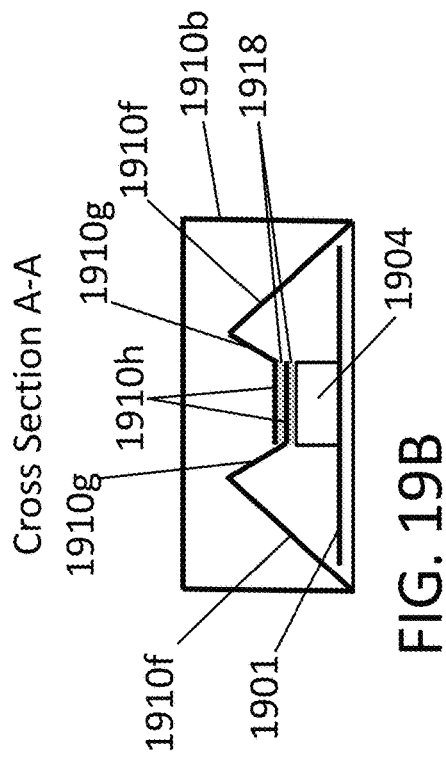

FIG. 19C shows a two-dimensional drawing, and FIG. 19D shows a corresponding cross sectional view (B-B) of an alternate embodiment where a single additional "front wing" (1910d) is added to the metal case of the rear shielding (1910b). This is formed along bend lines (1910e) such that it creates a three-faced (1910f, 1910g, 1910h) spring loaded assembly which applies downward pressure on the PHY chip (1904) once final assembly is complete. Thermal bonding material (1918) such as thermal adhesive, tape or paste, may be used to maximize the thermal transfer between the bottom face (1910h) of the front wing (1910d), which make thermal contact with the PHY chip (1904), which is mounted on the baseboard (1901).

In FIG. 19B and FIG. 19D, the PHY chip (1904) is shown mounted on the baseboard (1901). However, in an alternative embodiment, the SIP Transceiver Module (1820) with its carrier circuit (18113) arrangement, as shown in FIG. 18, could be disposed on the baseboard (1901), instead of the PHY chip (1904). In this case, the bottom face (1910h) of the side wings or front wing (1910d) may make thermal contact with the top surface of the SIP Transceiver Module (1820), or directly with the PHY chip (1904), if exposed, and the surface area of the bottom face (1910h) of the side wings or front wing (1910d) may be adjusted accordingly.

One of ordinary skill in the art would recognize that other configurations and/or combinations of the thermal management techniques disclosed in FIG. 17C and FIG. 19A through FIG. 19C may be made. These include, but are not limited to, the size and shape of a physical heatsink (1719) attached to the PHY chip or the SIP Transceiver Module, or thermal connection of the physical heatsink (1719) to the two-part metal shielding case (1710a, 1710b). These also include the number, shape, size and location of cooling vents (1710c, 1711c), side wings or front wing (1910d), or any other thermal connection to the rear shielding (1910b), including different configurations of the two-part metal shielding case (1710) the front shielding (1910a), rear shielding (1910b), or any other configuration of metal case that substantially surrounds the PHY-ICM function.

As described, one of ordinary skill in the art would recognize that a modular PHY-ICM device can be defined to allow a wide range of flexible options, requiring only a modest number of different sub-assemblies. Such flexibility includes, but is not limited to:

1. Changing the manufacturer or version of the PHY chip that the PHY-ICM is based upon.
2. Selection of whether the voltages to operate the PHY-ICM circuits are generated on-board, off-board, or a combination of both.
3. Selection of whether Flash memory is located on-board or off-board the PHY-ICM.
4. Selection of whether input configuration to or output status information from the PHY-ICM is generated by the host interface, logic internal or external to the PHY-ICM, the PHY chip, or some combination of these.
5. Selection of whether PoE is supported or not, and if supported, what maximum power level is provisioned.
6. Ability to provide a common host interface footprint to support a specific family of PHY-ICM products, based on the same PHY chip or an alternate PHY chip.
7. Selection of thermal management dependent on the maximum data rate and/or worst case power dissipation of the overall PHY-ICM.

As described by the exemplary embodiments above, a modular PHY-ICM may have functionality added or not added at final assembly. Such functionality may be provided on a SIP Module with a specific function, including a bypass function. Functionality may be optionally added, deleted, modified or relocated, by links, jumpers and/or components that are selectively implemented on one or more SIP Modules and/or the baseboard. Functionality may be integrated on an individual SIP Module, the baseboard, or a more integrated SIP Module may subsume some part of the functionality and/or connectivity of both another SIP Module, bypass function and/or the baseboard.

Different PHY chips can be accommodated, and allow a family of PHY-ICM devices to share a common host interface, with different interface regions associated with specific features or functions. Different functionality can be integrated into the PHY-ICM device or relocated to elsewhere in the system application. Different PoE capabilities can be provisioned, with the appropriate isolation magnetics, signal conditioning and terminations selected for optimal EMI/RFI performance. All this can be accomplished with a minimal number of components and/or sub-assemblies, and selected at final assembly time.

While the invention has been described with reference to preferred embodiments, it is to be understood that the invention is not intended to be limited to the specific embodiments set forth above. Thus, it is recognized that those skilled in the art will appreciate that certain substitutions, alterations, modifications, and omissions may be made without departing from the spirit or intent of the invention.

Accordingly, the foregoing description is meant to be exemplary only, the invention is to be taken as including all reasonable equivalents to the subject matter of the invention, and should not limit the scope of the invention set forth in the accompanying claims.

The present disclosure has been described in particular detail with respect to possible embodiments. Those skilled in the art will appreciate that the disclosure may be practiced in other embodiments. The particular naming of the components, capitalization of terms, the attributes, data structures, or any other programming or structural aspect is not mandatory or significant, and the mechanisms that implement the disclosure or its features may have different names, formats, or protocols. The particular division of functionality between the various systems components described herein is merely example and not mandatory; functions performed by a single system component may instead be performed by multiple components, and functions performed by multiple components may instead be performed by a single component.

In various embodiments, the present disclosure can be implemented as a system or a method for performing the above-described techniques, either singly or in any combination. The combination of any specific features described herein is also provided, even if that combination is not explicitly described.

As used herein, any reference to "one embodiment" or to "an embodiment" means that a particular feature, structure, or characteristic described in connection with the embodiments is included in at least one embodiment of the disclosure. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The terms "a" or "an," as used herein, are defined as one as or more than one. The term "plurality," as used herein, is defined as two or as more than two. The term "another," as used herein, is defined as at least a second or more.

An ordinary artisan should require no additional explanation in developing the methods and systems described herein but may find some possibly helpful guidance in the preparation of these methods and systems by examining standardized reference works in the relevant art.

While the disclosure has been described with respect to a limited number of embodiments, those skilled in the art, having benefit of the above description, will appreciate that other embodiments may be devised which do not depart from the scope of the present disclosure as described herein. It should be noted that the language used in the specification has been principally selected for readability and instructional purposes, and may not have been selected to delineate or circumscribe the inventive subject matter. The terms used should not be construed to limit the disclosure to the specific embodiments disclosed in the specification and the claims, but the terms should be construed to include all methods and systems that operate under the claims set forth herein below. Accordingly, the disclosure is not limited by the disclosure, but instead its scope is to be determined entirely by the following claims.

What is claimed and desired to be secured by Letters Patent of the United States is:

1. An integrated Ethernet connector having one or more interface ports, comprising:

a first interface port for providing a network connection;

a first circuit board, coupled to the first interface port, for coupling of a plurality of components and sub-assemblies, the first circuit board comprising a first Ethernet physical layer circuit, the first circuit board including an electrical interface for coupling to a host networking device, the electrical interface having at least one common region;

one or more second circuits electrically coupled to the first circuit board to identify a specific set of functions, the first circuit board and the one or more second circuit are separated into one or more regions; and a metal shielding case surrounding the first circuit board and sub-assemblies.

2. The Ethernet connector of claim 1, where the electrical interface comprises at least a portion of a common region and one or more unique regions.

3. The Ethernet connector of claim 2, further comprising a first Ethernet physical layer circuit, and utilizing at least a portion of the common region and one or more unique regions of the electrical interface to the host-networking device.

4. The Ethernet connector of claim 2, further comprising a second Ethernet physical layer circuit, and utilizing at least a portion of the common region and one or more unique regions of the electrical interface to the host-networking device.

5. The Ethernet connector of claim 1, wherein said second circuit board comprises an Ethernet physical layer circuit.

6. The Ethernet connector of claim 1, wherein said second circuit board comprises a voltage regulation circuit.

7. The Ethernet connector of claim 1, wherein said second circuit board comprises a memory circuit.

8. The Ethernet connector of claim 1, wherein said second circuit board comprises a logic circuit.

9. The Ethernet connector of claim 1, wherein said second circuit board comprises a monitoring circuit.

10. The Ethernet connector of claim 1, wherein said second circuit board comprises a bypass circuit.

11. The Ethernet connector of claim 1, further comprising a line isolation magnetics and termination components, coupled to the circuit board, which prevents power to be either sourced or received over the Ethernet network.

12. The Ethernet connector of claim 1, further comprising a line isolation magnetics and termination components, coupled to the first circuit board, to enable power to be either sourced or received over the Ethernet network.

13. The Ethernet connector of claim 1, further comprising a heatsink component thermally attached to an Ethernet physical layer circuit.

14. The Ethernet connector of claim 1, further comprising a heatsink component thermally attached to an Ethernet physical layer circuit and connected to the external case of the connector.

15. The Ethernet connector of claim 1, wherein the first interface port comprises an RJ-45 jack.

16. The Ethernet connector of claim 1, wherein said first circuit board comprises an Ethernet physical layer circuit, coupled to one or more second circuit board, to determine the provided electrical functionality that is provisioned within the Ethernet connector.

17. The Ethernet connector of claim 1, wherein a said second circuit board comprises an Ethernet physical layer circuit, coupled to one or more second circuit board, to determine the specific electrical functionality that is provisioned within the Ethernet connector.

18. An Ethernet communications system comprising:
one or more ports for communication via the Ethernet protocol; and
a connector module by which each of the one or more ports of a first Ethernet communications equipment is capable of making a connection to a second Ethernet communication equipment, wherein said connector module comprises:
a connection substrate;
an RJ-45 connector;
a PHY integrated circuit;
an electrical connection to the Ethernet communications equipment;
one or more additional subsystems electrically couplable to the substrate, said one or more additional subsystems selected to configure the overall functionality of said connector module, the one or more additional subsystems separated into one or more regions of the electrical connection; and
a metal shielding case surrounding the connection substrate and sub-assemblies.

19. A method for Ethernet communications using an integrated jack module, comprising:
determining, by one or more first circuits, a specific set of electrical functions from a plurality of electrical functions to be provisioned internal to the integrated jack module or external to the integrated jack module, the integrated jack module implemented with the selected one or more sub-assemblies;
selecting, by one or more second circuits, a particular one or more sub-assemblies for performing the specific set of electrical functions, the one or more subsystems separated into one or more regions of the electrical functions; and
a metal shielding case surrounding the connection substrate and sub-assemblies.

20. A method for constructing an integrated jack module, comprising:
providing an internal substrate;
coupling the integrated jack module to the internal substrate;
coupling a network equipment through a host interface connection to the internal substrate;
coupling an Ethernet physical layer chip to the internal substrate;
coupling an electronic module to the internal substrate, wherein the functionality of the electronic module determines whether one or more specific electrical functions are provisioned within the integrated jack module or are external to the integrated jack module and separated into one or more regions of the host interface; and
a metal shielding case surrounding the connection substrate and sub-assemblies.

* * * * *